(12) United States Patent
Yamazaki et al.

(10) Patent No.: US 7,939,888 B2
(45) Date of Patent: May 10, 2011

(54) DISPLAY DEVICE AND TELEVISION DEVICE USING THE SAME

(75) Inventors: Shunpei Yamazaki, Tokyo (JP); Osamu Nakamura, Kanagawa (JP); Shinji Maekawa, Kanagawa (JP); Gen Fujii, Kanagawa (JP); Toshiyuki Isa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 31 days.

(21) Appl. No.: 11/857,729

(22) Filed: Sep. 19, 2007

(65) Prior Publication Data

US 2008/0012076 A1    Jan. 17, 2008

Related U.S. Application Data

(62) Division of application No. 11/042,518, filed on Jan. 26, 2005, now Pat. No. 7,273,773.

(30) Foreign Application Priority Data

Jan. 26, 2004  (JP) ................................. 2004-017382
Jan. 26, 2004  (JP) ................................. 2004-017448

(51) Int. Cl.
   *H01L 27/01*   (2006.01)
   *H01L 27/12*   (2006.01)
   *H01L 31/0392* (2006.01)
(52) U.S. Cl. ................. 257/347; 257/359; 257/E21.414
(58) Field of Classification Search .................. 257/359, 257/581, 124, 133, 347, E27.1, E29.117, 257/E21.372, E21.414, E29.273
See application file for complete search history.

(56) References Cited

U.S. PATENT DOCUMENTS

| 4,076,575 | A |   | 2/1978 | Chang |
| 5,142,079 | A | * | 8/1992 | Chiba et al. ................... 556/183 |
| 5,303,072 | A |   | 4/1994 | Takeda et al. |

(Continued)

FOREIGN PATENT DOCUMENTS

EP          1 087 428 A1       3/2001

(Continued)

OTHER PUBLICATIONS

Kuwahara et al., "Thermal Lithography for 0.1 μm pattern fabrication", Micro Electronic Engineering, 2002, vol. 61-62, pp. 415-421.

*Primary Examiner* — A. Sefer
*Assistant Examiner* — Dilinh P Nguyen
(74) *Attorney, Agent, or Firm* — Nixon Peabody LLP; Jeffrey L. Costellia

(57) ABSTRACT

The invention provides a display device and a method for manufacturing thereof by increasing a material efficiently as well as simplifying steps. Also, the invention provides a technique for forming a pattern such as a wiring, that is used for forming a display device, to have a predetermined shape with an excellent controllability. The method for manufacturing a display device includes the steps of: forming a lyophobic region; selectively irradiating laser beam in the lyophobic region to form a lyophilic region; selectively discharging a composition, that contains a conductive material, in the lyophilic region to form a gate electrode layer; forming a gate insulating layer and a semiconductor layer over the gate electrode layer; discharging a composition containing a conductive material over the semiconductor layer to form a source electrode layer and a drain electrode layer; and forming a pixel electrode layer on the source or drain electrode layer.

24 Claims, 54 Drawing Sheets

U.S. PATENT DOCUMENTS

| | | |
|---|---|---|
| 5,453,858 A | 9/1995 | Yamazaki |
| 5,467,882 A | 11/1995 | Ahn |
| 5,477,360 A | 12/1995 | Sunohara et al. |
| 5,512,514 A | 4/1996 | Lee |
| 5,514,879 A | 5/1996 | Yamazaki |
| 5,614,732 A | 3/1997 | Yamazaki |
| 5,696,011 A | 12/1997 | Yamazaki et al. |
| 5,701,167 A | 12/1997 | Yamazaki |
| 5,849,601 A | 12/1998 | Yamazaki |
| 5,852,488 A | 12/1998 | Takemura |
| 5,859,445 A | 1/1999 | Yamazaki |
| 5,892,562 A | 4/1999 | Yamazaki et al. |
| 5,962,192 A | 10/1999 | Holman et al. |
| 6,011,277 A | 1/2000 | Yamazaki |
| 6,023,075 A | 2/2000 | Yamazaki |
| 6,080,606 A | 6/2000 | Gleskova et al. |
| 6,132,800 A | 10/2000 | Shimada et al. |
| 6,180,438 B1 | 1/2001 | Deane et al. |
| 6,225,750 B1 | 5/2001 | Kimura |
| 6,252,249 B1 | 6/2001 | Yamazaki |
| 6,281,520 B1 | 8/2001 | Yamazaki |
| 6,294,313 B1 | 9/2001 | Kobayashi et al. |
| 6,306,213 B1 | 10/2001 | Yamazaki |
| 6,313,435 B1 | 11/2001 | Shoemaker et al. |
| 6,337,731 B1 | 1/2002 | Takemura |
| 6,350,405 B2 | 2/2002 | Horine |
| 6,399,257 B1 | 6/2002 | Shirota et al. |
| 6,416,583 B1 | 7/2002 | Kitano et al. |
| 6,503,831 B2 | 1/2003 | Speakman |
| 6,627,263 B2 | 9/2003 | Kitano et al. |
| 6,630,274 B1 | 10/2003 | Kiguchi et al. |
| 6,645,830 B2 | 11/2003 | Shimoda et al. |
| 6,673,680 B2 | 1/2004 | Calafut |
| 6,715,871 B2 | 4/2004 | Hashimoto et al. |
| 6,734,029 B2 | 5/2004 | Furusawa |
| 6,737,676 B2 | 5/2004 | Yamazaki |
| 6,810,814 B2 | 11/2004 | Hasei |
| 6,875,996 B2 | 4/2005 | Nakamura |
| 6,878,445 B2 | 4/2005 | Hattori et al. |
| 6,936,532 B2 | 8/2005 | Sakaida |
| 6,957,608 B1 | 10/2005 | Hubert et al. |
| 6,994,414 B2 | 2/2006 | Hashimoto et al. |
| 7,018,779 B2 | 3/2006 | Li et al. |
| 7,045,438 B2 | 5/2006 | Yamazaki et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,131,194 B2 | 11/2006 | Hashimoto |
| 7,176,040 B2 | 2/2007 | Sirringhaus et al. |
| 7,176,069 B2 | 2/2007 | Yamazaki et al. |
| 7,189,654 B2 | 3/2007 | Yamazaki et al. |
| 7,208,401 B2 | 4/2007 | Nelson et al. |
| 7,214,573 B2 | 5/2007 | Yamazaki et al. |
| 7,252,923 B2 | 8/2007 | Kobayashi |
| 7,273,773 B2 | 9/2007 | Yamazaki et al. |
| 7,300,686 B2 | 11/2007 | Morii et al. |
| 7,364,769 B2 | 4/2008 | Yoshida et al. |
| 7,365,805 B2 | 4/2008 | Maekawa et al. |
| 7,435,515 B2 | 10/2008 | Kobayashi et al. |
| 7,449,372 B2 | 11/2008 | Fujii et al. |
| 7,462,514 B2 | 12/2008 | Shiroguchi et al. |
| 7,470,604 B2 | 12/2008 | Fujii |
| 7,476,572 B2 | 1/2009 | Morisue et al. |
| 7,510,893 B2 | 3/2009 | Yamazaki et al. |
| 7,560,397 B2 | 7/2009 | Yamazaki et al. |
| 7,569,334 B2 | 8/2009 | Kobayashi et al. |
| 7,575,845 B2 | 8/2009 | Kobayashi et al. |
| 7,576,360 B2 | 8/2009 | Yamazaki |
| 7,585,783 B2 | 9/2009 | Nakamura et al. |
| 7,615,488 B2 | 11/2009 | Maekawa et al. |
| 7,625,493 B2 | 12/2009 | Yamazaki |
| 7,642,038 B2 | 1/2010 | Fujii |
| 2001/0035926 A1 | 11/2001 | Yamaguchi et al. |
| 2001/0045974 A1 | 11/2001 | Shoemaker et al. |
| 2002/0079832 A1 | 6/2002 | Van Tongeren et al. |
| 2002/0094604 A1 | 7/2002 | Hayama et al. |
| 2003/0129321 A1 | 7/2003 | Aoki |
| 2004/0056588 A1* | 3/2004 | Nozawa .................. 313/504 |
| 2004/0174469 A1* | 9/2004 | Takagi et al. .................. 349/57 |
| 2004/0253896 A1 | 12/2004 | Yamazaki |
| 2004/0266073 A1 | 12/2004 | Yamazaki |
| 2005/0003645 A1 | 1/2005 | Hirai |
| 2005/0013927 A1 | 1/2005 | Yamazaki |
| 2005/0043186 A1 | 2/2005 | Maekawa et al. |
| 2005/0196710 A1 | 9/2005 | Shiroguchi |
| 2005/0287721 A1 | 12/2005 | Yamamoto et al. |
| 2006/0141619 A1 | 6/2006 | Hattori et al. |
| 2007/0093002 A1 | 4/2007 | Maekawa et al. |
| 2007/0207274 A1 | 9/2007 | Fujii |
| 2008/0315428 A1 | 12/2008 | Fujii |

FOREIGN PATENT DOCUMENTS

| | | |
|---|---|---|
| JP | 54-045102 | 4/1979 |
| JP | 04-242724 | 8/1992 |
| JP | 08-062445 | 3/1996 |
| JP | 09-260808 | 10/1997 |
| JP | 11-207959 | 8/1999 |
| JP | 11-251259 | 9/1999 |
| JP | 2001-179167 | 7/2001 |
| JP | 2001-272526 | 10/2001 |
| JP | 2001-517377 | 10/2001 |
| JP | 2002-009287 | 1/2002 |
| JP | 02003015092 A * | 1/2003 |
| JP | 2003-059940 | 2/2003 |
| JP | 2003-178872 | 6/2003 |
| JP | 2003-209339 | 7/2003 |
| JP | 2003-209340 | 7/2003 |
| JP | 2003-241177 | 8/2003 |
| JP | 2003-243304 | 8/2003 |
| JP | 2003-318401 | 11/2003 |
| WO | WO-99/31720 A2 | 6/1999 |
| WO | WO00/28604 | 5/2000 |
| WO | WO00/59014 A1 | 10/2000 |

* cited by examiner

DISPLAY DEVICE AND TELEVISION DEVICE USING THE SAME

BACKGROUND OF THE INVENTION

1. Field of the Invention

The present invention relates to a display device and a method for manufacturing the same. The invention further relates to a television device utilizing the display device and the method for manufacturing thereof.

2. Description of the Related Art

A thin film transistor (hereinafter, referred to as a TFT) and an electronic circuit using the TFT have been formed as follows: various kinds of thin films such as a semiconductor, an insulator, and a conductor are laminated over a substrate, and the thin films are processed into a predetermined pattern by photolithography. Photolithography is a technique for transferring a pattern such as a circuit, which is formed of a light-shielding material over a flat transparent plate that is referred to as a photomask, over a substrate by utilizing light. The technique has been widely used in a step of manufacturing a semiconductor integrated circuit, and the like.

In the conventional manufacturing process using the photolithography, many steps such as exposing, developing, baking, and separating are required even in the case of handling a mask pattern, which is formed of a photosensitive organic resin material that is also referred to as a photoresist. Increasing the number of steps for photolithography increases the manufacturing cost eventually. In order to overcome such a problem, research for manufacturing a TFT has been attempted without carrying out the photolithography step (e.g., see patent document 1).

In the technique as disclosed in the patent document 1, however, the photolithography steps, which are performed several times in the process for manufacturing a TFT, are only partly replaced by the printing method. Therefore, the technique cannot drastically contribute to reducing the number of steps for photolithography. Further, an exposure apparatus used for transferring a mask pattern in over a substrate the photolithography is an apparatus in which a pattern with a size of several microns or more and 1 micron or less is transferred. Therefore, it is technically impossible to expose a large-size substrate with 1 m on a side at once, in principle.

[Patent document 1]: Japanese Patent Application Laid-Open No. Hei 11-251259

SUMMARY OF THE INVENTION

It is an object of the present invention to provide a method for reducing the number of photolithography steps in steps for manufacturing a TFT, an electronic circuit using the TFT, and a display device using the TFT so as to simplify the manufacturing steps. Accordingly, a large-size substrate with 1 m or more on a side can be processed at lower cost with good yield.

It is another object of the invention to provide a method for forming a pattern of a wiring etc. with respect to a display device in a predetermined shape with good controllability.

According to the invention, a pattern having a predetermined width can be formed with excellent controllability, regardless of the size of a discharge port through which a liquid droplet is discharged.

The display device of the invention represents a display device (e.g., a light emitting display device, and a liquid crystal display device) having a TFT connected to a light emitting element in which an organic material generating light (also referred to as electroluminescence (EL)) or a medium containing a mixture of organic and inorganic materials is sandwiched between electrodes, or a liquid crystal element including a liquid crystal material.

According to an aspect of the invention, a display device includes a thin film transistor with a gate electrode layer which is provided over an insulated surface containing a lyophobic substance and a lyophilic substance, wherein the gate electrode layer is provided over the lyophilic substance, and the width of the gate electrode layer in a channel direction is 5 μm or less.

According to another aspect of the invention, a display device includes a thin film transistor having a gate electrode layer, a source electrode layer, and a drain electrode layer each of which is formed over an insulated surface with a lyophobic substance and a lyophilic substance, wherein the gate electrode layer, the source electrode layer, and the drain electrode layer are formed on the lyophilic substance, and the width of the gate electrode layer in a channel direction is 5 μm or less.

According to still another aspect of the invention, a display device includes: a thin film transistor having a gate electrode layer, a source electrode layer, and a drain electrode layer each of which is formed over an insulated surface with a lyophobic substance and a lyophilic substance; a first electrode layer in contact with the source or drain electrode layer; an electroluminescent layer on the first electrode layer; and a second electrode layer on the electroluminescent layer, wherein the gate electrode layer, the source electrode layer, and the drain electrode layer are formed on the lyophilic substance, and the width of the gate electrode layer in a channel direction is 5 μm or less.

According to yet another aspect of the invention, there is provided a television device, wherein a display screen is formed by using a display device that includes a thin film transistor with a gate electrode layer formed over an insulated surface, a lyophobic substance and a lyophilic substance are formed on the insulated surface, the gate electrode layer is formed on the lyophilic substance, and the width of the gate electrode layer in a channel direction is 5 μm or less.

According to another aspect of the invention, there is provided a television device, wherein a display screen is formed by using a display device that includes a thin film transistor with a gate electrode layer, a source electrode layer, and a drain electrode layer each of which is formed over an insulated surface, a lyophobic substance and a lyophilic substance are formed on the insulated surface, the gate electrode layer, the source electrode layer, and the drain electrode layer are formed on the lyophilic substance, and the width of the gate electrode layer in a channel direction is 5 μm or less.

According to another aspect of the invention, there is provided a television device, wherein a display screen is formed by using a display device with a thin film transistor that includes a gate electrode layer, a source electrode layer, and a drain electrode layer each of which is formed over an insulated surface, and a light emitting element that contacts to the source or drain electrode layer and includes a first electrode layer, an electroluminescent layer, and a second electrode layer, a lyophobic substance and a lyophilic substance are formed on the insulated surface, the gate electrode layer, the source electrode layer, and the drain electrode layer are formed on the lyophilic substance, and the width of the gate electrode layer in a channel direction is 5 μm or less.

In another aspect of the invention, a method for manufacturing a display device includes the steps of: forming a lyophobic region; selectively irradiating laser beam to the lyophobic region to form a lyophilic region; discharging a composition containing a conductive material in the lyophilic region to form a gate electrode layer; forming a gate insulating layer and a semiconductor layer over the gate electrode layer; and discharging a composition containing a conductive material on the semiconductor layer to form source and drain electrode layers.

In another aspect of the invention, a method for manufacturing a display device includes the steps of: forming a lyophobic region; selectively irradiating laser beam to the lyophobic region to form a lyophilic region; discharging a composition containing a conductive material in the lyophilic region to form a gate electrode layer; forming a gate insulating layer and a semiconductor layer on the gate electrode layer; forming a photosensitive substance on the semiconductor layer; selectively irradiating laser beam to the photosensitive substance to form a photoactivated region; removing the photoactivated region to form a depression portion; discharging a composition that contains a conductive material in the depression portion to form source and drain electrode layers; and removing the photosensitive substance.

In another aspect of the invention, a method for manufacturing a display device includes the steps of: forming a photosensitive substance; selectively irradiating laser beam to the photosensitive substance to form a photoactivated region; removing the photoactivated region to form a depression portion; discharging a composition that contains a conductive material in the depression portion to form a gate electrode layer; removing the photosensitive substance; forming a gate insulating layer and a semiconductor layer on the gate electrode layer; forming a lyophobic region in the semiconductor layer; selectively irradiating laser beam to the lyophobic region to form a lyophilic region; and discharging a composition that contains a conductive material in the lyophilic region to form source and drain electrode layers.

In another aspect of the invention, a method for manufacturing a display device includes the steps of: forming a lyophobic region; selectively irradiating laser beam to the lyophobic region to form a lyophilic region; discharging a composition that contains a conductive material in the lyophilic region to form a gate electrode layer; forming a gate insulating layer and a semiconductor layer on the gate electrode layer; forming a photosensitive substance on the semiconductor layer; selectively irradiating laser beam to the photosensitive substance to form a photoactivated region; removing the photoactivated region to form a depression portion; discharging a composition that contains a conductive material in the depression portion to form a source electrode layer and a drain electrode layer; removing the photosensitive substance; forming a photosensitive insulating material on the source electrode layer and the drain electrode layer; selectively irradiating laser beam to the photosensitive insulating material to form a photoactivated insulating material; removing the photoactivated insulating material to form an opening that reaches the source or drain electrode layer; and forming a conductive layer that contacts to the source or drain electrode layer in the opening.

In another aspect of the invention, a method of manufacturing a display device includes the steps of: forming a photosensitive substance; selectively irradiating laser beam to the photosensitive substance to form a photoactivated region; removing the photoactivated region to form a depression portion; discharging a composition that contains a conductive material in the depression portion to form a gate electrode layer; removing the photosensitive substance; forming a gate insulating layer and a semiconductor layer on the gate electrode layer; forming a lyophobic region on the semiconductor layer; selectively irradiating laser beam to the lyophobic region to form a lyophilic region; discharging a composition that contains a conductive material in the lyophilic region to form a source electrode layer and a drain electrode layer; forming a photosensitive insulating material on the source electrode layer and the drain electrode layer; selectively irradiating laser beam to the photosensitive insulating material to form a photoactivated insulating material; removing the photoactivated insulating material to form an opening that reaches the source electrode layer and the drain electrode layer; and forming a conductive layer that contacts to the source or drain electrode layer in the opening.

In another aspect of the invention, a method for manufacturing a display device includes the steps of: forming a first lyophobic region; selectively irradiating laser beam to the first lyophobic region to form a first lyophilic region; discharging a composition that contains a conductive material in the first lyophilic region to form a gate electrode layer; forming a gate insulating layer and a semiconductor layer on the gate electrode layer; forming a second lyophobic region on the semiconductor layer; selectively irradiating laser beam to the second lyophobic region to form a second lyophilic region; and discharging a composition that contains a conductive material in the second lyophilic region to form a source electrode layer and a drain electrode layer.

In another aspect of the invention, a method for manufacturing a display device includes the steps of forming a first lyophobic region: selectively irradiating laser beam to the first lyophobic region to form a first lyophilic region; discharging a composition that contains a conductive material in the first lyophilic region to form a gate electrode layer; forming a gate insulating layer and a semiconductor layer on the gate electrode layer; forming a second lyophobic region on the semiconductor layer; selectively irradiating laser beam to the second lyophobic region to form a second lyophilic region; discharging a composition that contains a conductive material in the second lyophilic region to form a source electrode layer and a drain electrode layer; forming a photosensitive insulating material on the source electrode layer and the drain electrode layer; selectively irradiating laser beam to the photosensitive insulating material to form a photoactivated insulating material; removing the photoactivated insulating material to form an opening that reaches the source or drain electrode layer; and forming a conductive layer that contacts to the source or drain electrode layer in the opening.

In another aspect of the invention, a method for manufacturing a display device includes the steps of: forming a photosensitive substance; selectively irradiating laser beam to the photosensitive substance to form a photoactivated region; removing the photoactivated region to form a depression portion; discharging a composition that contains a conductive material in the depression portion to form a gate electrode layer; removing the photosensitive substance; forming a gate insulating layer and a semiconductor layer on the gate electrode layer; and forming a source electrode layer and a drain electrode layer on the semiconductor layer.

In another aspect of the invention, a method for forming a display device includes the steps of: forming a first photosensitive substance; selectively irradiating laser beam to the first photosensitive substance to form a first photoactivated region; removing the first photoactivated region to form a first depression portion; discharging a composition that contains a conductive material in the first depression portion to form a gate electrode layer; removing the first photosensitive substance; forming a gate insulating layer and a semiconductor layer on the gate electrode layer; forming a second photosensitive substance on the semiconductor layer; selectively irradiating laser beam to the second photosensitive substance to form a second photoactivated region; removing the second photoactivated region to form a second depression portion; discharging a composition that contains a conductive material in the second depression portion to form a source electrode layer and a drain electrode layer; and removing the second photosensitive substance.

In another aspect of the invention, a method for forming a display device includes the steps of: forming a first photosensitive substance; selectively irradiating laser beam to the first photosensitive substance to form a first photoactivated region; removing the first photoactivated region to form a first depression portion; discharging a composition that contains a conductive material in the first depression portion to form a gate electrode layer; removing the first photosensitive substance; forming a gate insulating layer and a semiconductor layer on the gate electrode layer; forming a second photosensitive substance on the semiconductor layer; selectively irradiating laser beam to the second photosensitive substance to form a second photoactivated region; removing the second photoactivated region to form a second depression portion; discharging a composition that contains a conductive material in the second depression portion to form a source electrode layer and a drain electrode layer; removing the second photosensitive substance; forming a photosensitive insulating material on the source electrode layer and the drain electrode layer; selectively irradiating laser beam to the photosensitive insulating material to form a photoactivated insulating material; removing the photoactivated insulating material to form an opening that reaches the source or drain electrode layer; forming a conductive layer that contacts to the source or drain electrode layer in the opening; forming a first electrode layer that is in contact with the conductive layer; forming an electroluminescent layer on the first electrode layer; and forming a second electrode layer on the electroluminescent layer.

In the above-mentioned aspects, a pixel electrode layer may be formed contacting to the source or drain electrode layer. The first electrode layer may be formed contacting to the source or drain electrode layer, the electroluminescent layer may be formed on the first electrode layer, and the second electrode layer may be formed on the electroluminescent layer.

In the above aspects, a pixel electrode layer may be formed contacting to the conductive layer. The first electrode layer may be formed in contact with the conductive layer, the electroluminescent layer may be formed on the first electrode layer, and the second electrode layer may be formed on the electroluminescent layer.

In the above aspects, the lyophobic region may be made from a film containing fluorine, a Teflon® film, a silane coupling agent, and the like. The lyophilic region represents a region where has a lower lyophobic property than that of the lyophobic region.

In the above aspects, the semiconductor layer may be a semiamorphous semiconductor with a crystal structure that is formed by a gas containing a hydrogen element and a halogen element. Also, the semiconductor layer may be an amorphous semiconductor formed by a gas containing a hydrogen element and a halogen element, or a polycrystalline semiconductor formed by a gas containing a hydrogen element and a halogen element.

The gate insulating layer is formed by sequentially laminating a first silicon nitride film, a silicon oxide film, and a second silicon nitride film, and therefore, oxidation of the gate electrode layer can be prevented. A favorable interface between the gate insulating layer and the semiconductor layer that is formed on the gate insulating layer can be obtained.

According to the invention, a predetermined pattern can be formed with good controllability while eliminating wasting materials, thereby reducing cost. Therefore, a high-performance, high reliable display device can be manufactured with excellent yield.

DETAILED DESCRIPTION OF THE INVENTION

Figure 1A:
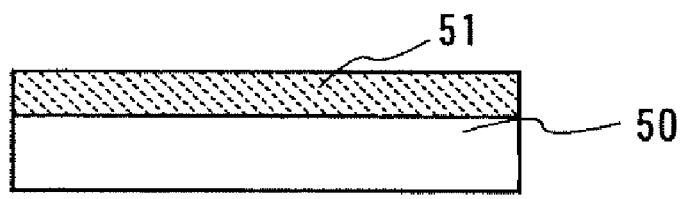
FIGS. 1A to 1D are diagrams explaining a method of manufacturing a display device according to the present invention.

Hereinafter, the embodiment modes according to the present invention will be described in detail with reference to the accompanying drawings. The present invention can be carried out in many different modes, and it is easily understood by those who skilled in the art that embodiments and details herein disclosed can be modified in various ways without departing from the purpose and the scope of the present invention. It should be noted that the description of the embodiment modes to be given below should not be interpreted as being limited to the present invention. Further, in all of views for describing the embodiment modes, similar portions or portions having a similar function are denoted by the same reference numeral, and a repeated explanation thereof will be omitted.

Figure 17A:
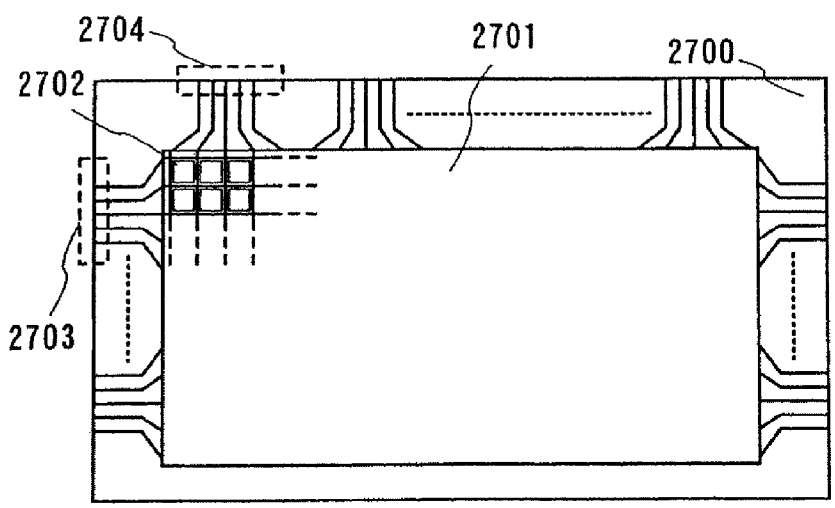
FIGS. 17A to 17C are top views of a display device according to the invention.

FIG. 17A is a top view showing a structure of a display panel according to the present invention, wherein a pixel portion 2701 in which pixels 2702 are arranged in matrix, a scanning line input terminal 2703, and a signal line input terminal 2704 are formed over a substrate 2700 with an insulated surface. The number of pixels may be determined in accordance with various standards. The number of pixels for XGA may be 1024×768×3 (RGB), and that for UXGA may be 1600×1200×3 (RGB). In the case of forming a display panel corresponding to a full-specification high-definition, the number of pixels may be 1920×1080×3 (RGB).

The pixels 2702 are arranged in matrix by intersecting a scanning line extended from the scanning line input terminal 2703 with a signal line extended from the signal line input terminal 2704. Each pixel 2702 includes a switching element and a pixel electrode connecting to the switching element. A TFT can be cited as a representative example of the switching element. Connecting a gate electrode of the TFT to the scanning line and connecting a source or drain to the signal line allow to control respective pixels independently by a signal input from an external portion.

A TFT comprises a semiconductor layer, a gate insulating layer, and a gate electrode layer as its main constituents. A wiring layer connecting to source and drain regions formed in the semiconductor layer is included therein. A top gate TFT in which a semiconductor layer, a gate insulating layer, and a gate electrode layer are sequentially arranged over a substrate, a bottom gate TFT in which a gate electrode, a gate insulating layer, and a semiconductor layer are sequentially arranged over a substrate, and the like are typically known as a TFT structure. Any one of structures may be applied to the invention.

The semiconductor layer may be made from a material as follows: an amorphous semiconductor (hereinafter also refereed to as an "AS") manufactured by using a semiconductor material gas typified by silane or germane with the vapor phase growth or sputtering, a polycrystalline semiconductor that is formed by crystallizing the amorphous semiconductor by utilizing light energy or thermal energy, a semiamorphous semiconductor (also referred to as microcrystal, and hereinafter referred to as an "SAS"), and the like.

The SAS has an intermediate structure between an amorphous structure and a crystal structure (also including a single crystal structure and a polycrystal structure), and a third condition that is stable in term of free energy, and further includes a crystalline region having a short range order along with lattice distortion. A crystal region with a size of 0.5 to 20 nm can be observed in at least a part of the semiamorphous semiconductor film. In the case of containing silicon as its principal constituent, Raman spectrum is shifted toward lower wavenumbers than 520 $cm^{-1}$. The diffraction peaks of (111) and (220), which are believed to be derived from silicon crystal lattice, are observed in the SAS by X-ray diffraction. The SAS contains hydrogen or halogen of at least 1 atom % or more as a neutralizing agent for dangling bonds. The SAS is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$, and the like can be used. The silicide gas may also be diluted with $H_2$, or a mixture of $H_2$ and one or more of rare gas elements selected from He, Ar, Kr, and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less. With respect to impurity elements contained in the film, each concentration of impurities for atmospheric constituents such as oxygen, nitrogen, and carbon is preferably set to be $1\times10^{20}$ cm$^{-1}$ or less. In particular, the oxygen concentration is set to be $5\times10^{19}$/cm$^3$ or less, preferably, $1\times10^{19}$/cm$^3$ or less.

Figure 18A:
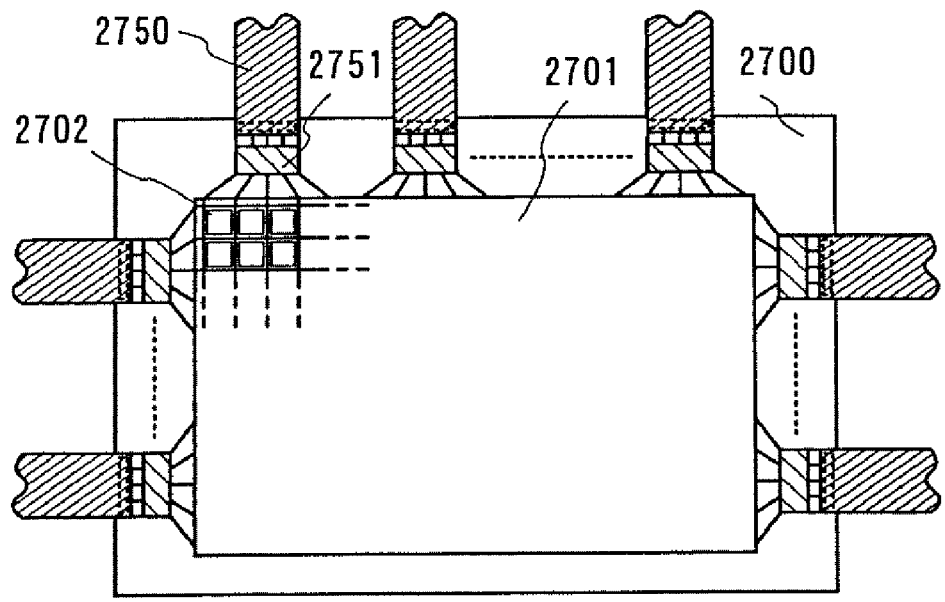
FIGS. 18A and 18B are top views of a display device according to the invention.
Figure 18B:
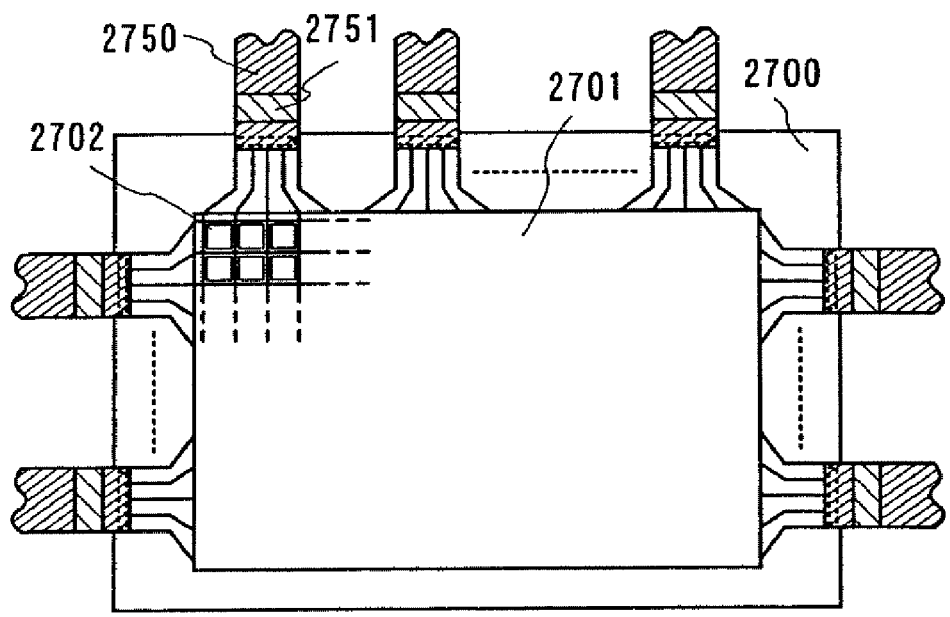

FIG. 17A shows a structure of a display panel that controls a signal being inputted into the scanning line and the signal line by an external driver circuit. As shown in FIG. 18A, driver ICs 2751 may be mounted over a substrate 2700 by the COG (Chip on Glass) technology. As shown in FIG. 18B, the TAB (tape automated bonding) technology may be used as another mounting mode. The driver ICs may be formed over a single crystal semiconductor substrate or may be formed over a glass substrate by using a TFT. In FIGS. 18A and 18B, the driver ICs 7251 are connected to FPCs 2750, respectively.

Figure 17B:
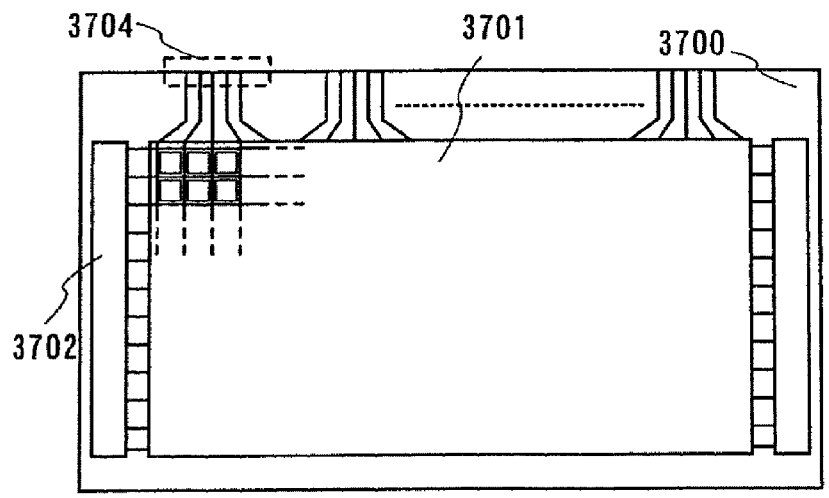
Figure 17C:
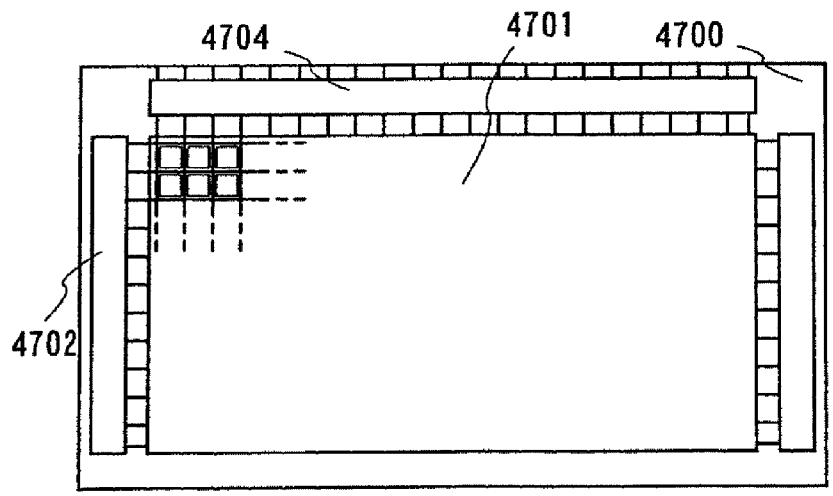

In the case where a TFT that is formed in a pixel is made from the SAS, a scanning line driver circuit 3702 can be integrated over a substrate 3700 as shown in FIG. 17B. In FIG. 17B, reference numeral 3701 indicates a pixel portion (also referred to as a pixel region). The signal line driver circuit is controlled by an external driver circuit as well as FIG. 17A. When a TFT formed in a pixel is made from a polycrystalline (microcrystalline) semiconductor, a single crystalline semiconductor, or the like, each of which has high mobility, a scanning line driver circuit 4702 and a signal line driver circuit 4704 can be integrated over a glass substrate 4700 as shown in FIG. 17C.

The embodiment mode of the invention will be explained with reference to FIGS. 1A to 1D, FIG. 13, and FIGS. 29A to 29D, below.

One feature of the invention is that a display device is manufactured by forming at least one or more of patterns that are required for fabricating a display device such as a conductive layer for forming a wiring layer or an electrode, and a mask layer for forming a predetermined pattern by using a method capable of selectively forming a pattern. As the method capable of selectively forming a pattern, a droplet discharging (shooting) method (also referred to as the ink-jet method depending on the system) is employed. In the droplet discharging method, a predetermined pattern can be formed by selectively discharging a droplet of a composition that has been prepared for the particular purpose. In addition, a method in which a pattern can be transferred or drawn, for example, a printing method (a method in which a pattern is formed such as screen printing or offset printing), and the like can be used.

In the present embodiment mode, a pattern is formed by discharging (shooting) a droplet. In the droplet discharging method, a droplet containing a material for forming a pattern is discharged in a subject region on which the pattern will be formed, the droplet is fixed by balking, drying, etc. so that the pattern is obtained. In the present invention, a pretreatment is carried out in the subject region on which a pattern will be formed.

As shown in FIG. 1A, a base film 51 is formed in the vicinity including a subject region to be formed with a pattern over a substrate 50 as a pretreatment. Laser beam 52 is irradiated to the subject region to be formed with the pattern in the base film 51 by using a laser irradiation device. The properties of the base film 51 are partly changed due to irradiation with the laser beam 52 so as to form a base film 53. That is, lyophobic properties (or lyophilic properties) with respect to a droplet containing a material for forming a pattern are changed between the base film 53 where is irradiated with the laser beam and base film 57a and 57b where is not irradiated with the laser beam, which causes a difference in the degree of the lyophobic properties therebetween.

In the embodiment mode, the base film 51 made from a material, which has a lyophobic property with respect to the droplet containing the material for forming the pattern, is formed on the substrate, and the base film 51 is partly irradiated with the laser beam 52 so that the subject portion irradiated with the laser beam (i.e., the base film 53) is only changed to have the lyophilic property rather than the lyophobic property. That is, the base film 53 becomes to have the lower lyophobic property with respect to the droplet, as compared with those of the base film 57a and 57b.

A droplet 55 that contains a material for forming a pattern is next discharged in the base film 53, where is the subject region to be formed with the pattern, from a nozzle of a droplet discharging device 54. The discharged droplet 55 remains in the base film 53 with the higher lyophilic property (lower lyophobic property) than that of the base film 57a and 57b (see FIG. 1C). When the diameter of the nozzle thorough which the droplet is discharged is larger than the size of a predetermined pattern, since the subject region to be formed with the pattern is treated to have the improved lyophilic property (reduced lyophobic property), the droplet is only attached to the subject region, thereby achieving a predetermined pattern 56. The degree of the lyophobic properties (lyophilic properties) is differed between the subject region and the region around the subject region so that the droplet shed in the region around the subject region and remains in the subject region having the higher lyophilic property.

According to the invention, when a microscopic pattern such as an electrode layer is formed, a fine linear pattern can be formed without spreading a droplet around a subject region on which the pattern will be formed, even if a discharge port of the nozzle has a relatively large diameter. By controlling the amount of the droplet, the thickness of the wiring can be adjusted. Since the laser beam can perform microscopic processing, in the case where the base film is changed in its properties by being irradiated with the laser beam, a microscopic wiring, electrode, and the like can be formed with good controllability. The use of the droplet discharging method can prevent loss of materials, thereby reducing cost, as compared with the case of using the method in which a droplet is applied over an entire surface of a substrate such as the spin coating.

Figure 13:
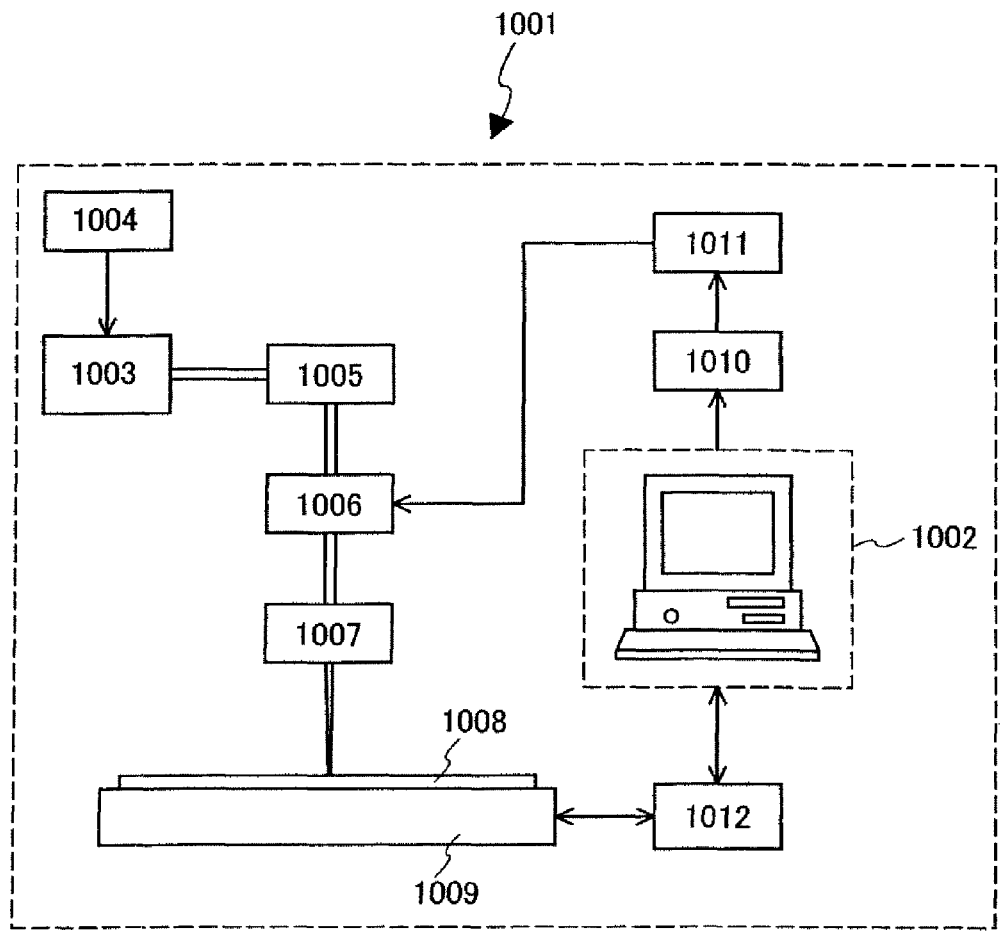
FIG. 13 is a diagram explaining a structure of a laser beam direct writing device that is applicable to the invention.
Figure 14:
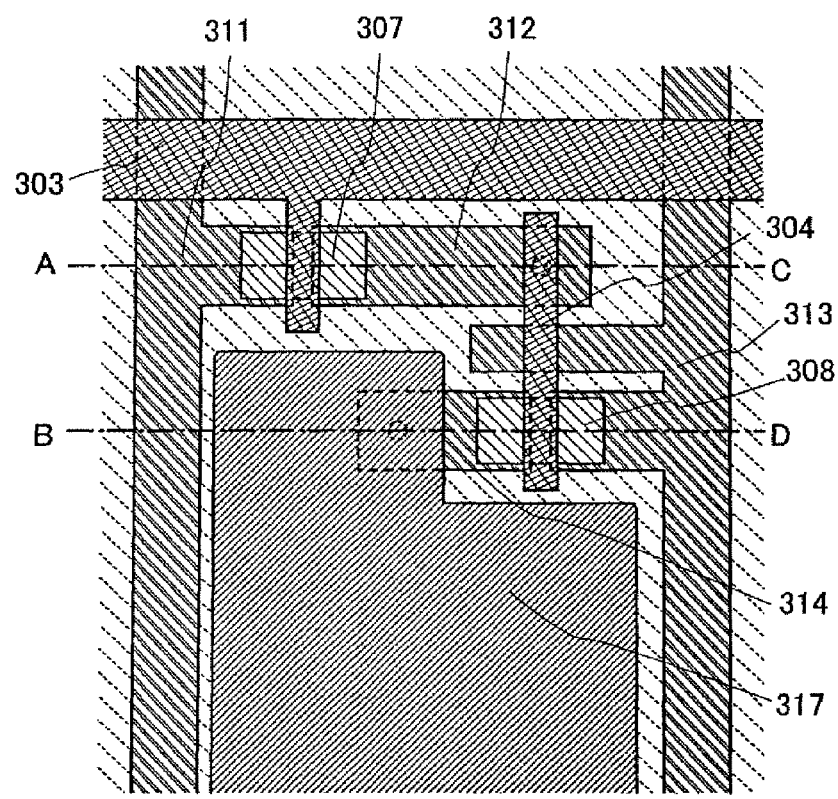
FIG. 14 is a diagram explaining a method of manufacturing a display device according to the invention.

A laser beam wiring device for irradiating laser light (also referred to as laser beam) to a processing region is explained with reference to FIG. 13. A laser beam direct writing device is used in the present embodiment mode such that laser beam is directly irradiated to a processing region. As shown in FIG. 13, a laser beam direct writing device 1001 includes: a personal computer (hereinafter, referred to as a PC) 1002 for executing various kinds of controls upon irradiating laser beam; a laser oscillator 1003 for outputting laser beam; a power source 1004 of the laser oscillator 1003; an optical system (an ND filter) 1005 for attenuating laser beam; an audio optical modulator (AOM) 1006 for modulating the intensity of laser beam; an optical system 1007 including a lens for enlarging or reducing a cross section of laser beam, a mirror for changing a light path, and the like; a substrate moving mechanism 1009 having an X stage and a Y stage; a D/A converter 1010 for converting control data output from the PC into digital or analog data; a driver 1011 for controlling the audio optical modulator 1106 depending on an analog voltage output from the D/A converter; and a driver 1012 outputting a driving signal for driving the substrate moving mechanism 1009.

As the laser oscillator 1003, a laser oscillator that is capable of oscillating ultraviolet light, visible light, or infrared light can be used. The following laser oscillators can be used: an excimer laser oscillator such as KrF, ArF, XeCl, and Xe; a gas laser oscillator such as He, He—Cd, Ar, He—Ne, and HF; a solid-state laser oscillator using crystals in which Cr, Nd, Er, Ho, Ce, Co, Ti, or Tm is doped into a crystal such as YAG; $GdVO_4$, $YVO_4$, YLF, and $YAlO_3$; and a semiconductor laser oscillator such as GaN, GaAs, GaAlAs, and InGaAsP. In the case of the solid-state laser oscillator, first to fifth harmonics of fundamental waves are preferably used.

A treatment for changing properties of a base film with the laser beam direct writing device is next explained. Upon mounting a substrate 1008 on the substrate moving mechanism 1009, the PC 1002 detects a position of a marker that is marked on the substrate by using a camera (not shown). The PC 1002 generates data for moving the substrate moving mechanism 1009 depending on the positional data of the detected marker and data for a writing pattern that have been previously input in the PC. When controlling the amount of output light for the audio optical modulator 1006 through the driver 1011 by the PC 1002, and laser beam output from the laser oscillator 1003 is attenuated by the optical system 1005 so that the amount of light is adjusted to a predetermined amount in the audio optical modulator 1006. The light path and beam form of the laser beam output from the audio optical modulator 1006 are changed in the optical system 1007. The laser beam is focused by the lens, and the focused laser beam is irradiated to a base film formed over the substrate so as to perform the treatment for changing the properties of the base film. At this moment, the substrate moving mechanism 1009 is controlled to move in a X direction and a Y direction in accordance with the data for moving the substrate moving mechanism that are generated by the PC 1002. As a consequence, the laser beam is irradiated to the predetermined portion so that the properties of the base film is partly changed.

Figure 1B:
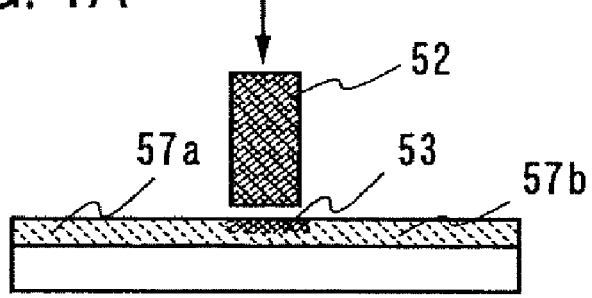
Figure 1C:
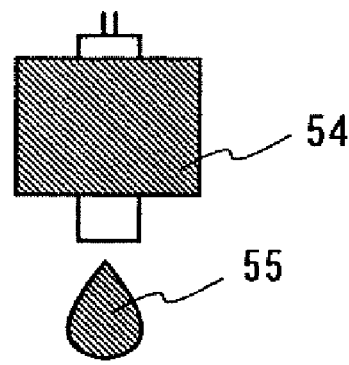
Figure 1D:

In this way, the base film 53 having the increased lyophilic property is formed in the region irradiated with the laser beam, as shown in FIG. 1B. Since the energy of the laser beam is partly converted to heat in the base film material, the base film is partly reacted with heat, and therefore, the width of the base film 53 irradiated with the laser beam becomes slightly larger than that of the laser beam. The shorter wavelength laser beam is, the shorter the beam diameter can be focused by the lens. In order to form the lyophilic region with a microscopic width, short wavelength laser beam is preferably irradiated to the base film.

The spot form of the laser beam on the surface of the base film is processed to have a dotted, circular, elliptic, rectangular, or linear (exactly, a narrow rectangular) shape by the optical system. Although the spot form may be a circular shape, the linear shape is more preferable to form a lyophilic region (base film 53) having a constant width.

FIG. 13 shows an example of the device in which laser beam is irradiated from a front surface of the substrate to be exposed. Alternatively, another laser beam writing device in which laser beam is irradiated from a back surface of the substrate to be exposed may be used by arbitrarily changing the optical system and the substrate moving mechanism.

The substrate is, herein, selectively irradiated with the laser beam by moving the substrate, however, the present invention is not particularly limited to the structure. The laser beam can be irradiated to the substrate by scanning the laser beam in the X axis and Y axis direction. In this case, a polygon mirror or a galvanometer mirror is preferably used as the optical system 1007.

In the embodiment mode, a sheet of film is formed as the base film in the pretreatment. When an extremely thin film is required as the base film depending on the conditions, however, it may not take a film-like shape. The lyophobic (lyophilic) properties are differed between a subject region to be formed with the pattern and a region around the subject region such that the subject region has the higher lyophilic property. Therefore, the base film material is not necessary to be attached to the subject region to be formed with the pattern. Accordingly, there is a case in which the base film material formed on the subject region is removed to decrease the lyophobic property.

Figure 29A:
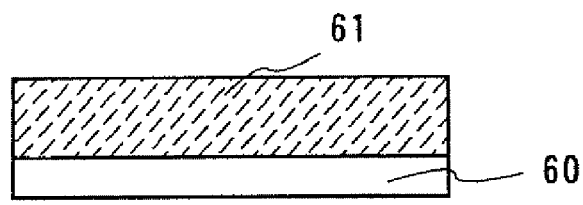
FIGS. 29A to 29D are diagrams explaining the invention.
Figure 29B:
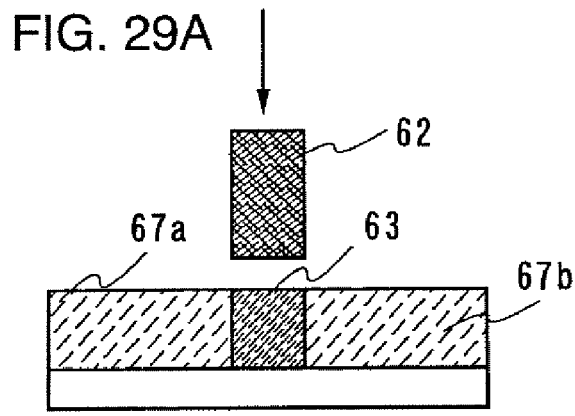

As shown in FIGS. 29A to 29D, in the case of forming a thick base film, when the thick base film is partly removed, the removed region becomes a depression portion like a groove so that a material for forming a pattern may be discharged in the depression portion to fill the groove. As shown in FIG. 29A, a film 61 is formed over a substrate 60 in the vicinity of a subject region to be formed with a pattern. Since the film 61 is irradiated with laser beam 62, it is preferably made from a photosensitive resin material that is a photosensitive substance, in particular, a film formed of a positive resist material. The subject region to be formed with a pattern in the film 61 is irradiated with the laser beam 62 and photoactivated so as to form a photoactivated region 63 (see FIG. 29B). The photoactivated region 63 is removed by etchant so that a depression portion is formed in the subject region while being surrounded by films 67a and 67b.

Figure 29C:
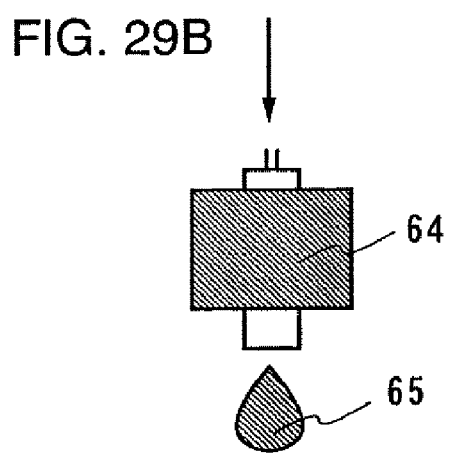
Figure 29D:
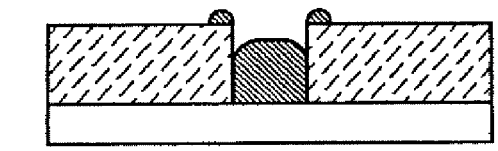

By discharging a droplet that contains a material for forming a pattern in the depression portion, a pattern 66 is formed only in the subject region. As shown in FIG. 29C, even when a discharge port through which the droplet is discharged is larger in diameter, or the droplet is discharged on the region around the subject region through the discharge port with bad controllability, the excess material for forming a pattern is discharged on the films 67a and 67b. After forming the pattern 66 in the depression portion, the films 67a and 67b, which are formed of a photosensitive material, are removed by etching etc. along with the excess material, and therefore, the pattern can be formed only in the predetermined region with excellent controllability. By controlling the thickness of the film 61 (or, the films 67a and 67b) made from a photosensitive material etc., the thickness of the pattern can be adjusted freely. Since the subject region to be formed with the pattern can be processed minutely to have the depression portion by being irradiated with laser beam, when using laser beam that is optically designed into a spot shape, a spot like a contact hole can be formed easily with high accuracy.

The films 67a, 67b around the depression portion can be formed of a photosensitive resin such as photosensitive acrylic, and photosensitive polyimide. In addition, a commercially available resist material containing photosensitive agent may be used. For example, novolac resin, which is a typical positive resist, a naphthoquinone diazide compound, which is photosensitive agent, and the like may be used.

The treatment for reducing the lyophobic properties or increasing the lyophilic properties indicates a treatment for increasing a property (also referred to as an adhesion property or a fixing property) for remaining a droplet discharged in a subject region as compared with a region around the subject region. Accordingly, the treatment is similar to a treatment in which properties of a subject region to be formed with a pattern are changed due to laser beam irradiation etc. so as to increase adherence with respect to the droplet. In the treatment for increasing the lyophilic properties of a base film with laser barn irradiation, only the properties of a top surface for a base film, where is in contact with the droplet, may be increased, and the properties of the entire base film is not required to be changed.

The embodiment mode shows an example in which the base film formed as the pretreatment is remained even after forming the pattern. However, an unnecessary portion of the base film may be removed after forming the pattern. The unnecessary portion can be removed by ashing with use of oxygen etc., etching, and the like while using the pattern as a mask.

As an example of a composition of a solution for forming a lyophobic surface, silane coupling agent denoted by a chemical formula: $R_a$—Si—$X_{(4-n)}$ (n=1, 2, 3) is used. In the chemical formula, R represents a substance containing a relatively inactive group such as alkyl group. X represents a hydroxyl group with a substrate surface such as a halogen group, a methoxy group, an ethoxy group, and an acetoxy group, or a hydrolysate group that is bondable due to condensation of absorbed water.

As a representative example of the silane coupling agent, in the case of using a fluorine silane coupling agent (such as fluoroalkylsilane (FAS)) that has a fluoroalkyl group as R, the lyophobic properties can be further improved. R in the FAS has a structure expressed by $(CF_3)(CF_2)_x(CH_2)_y$ (x is an integer in the range of 0 to 10, and y is an integer in the range of 0 to 4). When a plurality of Rs or Xs are bound to Si, the Rs or Xs may be the same or different from one another. Typically, fluoroalkylsilane (hereinafter, referred to as FAS) such as: heptade fluoro tetrahydrodecyl triethoxysilane; heptadecafluoro tetrahydrodecyl trichlorosilane; tridecafluoro tetrahydrooctyl trichlorosilane; and trifluoropropyl trimethoxysilane can be cited.

As a solution for forming the lyophobic surface, a hydrocarbon solvent such as n-pentane, n-hexane, n-heptane, n-octane, n-decane, dicyclopentane, benzene, toluene, xylene, durene, indene, tetrahydronaphthalene, decahydronaphthalene, and squalane; a solvent for forming a lyophobic surface such as tetrahydrofuran; and the like can be used.

As an example of a composition of the solvent for forming the lyophobic surface, a material having fluorocarbon chain (e.g., fluorocarbon resin) can be used. As the fluorocarbon resin, the followings can be used: polytetrafluoroethylene (PTFE); perfluoroalkoxyalkane (PFA); perfluoroethylene propen copolymer (PEEP); ethylene-tetrafluoroethylene copolymer (ETFE); polyvinylidene fluoride (PVDF); polychlorotrifluoro ethylene (PCTFE); ethylene-chlorotrifluoroethylene copolymer (ECTFE); polytetrafluoroethylene-perfluorodioxole copolymer (TFE/PDD); polyvinyl fluoride (PVF); and the like.

Further, an organic material that does not form a lyophobic surface (i.e., that forms a lyophilic surface) may be used as follows. The organic material is treated by $CF_4$ plasma etc. to form a lyophobic surface. As the organic material, for instance, a material of mixing a water-soluble resin such as polyvinyl alcohol (PVA) with a solvent such as $H_2O$ can be used. In addition, a combination of PVA and another water-soluble resin can be used. It is possible to use an organic material (or, an organic resin material) (e.g., polyimide, and acrylic) or a material with skeleton formed by the bond of silicon (Si) and oxygen (O), which includes at least hydrogen as a substituent or at least one of fluoride, alkyl group, and aromatic hydrocarbon as the substituent. Meanwhile, in the case of a material that forms a lyophobic surface, the material is subjected to plasma processing etc. so that the lyophobic properties thereof can be further improved.

Also, as the pretreatment, a metal film or the like may be formed over the substrate, a subject region to be formed with a pattern may be subjected to laser irradiation processing under an atmosphere containing oxygen, nitrogen, etc. so that the subject region irradiated with laser beam may be changed to oxide or nitride. For example, a titanium film is formed as a conductive film, and laser beam is irradiated to only the subject region under an oxygen atmosphere. By irradiating laser beam that can perform microscopic processing, the subject region is changed to a more stable titanium oxide film with good controllability. Since the titanium oxide film is well-adhered to a conductive material that is used for forming a pattern as compared with the titanium film around the titanium oxide film, when a droplet containing the conductive material is discharged on the titanium oxide film, a predetermined pattern can be obtained with good controllability. When using a conductive material such as a metal film, a base film with high lyophobic properties, which is not irradiated with laser beam, may be removed by etching etc., or oxidized by heat treatment so as to be insulated.

Performing the pretreatment for improving the adherence of the subject region to be formed with a pattern as compared with the peripheral region makes it possible to form a pattern with a predetermined shape. By performing a microscopic processing with laser beam irradiation, a fine linear pattern can be freely designed. According to the invention, a predetermined pattern can be formed with good controllability while eliminating loss of materials, thereby reducing cost. Consequently, a high-performance display device with high reliability can be manufactured with excellent yield.

Embodiment Mode 2

Another embodiment mode of the invention will be described with reference to FIGS. 2A to 2C, FIGS. 3A to 3C, FIGS. 4A to 4C, FIGS. 5A to 5C, FIGS. 6A to 6C, FIGS. 7A to 7C, and FIGS. 8A and 8B. Concretely, a method of manufacturing a display device (a light emitting display device) according to the invention will be described below.

Firstly, a method of manufacturing a display device (a light emitting display device) having a channel-etched type thin film transistor according to the invention will be described. FIGS. 2A, 3A, 4A, 5A, 6A, and 7A are top views showing pixel portions of display devices, respectively. FIGS. 2B, 4B, 5B, 6B, and 7B are cross sectional views along lines A-C of the respective top views, whereas FIGS. 2C, 3C, 4C, 5C, 6C, and 7C are cross sectional views along lines B-D thereof.

A base film 101 is formed on a substrate 100 as a base pretreatment. As the substrate 100, a glass substrate such as a barium borosilicate glass and an alumino borosilicate glass, a quartz substrate, a silicon substrate, a metal substrate, a stainless substrate, a heat-resistant plastic substrate that can withstand a processing temperature of manufacturing steps, and the like can be used. The surface of the substrate may be polished by the CMP method so as to planarize the surface thereof. An insulating layer may be formed on the substrate 100. The insulating layer is made from an oxide material containing silicon or a nitride material containing silicon by a known method such as CVD, plasma CVD, sputtering, and spin coating so as to have a single layer or a lamination layer. The insulating layer may not necessarily be formed. When the insulating layer is formed, however, it can prevent contaminants from penetrating into the substrate 100. In the case of forming a base film for inhibiting the contaminations through the substrate, a base film 101 is formed thereon as the base pretreatment for a gate electrode layer 103, which will be formed by the droplet discharging method.

Figure 2A:
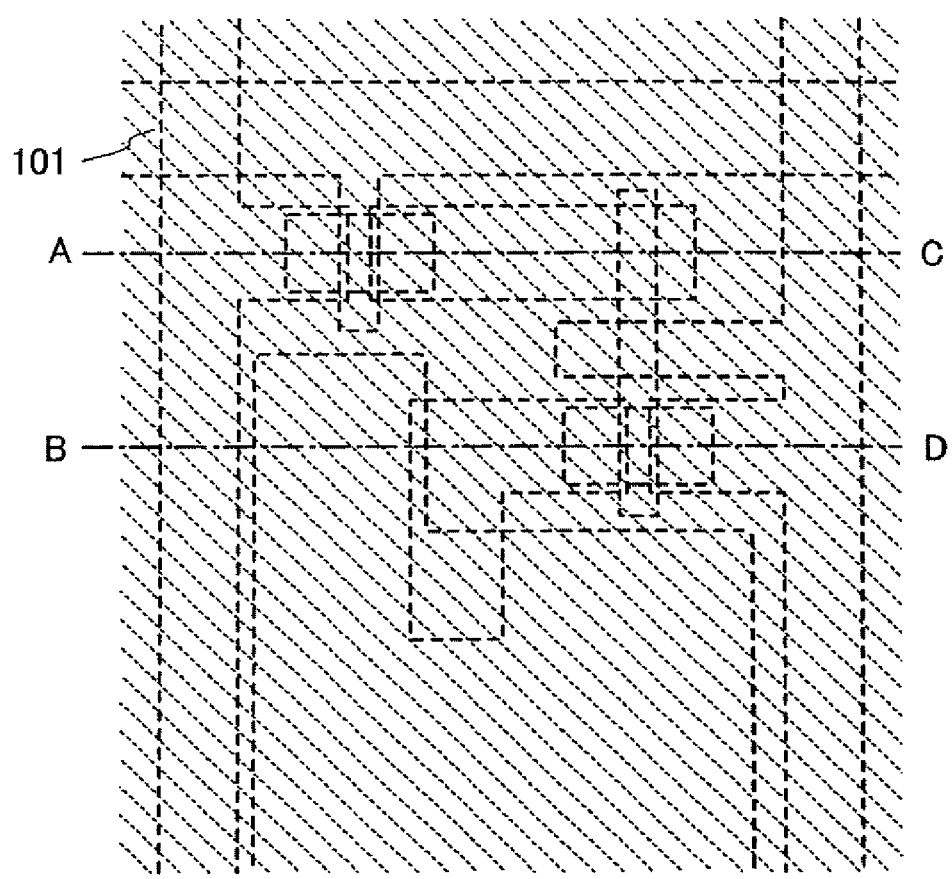
FIGS. 2A to 2C are diagrams explaining a method of manufacturing a display device according to the invention.
Figure 2B:
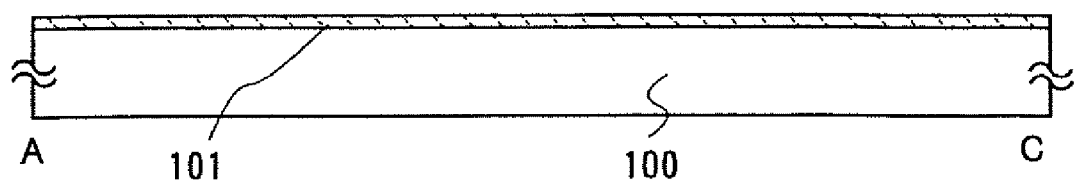
Figure 2C:
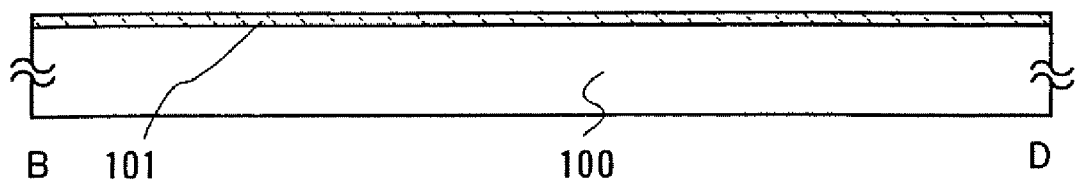

In the present embodiment mode, a lyophobic substance is formed as the base film 101 (see FIGS. 2A to 2C). The base film 101 is, herein, formed over the entire surface of the substrate 100 by spin coating. Alternatively, the base film may selectively be formed by the droplet discharging method in the vicinity of a subject region on which a pattern will be formed.

Figure 3A:
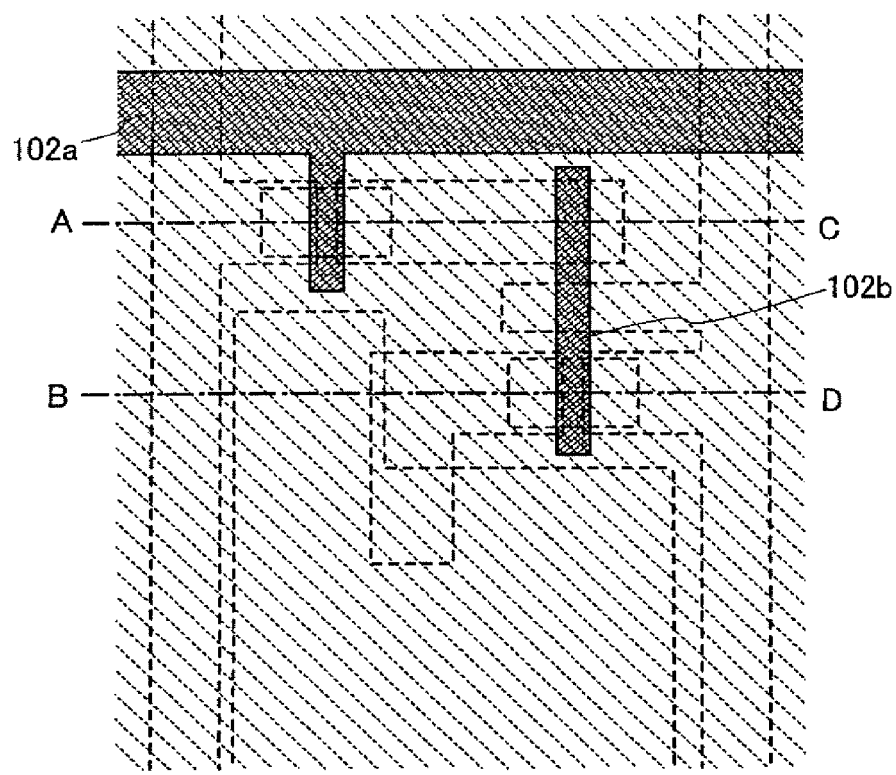
FIGS. 3A to 3C are diagram explaining a method of manufacturing a display device according to the invention.
Figure 3B:
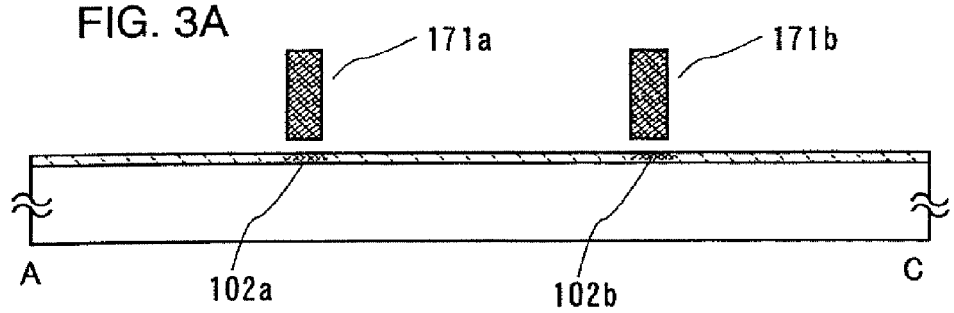
Figure 3C:
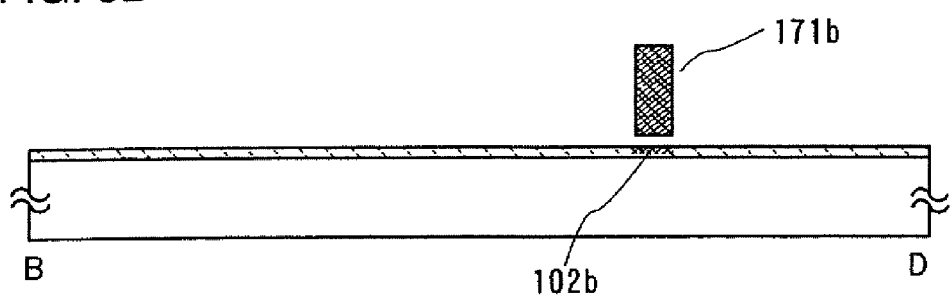

Laser beam 171a, 171b is irradiated to regions, on which gate electrode layers will be formed by a laser irradiation device to change properties of the base film selectively (see FIG. 3B). By the treatment for changing the properties, base films 102a and 102b becomes to have higher lyophilic properties with respect to a composition containing a conductive material, which is used for forming a gate electrode layer that will be laminated on the base films 102a and 102b later. Accordingly, the lyophobic (lyophilic) properties with respect to the composition containing the conductive material are differed between the base films 102a, 102b and the base film around the base films 102a and 102b.

Figure 4A:
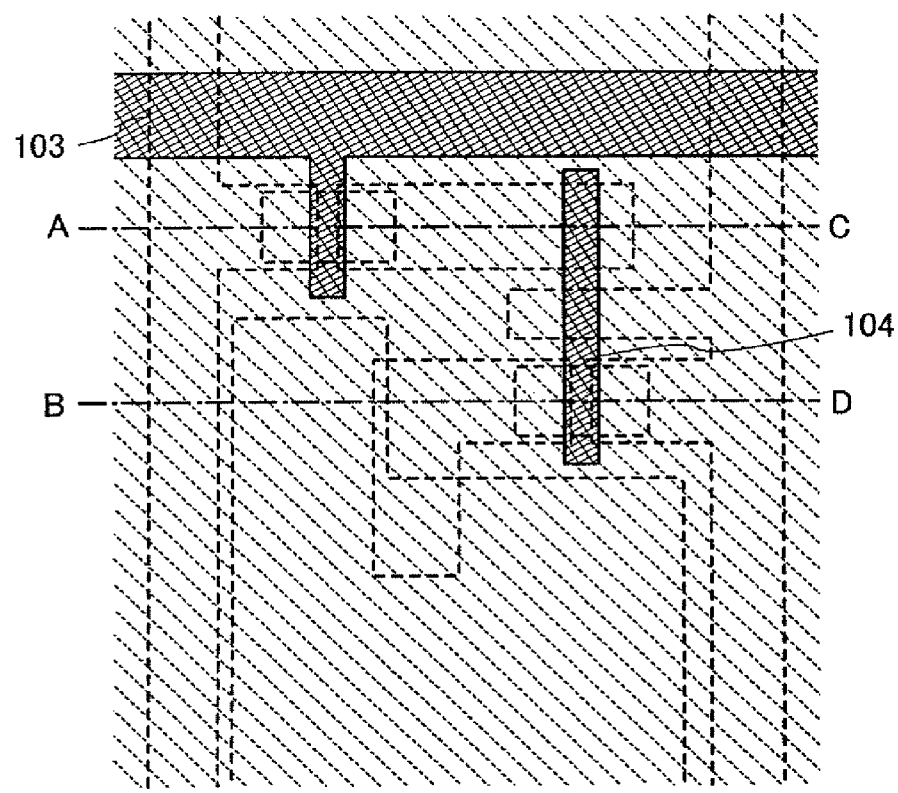
FIGS. 4A to 4C are diagrams explaining a method of manufacturing a display device according to the invention.
Figure 4B:
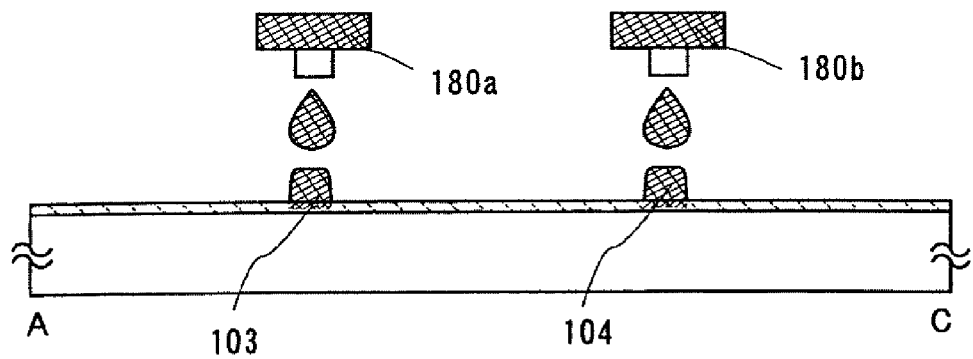
Figure 4C:
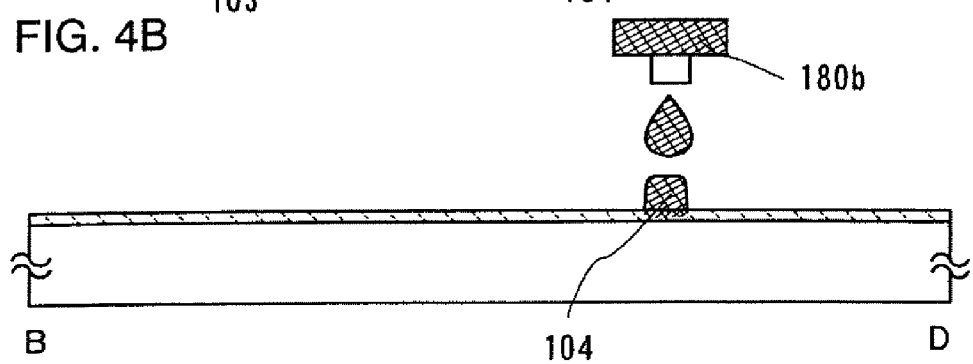

Droplets of the composition containing the conductive material are discharged on the base films 102a and 102b, in which the properties are changed due to irradiation of laser beam, by the droplet discharging devices 180a and 180b so as to form gate electrode layers 103 and 104 (see FIG. 4B). The discharged droplets are attached to the base films 102a and 102b having higher lyophilic properties (i.e., lower lyophobic properties) as compared with the base film around the base films 102a and 102b. When the diameter of the discharge ports for the nozzles through which the droplets are discharged is larger than the size of the predetermined patterns, since the treatment for increasing the lyophilic properties (or reducing the lyophobic properties) is carried out in the subject regions to be formed with the patterns, the droplets are only adhered to the subject regions so that fine linear conductive layers can be formed. There is difference in the lyophobic (lyophilic) properties between the subject regions and the region around the subject regions, and hence, the droplets are shed in the region around the subject regions with the lyophobic properties and remain in the subject regions with the higher lyophilic properties.

According to the invention, when microscopic patterns like the gate electrode layers 103, 104 are formed, droplets are not spread around subject regions to be formed with the patterns so that microscopic linear s can be formed, even if the diameter of the discharge port for the droplet is comparatively large. By controlling the amount of droplets, the thickness of the conductive layers can be adjusted. When the properties of the base film are selectively changed by being irradiated with laser beam, microscopic wiring, electrode, and the like can be formed with good controllability since laser beam allows microscopic processing. As compared with the case where a conductive layer is formed over the entire surface of the substrate by spin coating, since the conductive layers can selectively be formed by the droplet discharging method according to the invention, loss of materials can be prevented, thereby reducing the manufacturing cost.

Figure 28:
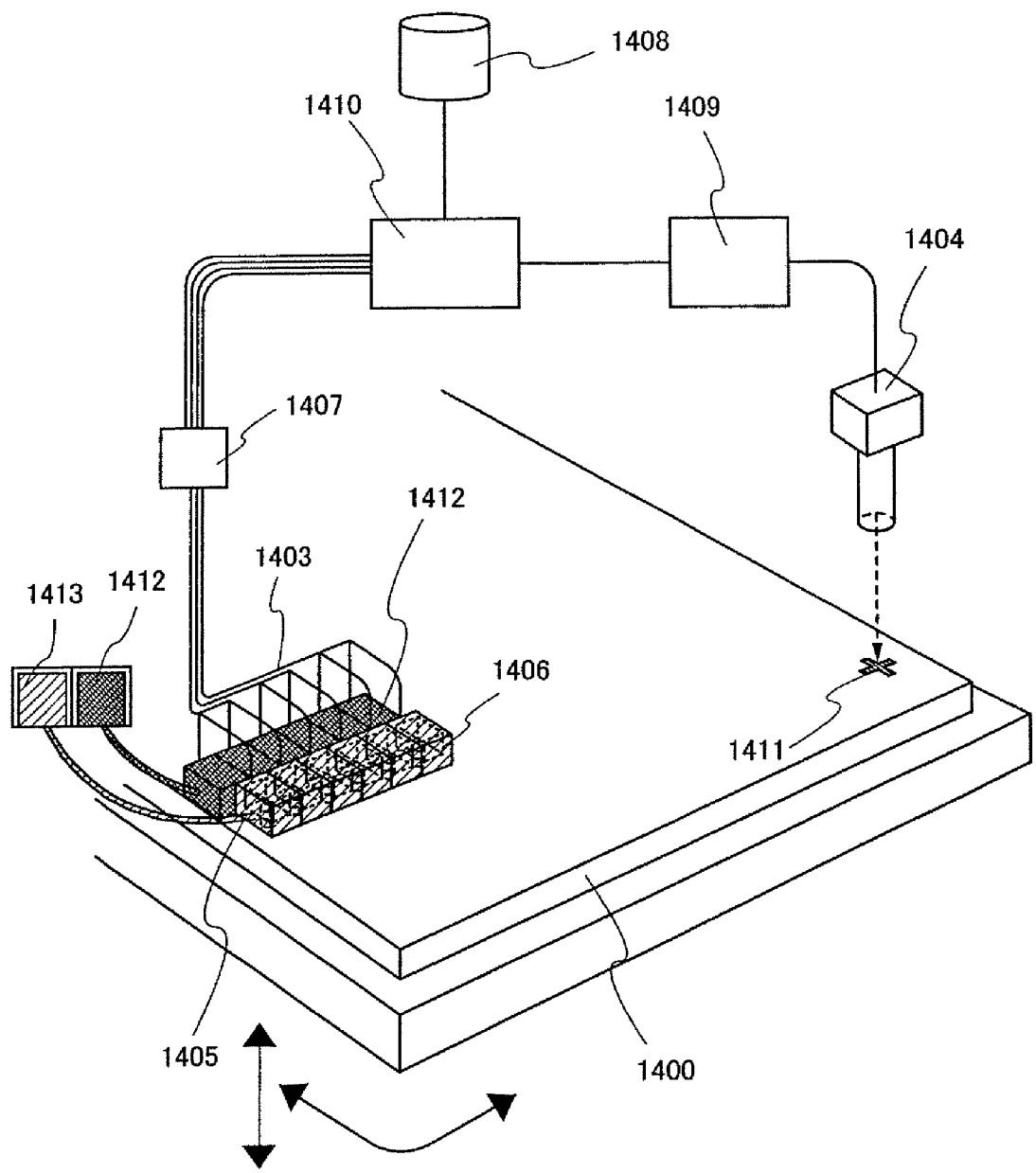
FIG. 28 is a diagram explaining a structure of a droplet discharging device that can be used in the invention.

An example mode of the droplet discharging device that is used for forming the patterns is illustrated in FIG. 28. Heads 1405, 1412 of a droplet discharging means 1403 are connected to a controlling means 1407, respectively. The controlling means 1407 is controlled with a computer 1410 so as to write a pattern, which has been programmed previously. The timing for writing the pattern may, for example, be determined by a marker 1411 that is marked over the substrate 1400. Or, the rim of the substrate 1400 may be determined as a reference point for the timing of wiring the pattern. The reference point is detected by an image pickup means 1404 such as a CCD and converted into a digital signal in an image processing means 1409. The computer 1410 recognizes the digital signal and generates a control signal so that the generated control signal is sent to the controlling means 1407. Information about the pattern to be formed over the substrate 1400 is input in a recording medium 1408. The computer 1410 send the control signal to the controlling means 1407 depending on the information so that the heads 1405, 1412 of the droplet discharging means 1403 can be controlled, individually. The material for forming the pattern is supplied to the respective heads 1405, 1412 from material supply sources 1413 and 1414 via tubes.

The interior of the head 1405 comprises spaces to be filled with a liquid material as shown in a dotted line 1406 and nozzles that are discharge ports. The head 1405 comprises the same interior structure as the head 1405, though not shown. The heads 1405 and 1412 has nozzles with different sizes to one another, respectively, and hence, different materials with different widths can be discharged, simultaneously. A conductive material, an organic material, an inorganic material, and the like can be discharged by one bead to form different patterns. In the case where a pattern is formed on a wide region like an interlayer film, same material can simultaneously be discharged through the plural nozzles to form the pattern, which results in improved throughput. When using a large-size substrate, the heads 1405, 1412 are scanned over the substrate in the directions as indicated by arrows in the drawing so that a region to be formed with a pattern can be determined freely. Accordingly, multiple identical patterns can be formed over a sheet of a substrate.

In the embodiment mode, the base film 101 that is formed as the base pretreatment is formed by dip coating of the sol-gel technique, spin coating, droplet discharging, ion plating, ion beam, CVD, sputtering, RF magnetron sputtering, plasma spray coating, plasma spraying, or anodizing. The base film may not have continuity as a film depending on the method of manufacturing the base film. When the base film 101 is formed by application such as dip coating and spin coating, baking and drying may be arbitrarily carried out, if a solvent is necessary to be removed.

The base film 101 may be made from a metal material such as Ti (titanium); W (tungsten); Cr (chromium); Ta (tantalum); Ni (nickel); and Mo (molybdenum), or oxide thereof by sputtering, vapor deposition, etc.

The base film 101 may be formed with a thickness of 0.01 to 10 nm. Since the base film is preferably formed as thin as possible, it may no have a lamination structure. When the base film is made from a metal material or a 3d transition element and has the conductivity, the base film around the subject regions to be formed with the conductive layers is preferably treated with the following two methods.

As the first method, the base film 101 where is not overlapping with the gate electrodes 103, 104 (i.e., a region exhibiting higher lyophobic properties as compared with regions where is overlapping with the gate electrodes) is insulated to form an insulating layer. That is, the base film 101 where is not overlapping with the gate electrode layers 103, 104 is oxidized to be insulated. When the base film 101 is partly oxidized so as to be insulated in this way, the base film is preferably formed with a thickness of 0.01 to 10 nm such that the base film can be partly oxidized easily. As the method for oxidizing the part of the base film, either a method of exposing the base film to an oxygen atmosphere or a method of performing heat treatment may be employed.

As the second method, the base film 101 is selectively formed in the subject regions to be formed with the gate electrode layers 103, 104 (i.e., regions the composition containing the conductive material will be discharged). The base film 101 may be selectively formed over the substrate by the droplet discharging method. Or, the composition is discharged over the entire surface of the substrate, and then the base film 101 is selectively etched to be removed by utilizing the gate electrode layers 103 and 104 as masks. In such method, the thickness of the base film 101 is not particularly limited.

Further, there is other method in which an organic material that can function as an adhesive agent may be formed on the subject regions to be formed with the patterns to increase the adherence with respect to the patterns formed by the droplet discharging method. It is possible to use an organic material (or an organic resin material) (e.g., polyimide, and acrylic) or a material with skeleton formed by the bond of silicon (Si) and oxygen (O), which includes at least hydrogen as a substituent or at least one of fluoride, alkyl group, and aromatic hydrocarbon as the substituent.

The gate electrode layers 103 and 104 are formed by the droplet discharging means. The droplet discharging means collectively represents a device including a means for discharging a droplet such as a nozzle that has a discharge port for a composition and a head that has one or more nozzles. The diameter of the nozzles equipped with the droplet discharging means is set to be 0.02 to 100 μm (preferably, 30 μm or less). The amount of the composition discharged through the nozzles is set to be 0.001 to 100 pl preferably, in a range of 0.1 to 40 pl, more preferably, 10 pl or less). The amount of the composition discharged therethrough is increase in proportion to the diameter of the nozzles. The distance between the subject substrate and the discharge ports of the nozzles is preferably kept as close as possible to one another such that the composition is discharged in the predetermined portions. Preferably, the distance therebetween is set to be about 0.1 to 3.0 mm (more preferably, 1 mm or less).

As the composition discharged from the discharge ports, a solvent in which a conductive material is dissolved or dispersed is used. The conductive material indicates metals such as Ag, Au, Cu, Ni, Pt, Pd, Ir, Rh, W, and Al; metallic sulfides such as Cd and Zn; oxides such as Fe, Ti, Si, Ge, Si, Zr, and Ba; fine particles or dispersive nanoparticles of silver halide; and the like. In addition, the conductive material indicates indium tin oxide (ITO) that is used as a transparent conductive film, ITSO formed of indium tin oxide and silicon oxide, organic indium, organic tin, organic zinc, titanium nitride, and the like. Note that a solvent in which any one of gold, silver, and copper is dissolved or dispersed is preferably used in consideration of a specific resistance value. It is more preferable to use low-resistive silver or copper. In the case of using the silver or copper, a barrier film is preferably formed to prevent impurities. As the barrier film, a silicon nitride film or nickel boron (NiB) can be used.

Further, it is possible to use particles each of which has a plurality of layers, wherein a conductive material is coated with other conductive materials. For example, particles with three-layered structure in which copper is coated with nickel boron (NiB) and the nickel boron is further coated with silver may be used. As the solvent, the followings can be used: esters such as butyl acetate and ethyl acetate; alcohols such as isopropyl alcohol and ethyl alcohol; organic solvents such as methyl ethyl ketone and acetone; and the like. The viscosity of the composition is preferably set to be 20 cp or less such that the composition is prevented from being dried or the composition is discharged through the discharge ports smoothly. Preferably, the surface tension of the composition be set to be 40 mN/m or less. The viscosity etc. of the composition may arbitrarily be controlled depending on a solvent to be employed or intended use. For instance, the viscosity of a composition in which ITO, organic indium, or organic tin is dissolved or dispersed in a solvent is preferably set to be 5 to 20 mPa S; the viscosity of a composition in which silver is dissolved or dispersed in a solvent, 5 to 20 mPa S; and the viscosity of a composition in which gold is dissolved or dispersed in a solvent, 5 to 20 mPa S.

The conductive layers may be formed by laminating a plurality of conductive materials. Also, the conductive layers are formed by discharging silver as a conductive material with the droplet discharging method, and then the conductive layers may be coated with copper and the like. In this case, the electroplating, the electroless (no electric field) plating, and the like may be employed. Upon plating, the surface of the subject substrate may be soaked in a solution of a material for plating that is filled in a container. Alternatively, the subject substrate may be set obliquely (or perpendicularly), and a solution of a material for plating may be flowed downward over the substrate such that the surface of the substrate is coated with the solution. This method has an advantage of miniaturizing a processing device.

The diameter of a particle for a conductive material is preferably as small as possible so as to prevent a clogged nozzle or fabricate a microscopic pattern, though it depends on the size of each nozzle, a predetermined pattern shape, etc. Preferably, the diameter of the particle is set to be 0.1 μm or less. The composition is formed by a known method such as the electrolyzing method, the atomizing method, and the wet reducing method. The particle size thereof is typically about 0.01 to 10 μm. When a composition is formed by the gas evaporation method, a nanoparticle with the size of about 7 nm, which is protected with a dispersing agent can be obtained. When each surface of nanoparticles is coated with a coating agent, the nanoparticles do not aggregate in the solution and are uniformly dispersed therein at a room temperature, and exhibit properties similar to those of liquid. Accordingly, it is preferable to use the coating agent.

When the step of discharging the composition is performed under reduced pressure, the solvent of the composition is vaporized during a period from discharging the composition until the composition is attached to an object to be processed, and thus, subsequent steps of drying and baking the composition can be both omitted. It is preferable to perform the step of discharging the composition under reduced pressure, since an oxide film etc. is not formed on the surface of the conductive material. After discharging the composition, one or both steps of drying and baking is/are performed. Each step of drying and baking is a step of heat treatment. For example, drying is performed for 3 minutes at 100° C. and baking is performed for 15 to 30 minutes at temperatures of from 200 to 350° C., each of which has a different purpose, temperature, and period. The steps of drying and baking are performed under normal pressure or reduced pressure by laser beam irradiation, rapid thermal annealing, a heating furnace, or the like. Note that the timing of the heat treatment is not particularly limited. The substrate may previously be heated to perform the steps of drying and baking, favorably. The temperature of the substrate at the time depends on a material of the substrate or the like, but it is typically set to be 100 to 800° C. (preferably, 200 to 350° C.). According to the steps, nanoparticles are made in contact with one another and fusion and welding are accelerated by curing and shrinking a peripheral resin as well as evaporating the solvent in the composition or chemically removing the dispersing agent.

A continuous wave or pulsed wave gas laser or solid-state laser may be used for laser beam irradiation. As the gas laser, an excimer laser, a YAG laser, and the like can be given. As the solid-state laser, a laser using a crystal of YAG, $YVO_4$, $GdVO_4$, etc., which is doped with Cr, Nd, and the like, can be given. Note that it is preferable to use a continuous wave laser in relation to the absorptance of laser beam. Moreover, a so-called hybrid laser irradiation method, which is a combination of pulsed wave with continuous wave, may be used. Preferably, the heat treatment with laser beam irradiation is instantaneously performed within several microseconds to several tens of seconds such that the substrate 100 is not damaged, depending on heat resistance of the substrate 100. Rapid thermal annealing (RTA) is carried out by rapidly raising the temperature and instantaneously heating the substrate for several microseconds to several minutes, using an infrared lamp or a halogen lamp that emits light of from ultraviolet to infrared light under an inert gas atmosphere. Since the rapid thermal annealing is performed instantaneously, only a thin top surface of the substrate can be heated substantially and a lower layer film is not adversely affected. Namely, even a substrate having weak heat resistance such as a plastic substrate is not adversely affected.

Although the base film 101 is formed as the base pretreatment prior to forming the gate electrode layers 103 and 104 that are formed by the droplet discharging method, the treatment step may also be carried out after forming the gate electrode layers.

After forming the gate electrode layers 103, 104 by discharging the composition with the droplet discharging method, the surface of the substrate 100 may be planarized by pressing it with pressure to enhance its planarity. As a pressing method, depressions and projections may be leveled by scanning a roller-shaped object on the surface, or the surface may be perpendicularly pressed with a flat plate-shaped object. Heat treatment may be performed at the time of pressing. Or, projections of the surface may be removed with an air knife by softening or melting the surface with a solvent and the like. A CMP method may also be used to polish the surface. These planarizing steps may be performed for planarizing a surface of a substrate when projections and depressions are formed by the droplet discharge method.

According to the invention, wirings with a width of 5 µm or less can be formed as the gate electrode layer 103 and 104.

Figure 5A:
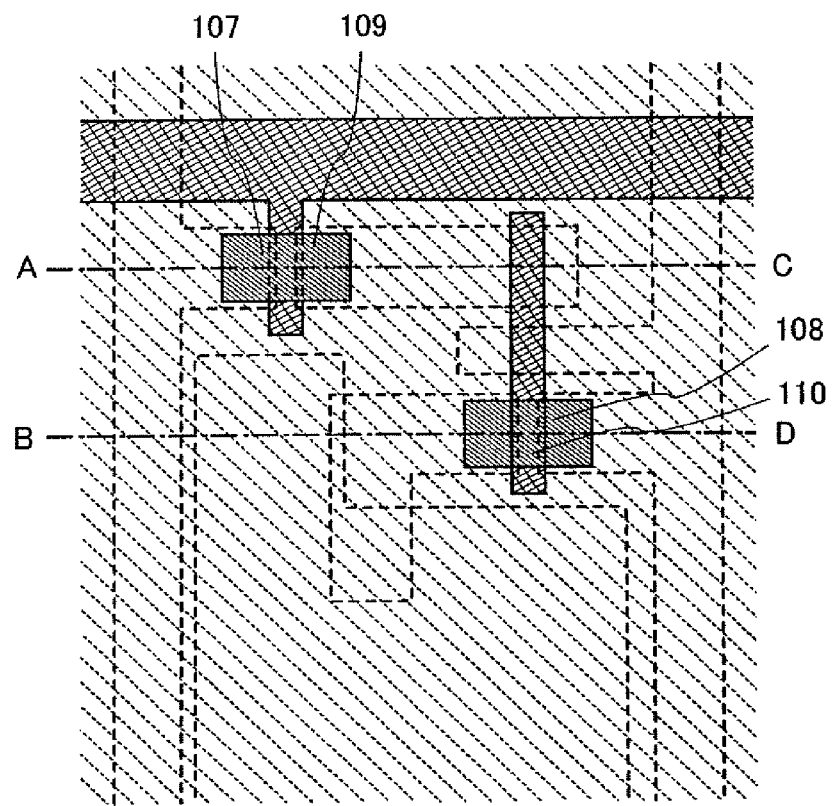
FIGS. 5A to 5C are diagrams explaining a method of manufacturing a display device according to the invention.
Figure 5B:
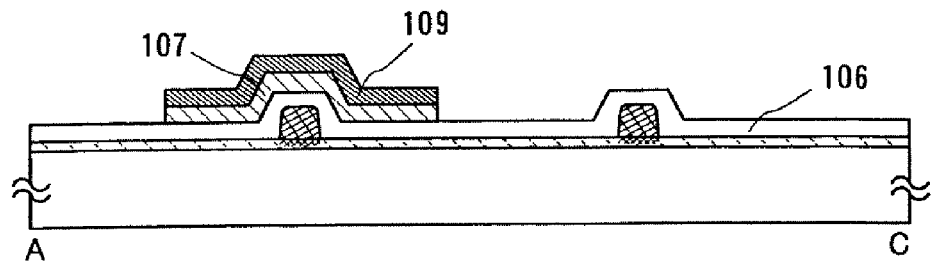
Figure 5C:
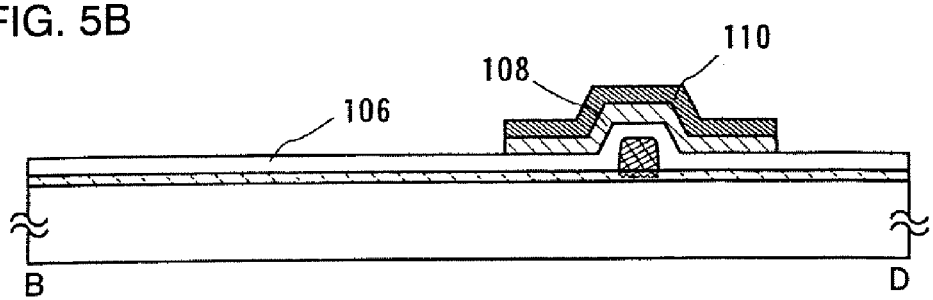
Figure 6A:
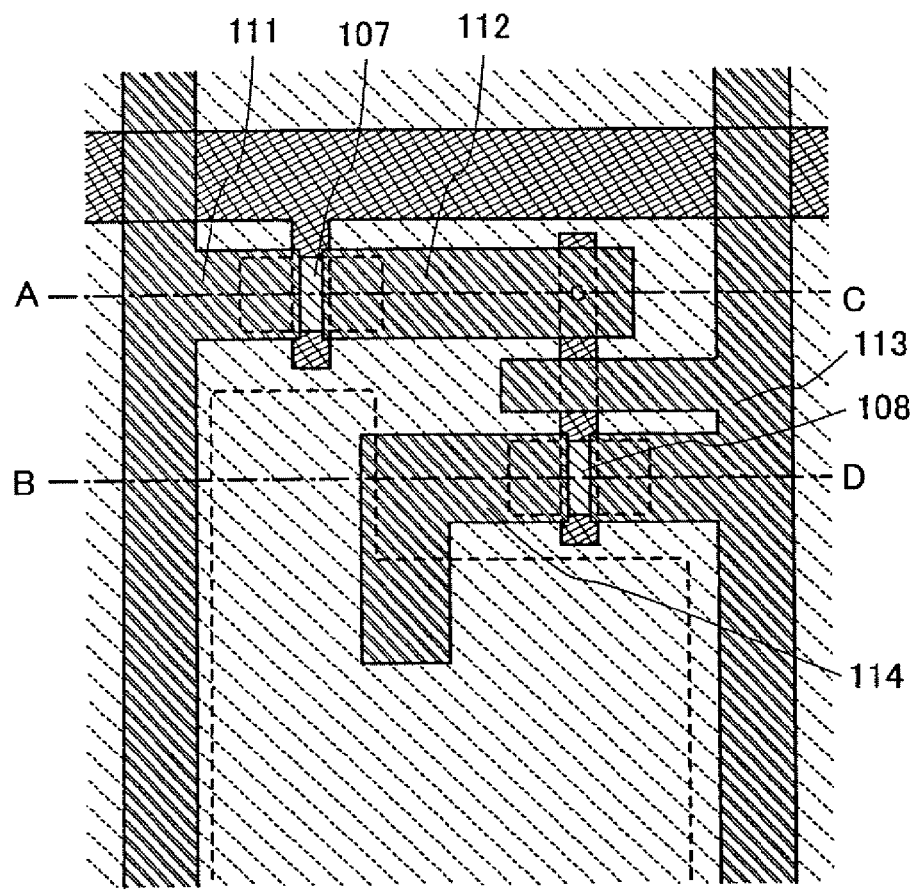
FIGS. 6A to 6C are diagrams explaining a method of manufacturing a display device according to the invention.
Figure 6B:
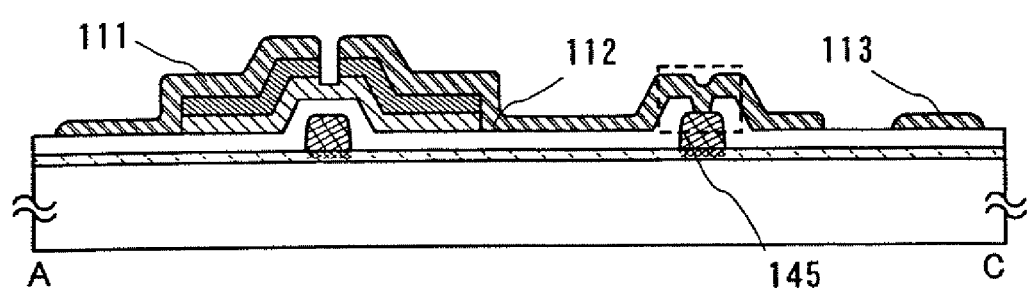
Figure 6C:
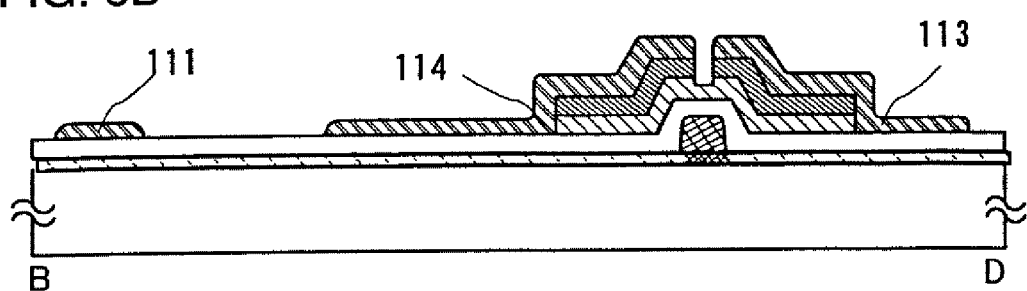

Next, a gate insulating layer 106 is formed on the gate electrode layers 103 and 104 (see FIGS. 5B and 5C). The gate insulating layer 106 may be made from a known material such as a silicon oxide material and a silicon nitride material, and have a single layer or a lamination layer. In the embodiment mode, the gate insulating film 106 is formed by laminating a silicon nitride film, a silicon oxide films and another silicon nitride film. Also, a single layer of a silicon oxynitride film, a lamination layer including two layers may be employed, as well as the above-mentioned three layer structure. A dense silicon nitride film is preferably used for the gate insulating layer. When the conductive layers (the gate electrode layers 103 and 104) are made from silver, copper, and the like by the droplet discharging method, a silicon nitride film, an NiB film, or the like is formed thereon as a barrier film for the conductive layers, thereby preventing dispersion of impurities and planarizing the surface of the substrate. In order to form a dense insulating film with few gate leakage current at a low temperature, a reactive gas containing a rare gas element such as argon is preferably mixed into the insulating film.

Semiconductor layers are next formed. A semiconductor layer having one conductivity type may be formed, if necessary. In this embodiment mode, N-type semiconductor layers 109, 110 are formed as the semiconductor layers having one conductivity type together with semiconductor layers 107, 108 (see FIGS. 5A to 5C). Or, an NMOS structure of an N-channel type TFT by forming an N-type semiconductor layer, a PMOS structure of a P-channel type TFT with a P-type semiconductor layer, and a CMOS structure with a combination of an N-channel type TFT and a P-channel TFT can be manufactured. In order to impart one conductivity, an element which imparts one conductivity is doped to form an impurity region in a semiconductor layer so as to form an N-channel type TFT or a P-channel type TFT.

The semiconductor layers may be formed by a known method (e.g., sputtering, LPCVD, plasma CVD). Although materials for the semiconductor layers are not particularly limited, the layers may preferably be formed of silicon, a silicon germanium (SiGe) alloy, and the like.

As the materials of the semiconductor layers, an amorphous semiconductor (typically, hydrogenated amorphous silicon) and a crystalline semiconductor (typically, polysilicon) are used. Examples of polysilicon include: so-called high-temperature polysilicon using polycrystalline silicon as its principal material that is formed through process temperatures of 800° C. or more; so-called low-temperature polysilicon using polycrystalline silicon as its principal material that is formed at process temperatures of 600° C. or less; and crystalline silicon which is crystallized by adding, for example, an element which promotes crystallization.

Further, as other substances, a semiamorphous semiconductor or a semiconductor containing a crystalline phase in a part of a semiconductor layer can be also used. The term "semiamorphous semiconductor" herein indicates a semiconductor having an intermediate structure between an amorphous structure and a crystalline structure (including single crystal structure and a polycrystal structure) and having a stable third condition with respect to free energy. The semiamorphous semiconductor is a crystalline having a short-range order along with a lattice distortion. Typically, the semiamorphous semiconductor includes silicon as a main component with a lattice distortion, in which Raman spectrum is shifted to a lower wavenumber than 520 cm$^{-1}$. Further, hydrogen or halogen of at least 1 atom % is added therein as a neutralizing agent to terminate dangling bonds. Such a semiconductor as described above is, herein, referred to as a semiamorphous semiconductor (hereinafter, referred to as "SAS" in short). The SAS is also referred to as a so-called microcrystal semiconductor (typically, microcrystalline silicon).

The SAS is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$, and the like can be used. Additionally, $GeF_4$ and $F_2$ can be mixed. The silicide gas may also be diluted with hydrogen, or a mixture of hydrogen and one or more of rare gas elements selected from helium, argon, krypton, and neon so that the SAS can be formed easily. The dilution ratio of hydrogen with respect to the silicide gas is preferably set to be in the range of 1:2 to 1:1,000. Although the SAS is preferably formed under reduced pressure by glow discharge decomposition, it can also be formed under atmospheric pressure by utilizing an electric discharge. Typically, the pressure is set to be in a range of 0.1 to 133 Pa. The power frequency for generating the glow discharge is set to be 1 to 120 MHz, preferably, 13 to 60 MHz. A high-frequency power may be appropriately set. A substrate heating temperature may be set to be 300° C. or less, and the temperature in the range of 100 to 200° C. is also permissible. With respect to impurity elements contained in the film, each concentration of impurities for atmospheric constituents such as oxygen, nitrogen, and carbon is preferably set to be $1 \times 10^{20}$ cm$^{-3}$ or less. In particular, the oxygen concentration is set to be $5 \times 10^{19}$/cm$^{-3}$ or less, preferably, $1 \times 10^{19}$/cm$^{-3}$ or less. Further, the SAS is added with a rare gas element such as helium, argon, krypton, and neon to promote the lattice distortion, which results in more stable SAS. Also, a semiconductor layer may be formed by laminating an SAS layer formed of fluorine-based gas and an SAS layer formed of hydrogen gas.

When a crystalline semiconductor layer is used as the semiconductor layers, a known method (laser crystallization, thermal crystallization, thermal crystallization using an element promoting crystallization such as nickel, etc.) may be employed as a method for manufacturing the crystalline semiconductor layer. In the case of introducing no element promoting crystallization, hydrogen is released until hydrogen concentration contained in an amorphous silicon film becomes $1 \times 10^{20}$ atoms/cm$^3$ or less by heating the amorphous silicon film for one hour at a temperature of 500° C. under a nitrogen atmosphere prior to irradiating the amorphous silicon film with laser light. This is because the amorphous silicon film containing much hydrogen is damaged when it is irradiated with laser light.

There is no particular limitation on a method for introducing a metal element into the amorphous semiconductor layer so long as it is a method capable of making the metal element exist on the surface or inside of the amorphous semiconductor layer. For example, sputtering, CVD, plasma treatment (including plasma CVD), adsorption, or a method for applying a metal salt solution can be employed. Among them, the method using a solution is simple and easy and is useful in terms of easy concentration adjustment of the metal element. It is preferable that an oxide film be formed by UV light irradiation in an oxygen atmosphere, thermal oxidation, treatment with ozone water or hydrogen peroxide including a hydroxyl radical, or the like in order to improve wettability on the surface of the amorphous semiconductor layer and to spread an aqueous solution over the entire surface thereof.

In addition, heat treatment and laser beam irradiation may be combined to crystallize the amorphous semiconductor layer. Or, the heat treatment or the laser light irradiation may be independently performed for plural times.

A crystalline semiconductor layer may be formed directly over the substrate with a linear plasma method. Alternatively, a crystalline semiconductor layer may be selectively formed over a substrate with the linear plasma method.

An organic semiconductor using an organic material may be used as a semiconductor. A low molecular weight material, a high molecular weight material, and the like are used for the organic semiconductor, and in addition, a material such as an organic pigment, a conductive high molecular weight material can be used.

In the embodiment mode, an amorphous semiconductor is used as a semiconductor. A semiconductor layers is formed, and then an N-type semiconductor layer is formed by plasma CVD and the like as the semiconductor layer having one conductivity type.

Subsequently, the semiconductor layer and the N-type semiconductor layer are simultaneously patterned by using a mask made from an insulating material such as a resist and polyimide to from the semiconductor layers 107, 108, and the N-type semiconductor layers 109, 110 (see FIGS. 5A to 5C). The mask can be formed by selectively discharging a composition. With respect to the mask, a resin material such as an epoxy resin, an acrylic resin, a phenol resin, a novolac resin, a melamine resin, and a urethane resin is used. The mask may also be made from an organic material such as benzocyclobutene, parylene, flare, and polyimide having light transmitting properties; a compound material formed by polymerization of siloxane system polymer; a composition material containing a water-soluble homopolymer and a water-soluble copolymer; etc, by using the droplet discharging method. In addition, a commercially available resist material including a photosensitive agent may be also used. For example, it is possible to use a novolac resin that is a typical positive resist, a naphthoquinonediazide compound that is a photosensitive agent, a base resin that is a negative resist, diphenylsilanediol, an acid forming material, and the like. The surface tension and viscosity of any material is appropriately adjusted by adjusting the solvent concentration or adding a surface-active agent, etc.

Note that, in the embodiment mode, the semiconductor layers can be formed in the same manner as the gate electrode layers 103 and 104, wherein a base film is formed and the properties of the base film are partly changed by being irradiated with laser beam as a pretreatment so that the patterns can be selectively formed by the droplet discharging method. Specifically, subject regions to be formed with the patterns are irradiated with laser beam so as to change the properties of the subject regions prior to forming the patterns by the droplet discharging means. Since only the properties of the subject region, difference in lyophobic (lyophilic) properties between the subject regions and a region around the subject region is caused. Therefore, when the patterns are formed by the droplet discharging method, droplets remain only in the subject regions to be formed with the patterns (with the higher lyophilic properties), thereby forming the patterns with good controllability. The step of partly changing the properties of the base film is applicable to any types of base pretreatments without using a mask in the case of using a liquid material, thereby reducing the number of processing steps.

A mask including an insulating material such as resist and polyimide is formed by using the droplet discharge method. By using the mask, the gate insulating layer 106 is partly etched to form a through hole 145 so that the gate electrode layer 104, which is formed under the gate insulating layer, is partly exposed. Either plasma etching (dry etching) or wet etching may be adopted for the etching-process; however, plasma etching is more suitable for processing a large area substrate. As the etching gas, a fluorine-based gas or a chlorine-based gas such as $CF_4$, $NF_3$, $Cl_2$, and $BCl_3$ may be used, and an inert gas such as He and Ar may be appropriately added. When the etching-processing of atmospheric pressure electric discharging is adopted, local electric discharging is possible; therefore, a mask layer is not necessarily to be formed over the entire surface of the substrate.

After removing the mask, source or drain electrode layers 111, 112, 113, 114 are formed by discharging a composition containing a conductive material. By utilizing the source or drain electrode layers 111, 112, 113, and 114 as masks, the semiconductor layer 107 and the N-type semiconductor layer 109 are patterned to expose the semiconductor layer 107 (see FIG. 6B). The source or drain electrode layers 111, 112, 113, and 114 can be formed in the same manner as the above-mentioned gate electrode layer 103. The source electrode layer 113 also functions as a power supply line.

As the conductive material to form the source or drain electrode layers 111, 112, 113, and 114, a composition which mainly contains a particle of a metal such as Ag (silver), Au (gold), Cu (copper), W (tungsten), and Al (aluminum) can be used. In addition, light transmitting indium tin oxide (ITO), ITSO including indium tin oxide and silicon oxide, organic indium, organic tin, zinc oxide, titanium nitride, and the like may be combined to form the source or drain electrode layers.

As a base pretreatment for the source or drain electrode layers that are formed by the droplet discharging method, a step for forming a base film may be carried out in the same manner as the above-mentioned base pretreatment for the gate wiring layers. The step for forming a base film may also be carried out after forming the source or drain electrode layers. According to the step, the adhesion between the layers is increased, thereby enhancing the reliability of the display device.

In the through hole 145 formed in the gate insulating layer 106, the source or drain electrode layer 112 and the gate electrode layer 104 are electrically connected to each other. A part of the source or drain electrode layers constitutes a capacitor element.

Alternatively, after forming the source or drain electrode layers 111, 112, 113, and 114, the through hole 145 may be formed in a part of the gate insulating layer 106 while utilizing the source or drain electrode layers as masks. A conductive layer is then formed in the through hole 145 so that the source or drain electrode layer 112 and the gate electrode layer 104 are electrically connected to each other. In this case, there is an advantage that the step is simplified.

Figure 7A:
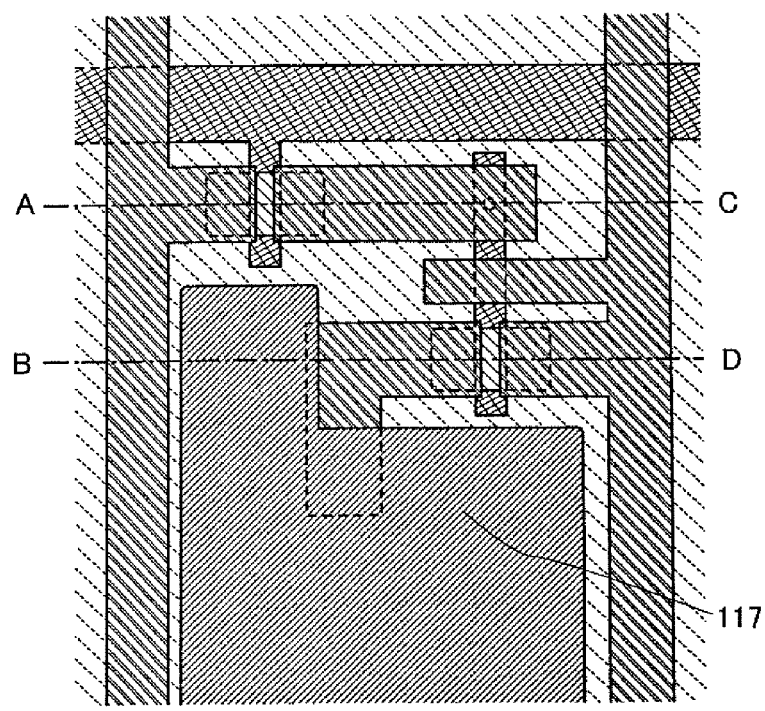
FIGS. 7A to 7C are diagrams explaining a method of manufacturing a display device according to the invention.
Figure 7B:
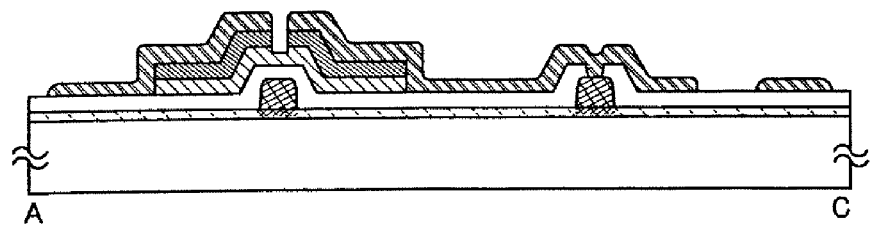
Figure 7C:
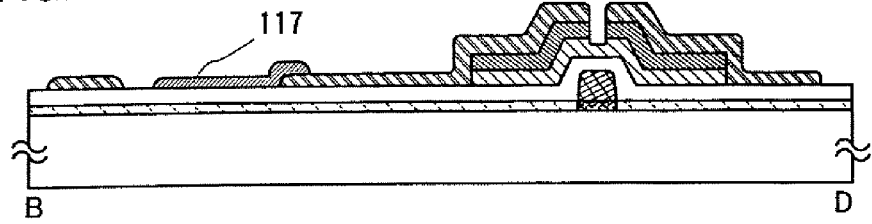

Subsequently, a composition including a conductive material is selectively discharged over the gate insulating layer 106 to form a first electrode layer 117 (see FIG. 7A to 7C). When a base film is formed over the gate insulating layer 106 and properties of the base film are partly changed with laser beam irradiation in the same manner as the gate electrode layers 103, 104, prior to forming the first electrode layer 117, the first electrode layer 117 can also be formed selectively with good controllability. When light is emitted through the substrate 100 side, or a transmissive EL panel is manufactured, the first electrode layer 117 may be formed as follows: a predetermined pattern is made from a composition which contains indium tin oxide (ITO), indium tin oxide containing silicon oxide (ITSO), zinc oxide (ZnO), tin oxide ($SnO_2$), or the like and baked.

The first electrode 117 can selectively be formed over the gate insulating layer 106 prior to forming the source or drain electrode layer 114. In this case, the connection structure in which the source or drain electrode layer 114 is formed on the first electrode layer 117 is provided. When the first electrode layer 117 is formed prior to forming the source or drain electrode layer 114, the first electrode layer can be formed over a flat surface, thereby exhibiting excellent coverage with a preferable film forming property. Since the first electrode layer 117 can be subjected to polishing treatment such as CMP, it can be formed smoothly.

Figure 30A:
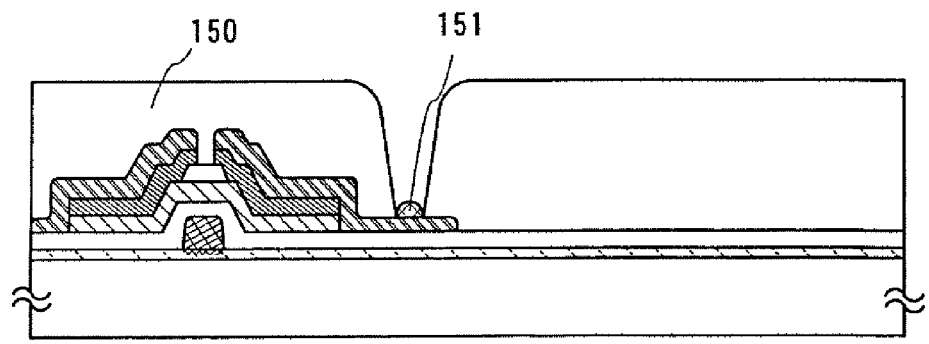
FIGS. 30A to 30C are diagrams explaining a method of manufacturing a display device according to the invention.

As shown in FIG. 30A, an insulating layer 150 that will be an interlayer insulating film may be formed over the source or drain electrode layer 114 so that they are electrically connected to the first electrode layer 117 via a wiring layer 152. In this case, before forming the insulating layer 150, a substance 151 which is lyophobic with respect to the insulating layer 150 (i.e., with a high lyophobic property) is formed on the source or drain electrode layer 114, instead of forming a opening (a contact hole) by partly removing the insulating layer. A composition for the insulating layer 150 is then applied over the substrate by application to form the insulating layer 150 on a region except for a region on which the substance 151 with the lyophobic property is formed (FIG. 30A).

After the insulating layer 150 is cured by heating, drying, or the like, the substance 151 with the lyophobic property is removed to form an opening. A wiring layer 152 is next formed so as to fill the opening. The first electrode layer 117 is then formed overlapping the wiring layer 152 (see FIG. 30B). In this method, since the opening is not necessary to be formed by etching, there is an advantage that the step is simplified. Afterwards, an electroluminescent layer 122 and a second electrode layer 123 are formed over the substrate, thereby achieving a display device.

Figure 30B:
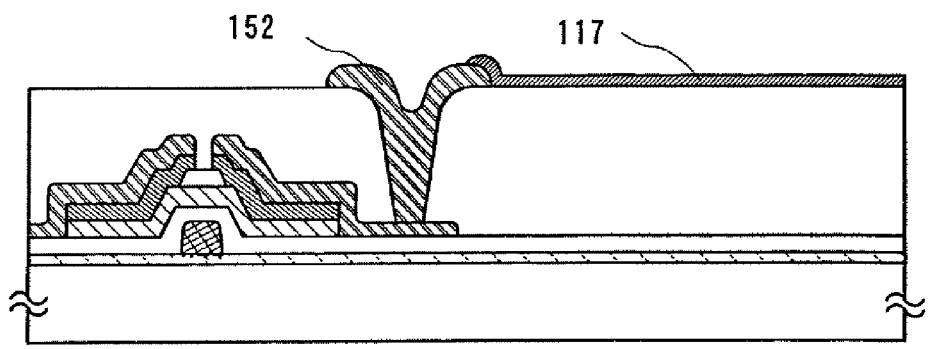
Figure 30C:
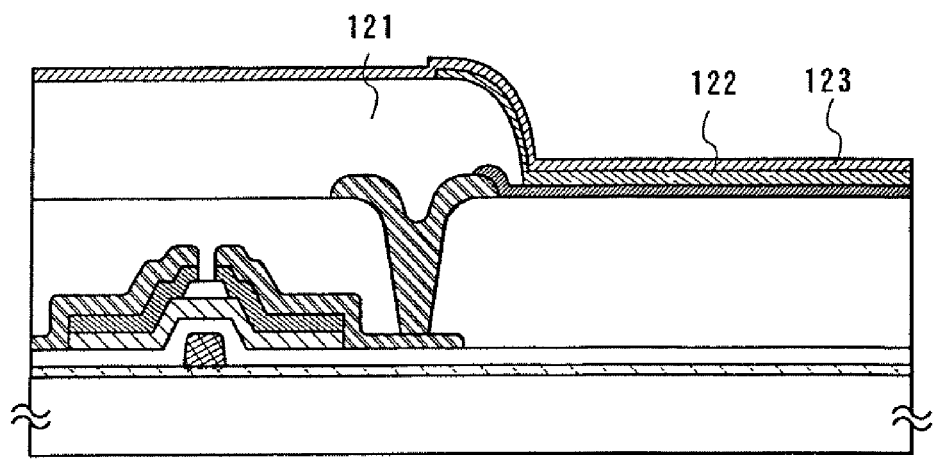

In the case where the interlayer insulating film is formed over the source or drain electrode as shown in FIG. 30A to 30C, the other method for forming the opening can be utilized as follows. In this case, the insulating layer 150 is formed of a photosensitive insulating material. After forming the photosensitive insulating material as the interlayer insulating film, laser beam is irradiated to a predetermined portion to be formed with the opening so that the insulating material is partly photoactivated. The photoactivated insulating material is removed by etching etc. to form an opening (a contact hole) that reaches the source or drain electrode layer. A conductive layer is formed in the opening so as to be in contact with the source or drain electrode layer. The first electrode layer is thus formed so as to be in contact with the conductive layer. Since properties of a film is partly changed by being irradiated with laser beam, microscopic processing can be realized in the present invention.

Preferably, the first electrode layer 117 is formed of indium tin oxide (ITO), indium tin oxide containing silicon oxide (ITSO), zinc oxide (ZnO), or the like by sputtering. More preferably, indium tin oxide containing silicon oxide is used by sputtering by using a target in which 2 to 10 weight percent of silicon oxide is contained in ITO. In addition to this, an oxide conductive material containing silicon oxide in which from 2 to 20% of zinc oxide (ZnO) is further mixed in indium oxide may be used. After forming the first electrode layer 117 by sputtering, a mask layer is formed thereover by the droplet discharging method. Thus, the first electrode layer 117 may be etched to have a desired pattern while using the mask layer. In this embodiment mode, the first electrode layer 117 is formed of a conductive material having light-transmitting properties by the droplet discharging method, and specifically, it is formed by using indium tin oxide and ITSO including ITO and silicon oxide.

In this embodiment mode, an example in which the gate insulating layer is formed of a three-layer, namely, a silicon nitride film, a silicon oxynitride film (silicon oxide film), silicon nitride film has previously been mentioned. As a preferable structure, the first electrode layer 117 including indium tin oxide that contains silicon oxide is formed to be closely in contact with an insulating layer made from silicon nitride, which is included in the gate insulating layer 106. Accordingly, a ratio of light emitted from an electroluminescent layer to the exterior can be increased, effectively. The gate insulating layer is sandwiched between the gate wiring layer or the gate electrode layer and the first electrode layer, and can also function as a capacitor element.

When fabricating a reflective type EL display panel having a structure in which light is emitted to the opposite side of the substrate 100, a composition which mainly contains particles of a metal such as Ag (silver), Au (gold), Cu (copper), W (tungsten), and Al (aluminum) can be used for the first electrode layer 117. Also, the first electrode layer 117 may be formed as follows: a transparent conductive film or a conductive film having light reflectivity is formed by sputtering, a mask pattern is formed by the droplet discharge method, and the conductive film is etched while utilizing the mask.

The first electrode layer 117 may be cleaned and polished by the CMP method or by using polyvinyl alcohol-based porous body so that the surface of the first electrode layer 117 is leveled. In addition, after polishing with the CMP method, ultraviolet irradiation or oxygen plasma treatment may be performed on the surface of the first electrode layer 117.

According to the above-mentioned steps, the substrate 100 having a TFT of a bottom gate type (also referred to as "a reverse stagger type") and a TFT for a display panel to which a pixel electrode is connected, is completed. The TFT in this embodiment mode is a channel etched type.

Subsequently, an insulating layer (also referred to as a partition wall or a bank) 121 is selectively formed (see FIGS. 8A and 8B). The insulating layer 121 is formed to have an opening over the first electrode layer 117. In the embodiment mode, the insulating layer 121 is formed over the entire surface of the substrate, and patterned by etching while using a mask made from a resist or the like. When the insulating layer 121 is formed directly and selectively by the droplet discharge method or the printing method, patterning process by etching is not necessarily required. The insulating layer 121 can be also shaped to have a predetermined shape according to the invention. Productivity is improved by selecting the shape of the insulating layer such as a columnar shape or a plate shape like a spatular shape according to a dimension of a region to be formed with the insulating layer 121.

The insulating layer 121 can be formed of the following materials: silicon oxide; silicon nitride; silicon oxynitride; aluminum oxide; aluminum nitride; aluminum oxynitride; another inorganic insulating material; acrylic acid; methacrylic acid; a derivative of acrylic acid and methacrylic acid; a heat-resistant polymer such as polyimide, aromatic polyamide, and polybenzimidazole; inorganic siloxane containing the Si—O—Si bond among a composition including silicon, oxygen and hydrogen, which is formed by using a siloxane system material as a start material; and an organic siloxane-based insulating material in which an organic group such as methyl or phenyl is substituted for hydrogen over silicon. The insulating layer 121 may also be formed by using a photosensitive material such as acrylic and polyimide, or a nonphotosensitive material.

After forming the insulating layer 121 by discharging a composition by the droplet discharging method, the surface thereof may be pressed with pressure to be planarized in order to enhance its planarity. As a pressing method, projections may smoothed by scanning a roller-shaped object, or the surface may be perpendicularly pressed with a flat plate-shaped object. In addition, a projection portion of a surface may be removed with an air knife by softening or melting the surface with a solvent and the like. A CMP method may be also used for polishing the surface. This step may be applied for planarizing a surface when projections are generated by the droplet discharge method. When planarity is enhanced according to the step, fluctuation in display or the like of a display panel can be prevented, and hence, a high-definition image can be displayed.

Figure 8A:
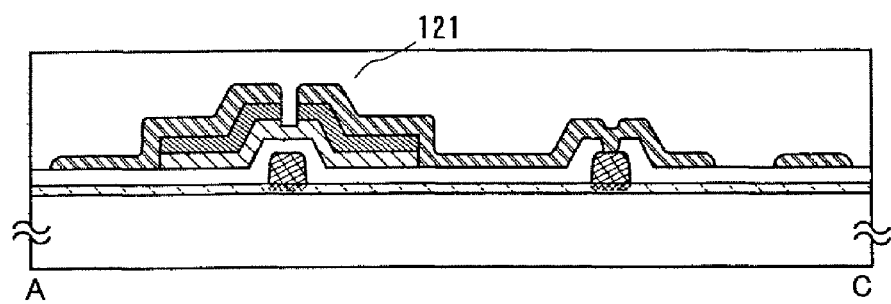
FIGS. 8A and 8B are diagrams explaining a method of manufacturing a display device according to the invention.
Figure 8B:
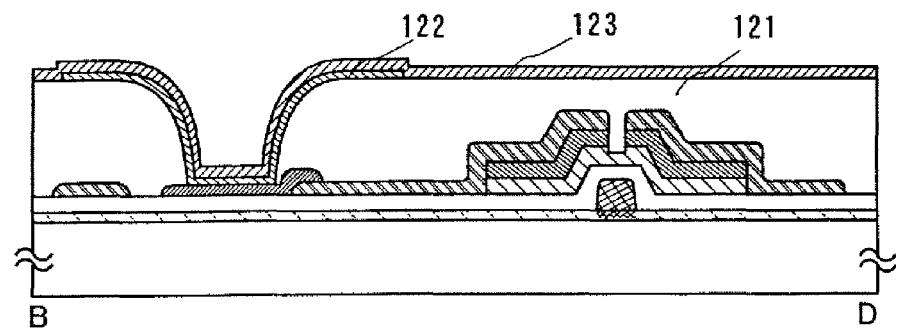

A light emitting element is formed over the substrate 100 having a TFT for a display panel (see FIGS. 8A and 8B).

Before forming an electroluminescent layer 122, moisture adsorbed in the insulating layers 120, 121 or on their surfaces is removed by performing heat treatment at a temperature of 200° C. under atmospheric pressure. It is preferable to perform heat treatment at temperatures of from 200 to 400° C., preferably from 250 to 350° C. under reduced pressure, and to form the electroluminescent layer 122 without being exposed to atmospheric air by vacuum deposition or the droplet discharging method, which is performed under reduced pressure.

As the electroluminescent layer 122, materials each of which indicates the luminescence of red (R), green (G), and blue (B) are selectively formed by vapor deposition using an evaporation mask or the like, respectively. Alternatively, the materials (e.g., low molecular weight materials or high molecular weight materials) each of which exhibits luminescence of red (R), green (G), and blue (B) can be formed by the droplet discharging method in the same manner as a color filter. In this case, coloring of R, G, and B can separately be carried out without using a mask; therefore it is preferable. Then, a second electrode layer 123 is laminated over the electroluminescent layer 122 to complete a display device (a light emitting display device) having a display function using a light emitting element (see FIGS. 5A and 8B).

It is effective to provide a passivation film so as to cover the second electrode layer 123, though not shown. The passivation film may be made from an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) which has more nitrogen content than oxygen content, aluminum oxide, diamond like carbon (DLC), or a nitrogen-containing carbon film ($CN_x$). The passivation film may have a single layer or a lamination layer of the insulating films. For example, a lamination layer of a nitrogen-containing carbon ($CN_x$) film and a silicon nitride (SiN) film or an organic material can be used, or a lamination layer of a polymer such as a styrene polymer may be used. In addition, a material which has skeleton formed by the bond of silicon (Si) and oxygen (O), and which includes at least hydrogen as a substituent, or at least one of fluorine, alkyl group, and aromatic hydrogen as a substituent may be also used.

At this time, a film having excellent coverage is preferably used as the passivation film, and a carbon film, in particular, a DLC film are effective. A DLC film can be formed within the temperatures ranging from a room temperature to 100° C. or less, and therefore, a DLC film can be easily formed over an electroluminescent layer having low heat resistance. A DLC film can be formed by plasma CVD (typically, RF plasma CVD, microwave CVD, electron cyclotron resonance (ECR) CVD, heat filament CVD, or the like), combustion flame, sputtering, ion beam evaporation, laser evaporation, and the like. Hydrogen gas and hydrocarbon system gas (for example $CH_4$, $C_2H_2$, $C_6H_6$, etc.) are used as reactive gases which are used for forming the film. The reactive gases are ionized by glow discharge. The ions are accelerated to collide with a negatively self-biased cathode. A CN film may be formed using $C_2H_2$ gas and $N_2$ gas as reactive gases. The DLC film has high blocking property with respect to oxygen and can suppress the oxidation of the electroluminescent layer. Accordingly, the DLC film can prevent the electroluminescent layer from being oxidized during a subsequent sealing step.

Subsequently, a sealing agent is formed and sealing step is performed with a sealing substrate. Afterwards, a flexible wiring substrate may be connected to the gate electrode layer 103, which also serves as a gate wiring layer, to electrically connect to the exterior. This is the same for the source or drain electrode layer 111, which also serves as a source wiring layer.

Figure 33A:
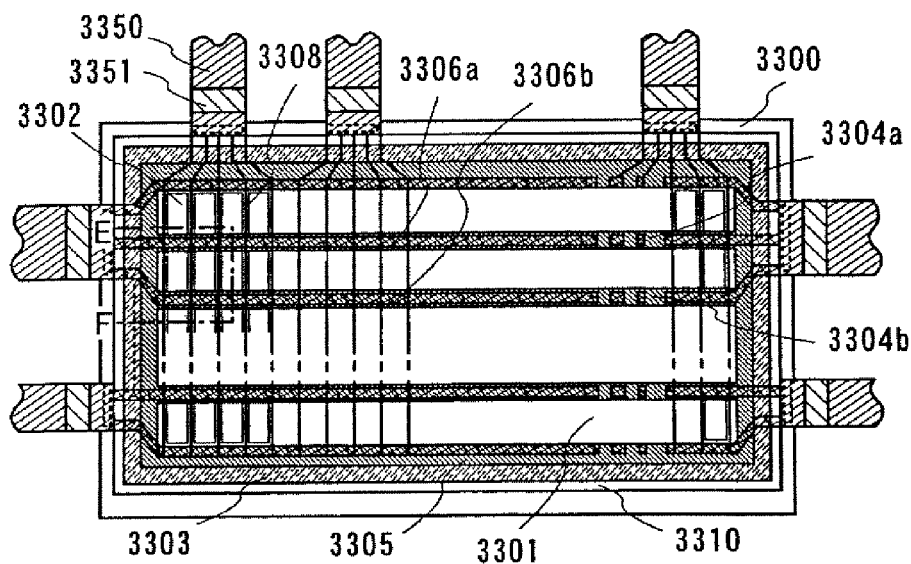
FIG. 33A is a top view and FIG. 33B is a cross sectional view explaining a display panel according to the invention.
Figure 33B:
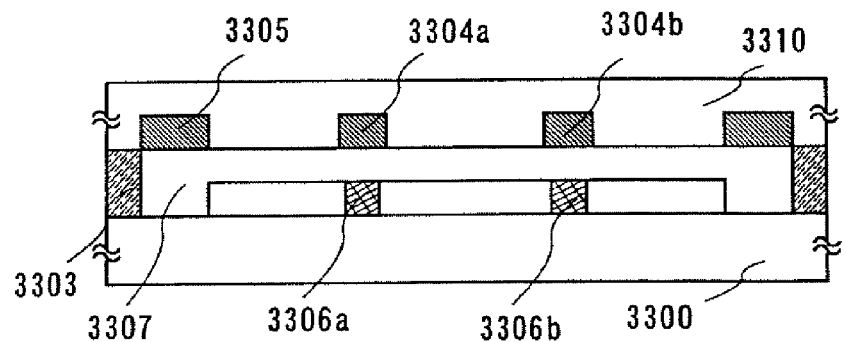

A completed EL display device according to the invention is shown in FIGS. 33A and 33B. FIG. 33A is a top view of the EL display panel, while FIG. 33B is a cross sectional view thereof taken along a line E-F of FIG. 33A. In FIGS. 33A and 33B, a pixel portion formed over an element substrate 3300 includes: pixels 3302; gate wiring layers 3306a, 3306b; and a source wiring layer 3308. The element substrate 3300 is attached to a sealing substrate 3310 with a sealing material 3303. In the embodiment mode, driver ICs 3351 are disposed over FPCs 3350, and the FPCs are mounted over the substrate by the TAB technology.

As shown in FIGS. 33A and 33B, drying agent 3305, 3304a, and 3304b is disposed in the display panel to prevent deterioration of the elements due to moisture. The drying agent 3305 is disposed so as to surround the pixel portion, whereas the drying agent 3304a, 3304b is disposed in regions corresponding to the gate wiring layers 3306a and 3306b. In the embodiment mode, the drying agent is disposed in depression portions that are formed in the sealing substrate as shown in FIG. 33B, and therefore the display panel can be reduced in the thickness. Since the drying agent is formed in the region corresponding to the gate wiring layers, a water absorbing area can be enlarged, which results in improved water absorbing property. Also, since the drying agent is formed over the gate electrode layers, which themselves do not emit light, the light extraction efficiency is not be reduced. In the embodiment mode, a filler 3307 is filled in the display panel. When a substance with a hygroscopic property like a drying agent is used as the filler 3307, the water absorbing property is further improved, which prevents the elements from being deteriorated.

In this embodiment mode, an example where a light emitting element is sealed with a glass substrate is shown. The sealing treatment is treatment to protect the light emitting element from moisture. Any one of method as follows can be used: a method in which a light emitting element is mechanically sealed with a cover material; a method in which a light emitting element is sealed with a heat-curable resin or an ultraviolet-light-curable resin; and a method in which a light emitting element is sealed with a thin film having an excellent barrier property such as metal oxide and nitride. As for the cover material, glass, ceramics, plastic, or metal can be used. When light is emitted through the cover material, the cover material is required to be formed of a material with light-transmitting properties. An enclosed space is formed by attaching the cover material to the substrate over which the above-mentioned light emitting element is formed with a sealing material such as a heat-curable resin or an ultraviolet-light-curable resin and then by curing the resin with heat treatment or ultraviolet irradiation treatment. It is also effective to provide a hydroscopic material typified by barium oxide in the enclosed space. The hydroscopic material may be provided on the sealing material or over a partition wall or a peripheral part so as not to block light emitted from a light emitting element. Further, it is also possible to fill a gap between the cover material and the substrate over which the light emitting element is formed with a heat-curable resin or an ultraviolet-light-curable resin. In this case, it is effective to add a hydroscopic material typified by barium oxide in the heat-curable resin or the ultraviolet-light-curable resin.

In this embodiment mode, although a single gate structure is shown for a switching TFT, a multi-gate structure such as a double gate structure may be also used.

As set forth above, an exposing step being carried out by using a photomask is not required in the embodiment mode, thereby reducing the number of steps. In addition, a display panel can be easily manufactured by directly forming various patterns over a substrate by the droplet discharging method even when a glass substrate which is in and after the fifth generation having 1,000 mm or more on a side is used.

A predetermined pattern can be formed by performing a pretreatment for increasing the adherence with respect to the pattern in a subject region to be formed with the pattern as compared with a peripheral region. In addition, a microscopic linear pattern can be freely designed by processing with laser beam. According to the invention, a predetermined pattern can be formed with excellent controllability with minimum loss of materials, thereby reducing cost. As a consequence, a high-performance display device with excellent reliability can be manufactured with good yield.

Embodiment Mode 3

Another embodiment mode of the invention will be described with reference to FIGS. 9A to 9C, FIGS. 10A to 10C, FIGS. 11A to 11C, and FIGS. 12A to 12C. The present embodiment mode shows an example in which a pretreatment for forming a pattern by the droplet discharging method is different of that in Embodiment Mode 1. FIGS. 9A, 10A, 11A, and 12A are top views of pixel portions for display devices. FIGS. 9B, 10B, 11B, and 12B are cross sectional views taken along each line A-C, while FIGS. 9C, 10C, 11C, and 12C are cross sectional views taken along each line B-D in the respective top views.

A base film 201 is formed over a substrate 200 as a base pretreatment. The base film 201 is made from a photosensitive material that is photoactivated with laser beam irradiation such that the base film formed in a subject region on which patterns will be formed is removed.

Figure 9A:
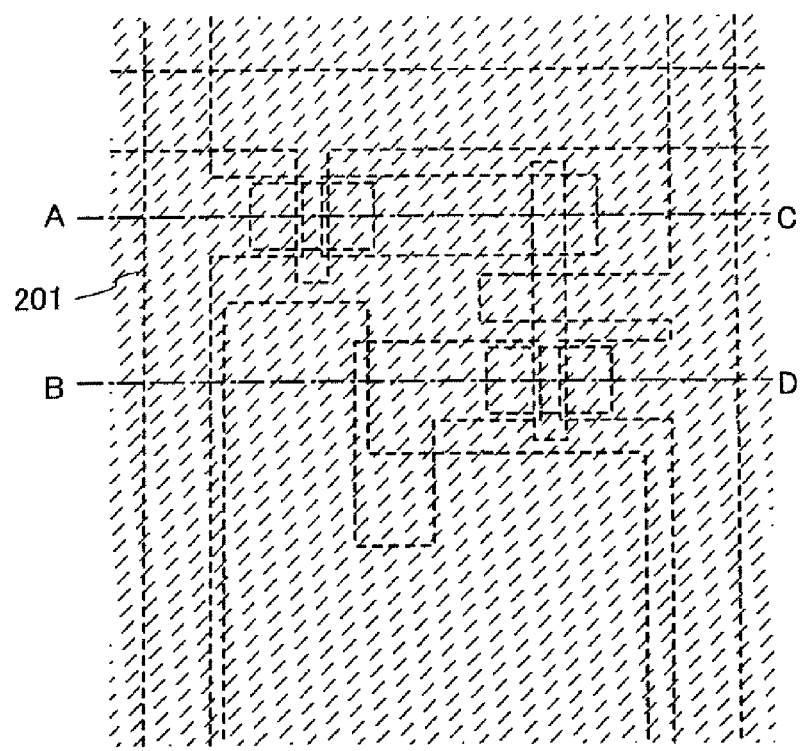
FIGS. 9A to 9C are diagrams explaining a method of manufacturing a display device according to the invention.
Figure 9B:
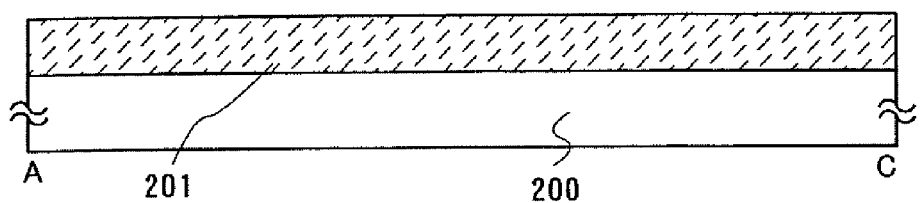
Figure 9C:
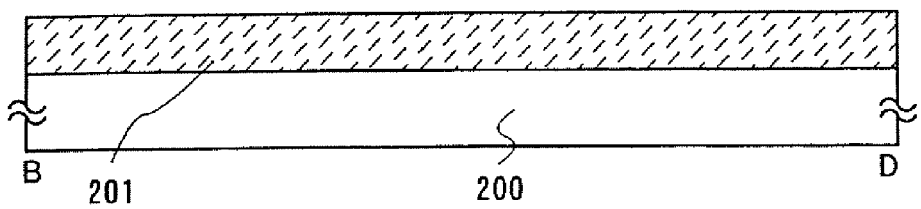

In FIGS. 9A to 9C, the thickness of a base film 201 is set to be equal to or thicker than the thickness of a pattern. When the base film with such a thickness is partly removed, a depression portion is formed such that a pattern material can be discharged in the depression portion. As shown in FIG. 9A, the base film 201 is formed in the vicinity of the subject region to be formed with patterns. The base film 201 is preferably made from a photosensitive resin material, in particular, a positive resist material such that it is subjected to laser processing.

Figure 10A:
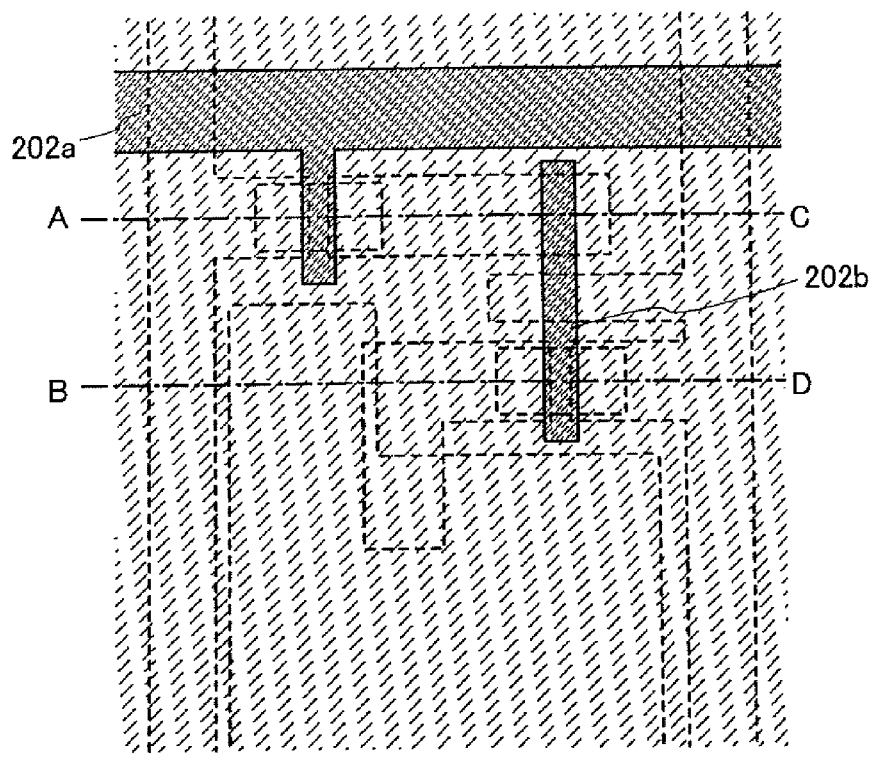
FIGS. 10A to 10C are diagrams explaining a method of manufacturing a display device according to the invention.
Figure 10B:
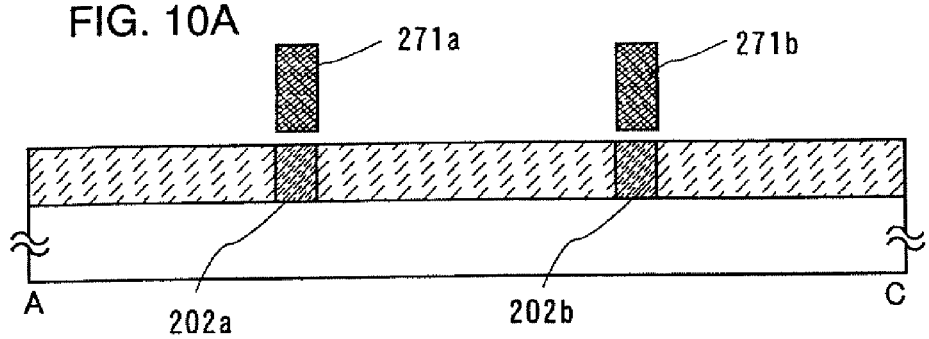
Figure 10C:
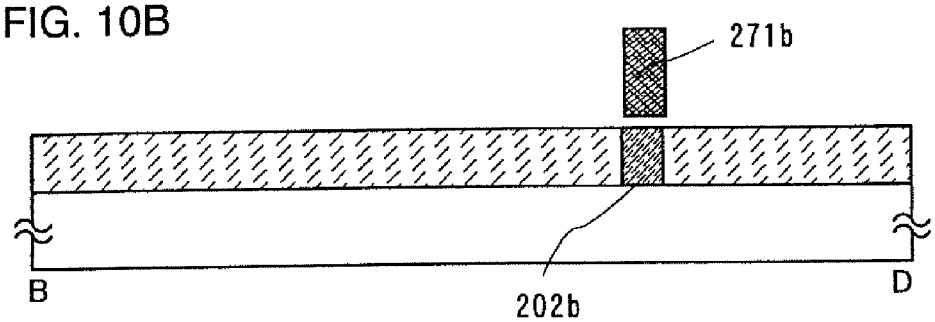
Figure 11A:
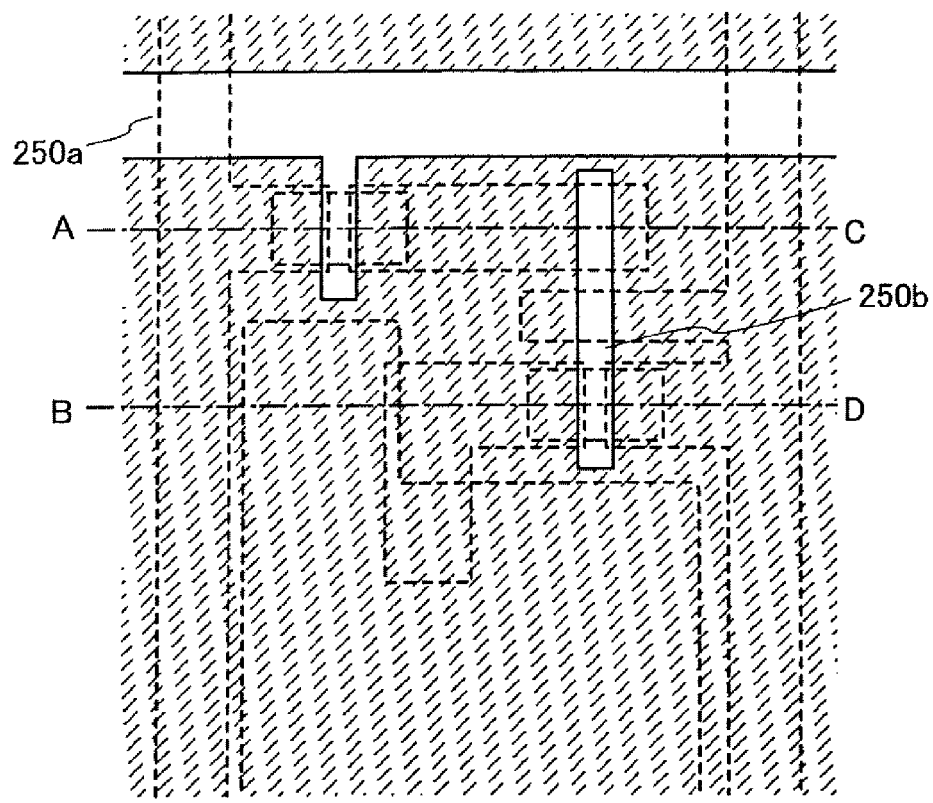
FIGS. 11A to 11C are diagrams explaining a method of manufacturing a display device according to the invention.
Figure 11B:
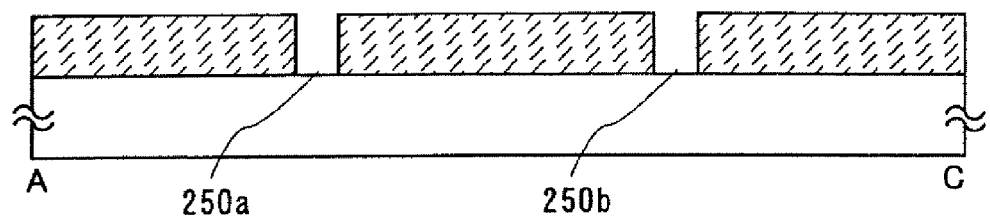
Figure 11C:
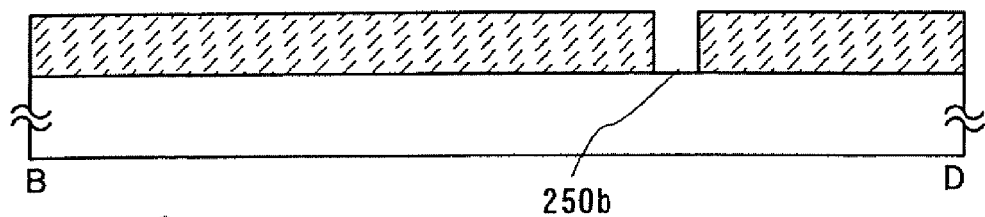

Laser beam 271a and 271b is irradiated to subject regions on which gate electrode layers will be formed by using a laser irradiation device so that the base film 201 is photoactivated to form photoactivated regions 202a and 202b (see FIGS. 10A to 10C). Since the base film 201 is formed of the positive photosensitive material, regions 202a and 202b where are photoactivated with laser beam are removed by etchant, and therefore, depressions 250a and 250b that are surrounded by the remaining base film are formed in the subject regions (see FIGS. 11A to 11C).

Figure 12A:
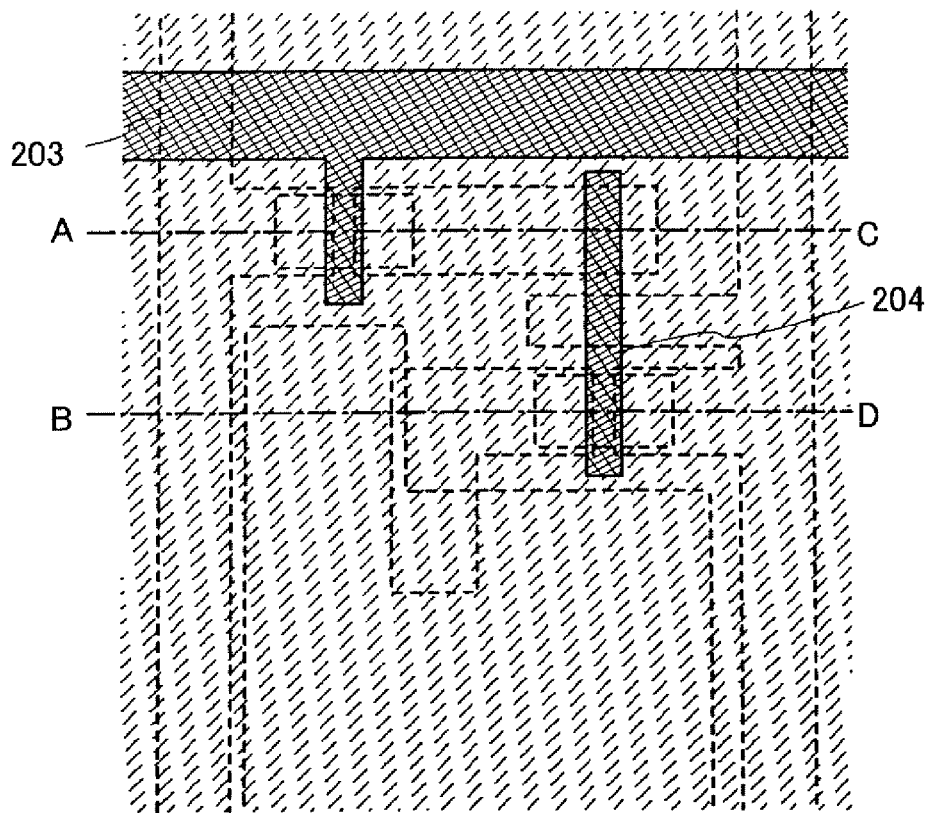
FIGS. 12A to 12C are diagrams explaining a method of manufacturing a display device according to the invention.
Figure 12B:
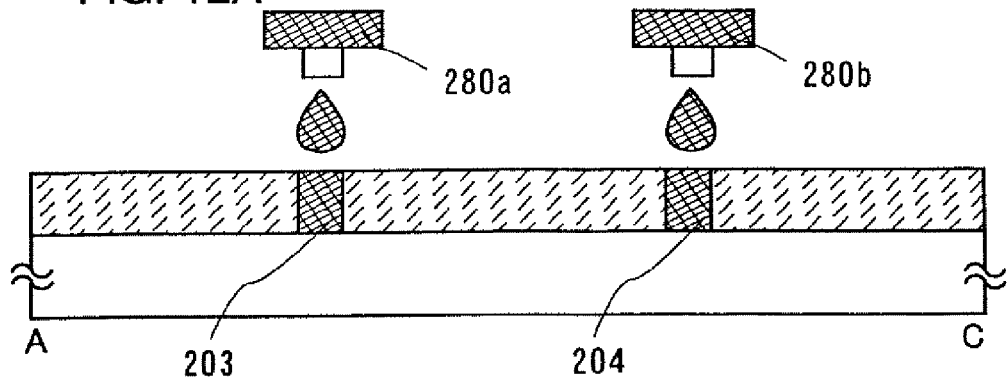
Figure 12C:
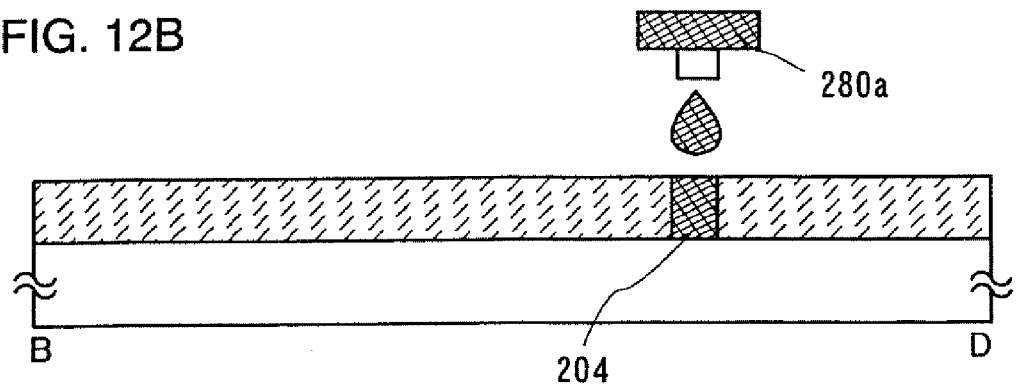

Liquids made from a composition containing a conductive material are discharged in the depressions 250a and 250b by droplet discharging devices 280a and 280b so as to form gate electrode layers 203 and 204 only in the subject regions (see FIGS. 12A to 12C). In the case where a discharge port through which the droplets are discharged is larger in diameter or the droplets are discharged on regions other than the subject regions to be formed with the gate electrode layers with bad controllability, the excess conductive material is discharged on the base film 201 around the subject regions. After forming the gate electrode layers 203 and 204, when the base film 201 made from the photosensitive resin etc. is removed together with the excess conductive material by etching and the like, the gate electrode layers 203 and 204 can be formed only in the predetermined portions with good controllability. Also, by controlling the thickness of the base film made from the photosensitive resin etc., the thickness of the patterns to be formed can be adjusted freely. The subject regions are processed with laser beam irradiation to form the depressions, and therefore, microscopic processing can be carried out. When using laser beam that is optically designed to have a spot shape, a spot like a contact hole can be formed easily and precisely.

The base film 201 around the depressions can be formed of a photosensitive resin such as a photosensitive acrylic and a photosensitive polyimide. In addition, a commercially available resist material containing photosensitive agent may be employed. For example, novolac resin, which is a typical positive resist, a naphthoquinone diazide compound, which is photosensitive agent, and the like may be used.

According to the steps, the gate electrode layers 203 and 204 are formed. The subsequent steps are described in Embodiment Mode 1, and will not be further explained.

A predetermined pattern can be formed by performing a pretreatment for forming a depression in a subject region to be formed with a pattern. In addition, a microscopic linear pattern can be freely designed by processing with laser beam. According to the invention, a predetermined pattern can be formed with excellent controllability with minimum loss of materials, thereby reducing cost. As a consequence, a high-performance display device with excellent reliability can be manufactured with good yield.

Embodiment Mode 4

Another embodiment mode of the invention will be described referring to FIG. 14, FIGS. 15A to 15D, and FIGS. 16A to 16C. The embodiment mode shows an example wherein a top-gate (staggered type) thin film transistor is used as substitute for the bottom gate (reverse stagger type) thin film transistor in Embodiment Mode 2, and therefore, identical portions or portions having similar functions to those in Embodiment Mode 2 will not be described. FIGS. 15A to 15D and FIGS. 16A to 16C are cross sectional views taken along a line B-D in FIG. 14.

A base film 301 is formed over a substrate 300 as a base pretreatment. Laser beam is selectively irradiated only to subject regions on which source or drain electrode layers 311, 312, 313, and 314 will be formed. The properties of the regions irradiated with the laser beam (i.e., base films 302a, 302b, and 302c) are changed to exhibit higher lyophilic (i.e., lower lyophobic) properties with respect to droplets made from a composition containing a conductive material as compared with the base film around the regions irradiated with the laser beam. Therefore, when the composition containing the conductive material is discharged in the regions with the higher lyophilic properties (i.e., the base films 302a, 302b, and 302c), source or drain electrode layers 311, 312, 313, and 314 are formed only on the base films 302a, 302b, and 302c with excellent controllability.

An N-type semiconductor layer is formed over the source or drain electrode layers 311, 312, 313, 314, and then etched by using a mask made from a resist. The mask may be formed by discharging the resist by the droplet discharging method. A semiconductor layer is also formed on the N-type semiconductor layer, and etched by using a mask etc. Accordingly, the N-type semiconductor layer 310 and the semiconductor layers 307, 308 are formed over the substrate 300.

A gate insulating layer 306 is next formed over the substrate 300 to have a single layer or a lamination layer. As a preferable mode, the gate insulating layer is formed by laminating an insulating layer 306a made from silicon nitride, an insulating layer 306b made from silicon oxide, and an insulating layer 306c made from silicon nitride.

Figure 15A:
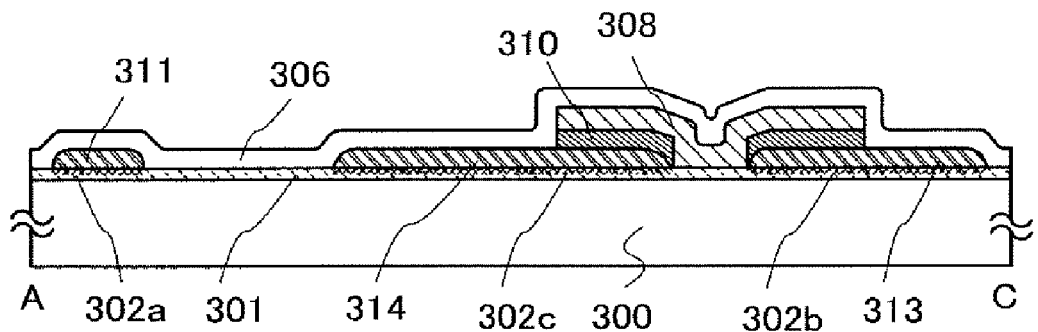
FIGS. 15A to 15D are diagrams explaining a method of manufacturing a display device according to the invention.
Figure 15B:
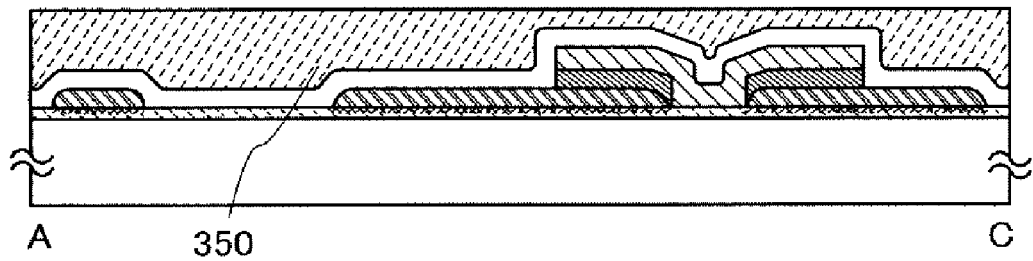
Figure 15C:
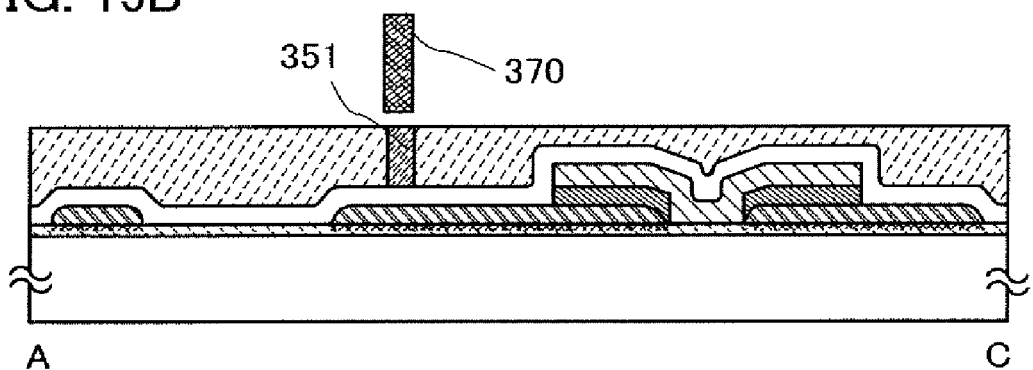
Figure 15D:
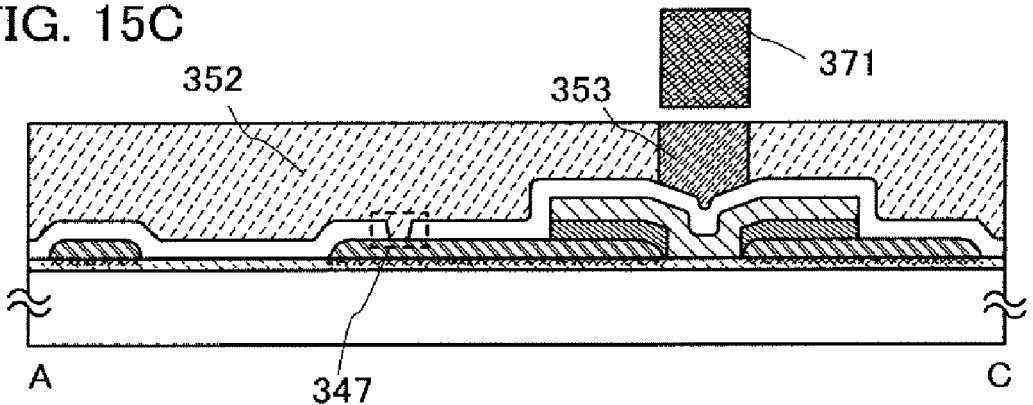
Figure 16A:
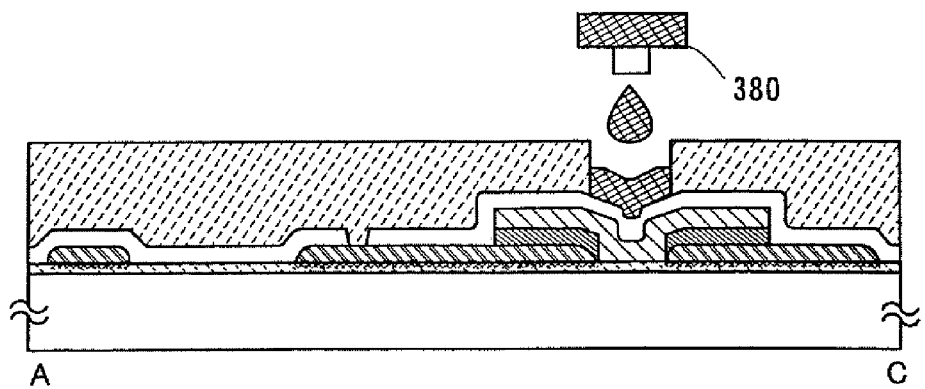
FIGS. 16A to 16C are diagrams explaining a method of manufacturing a display device according to the invention.
Figure 16B:
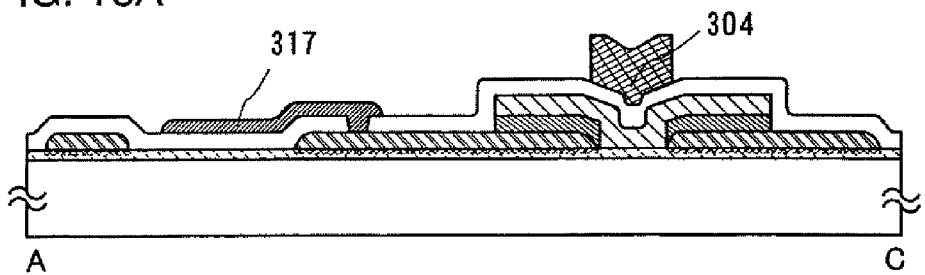
Figure 16C:
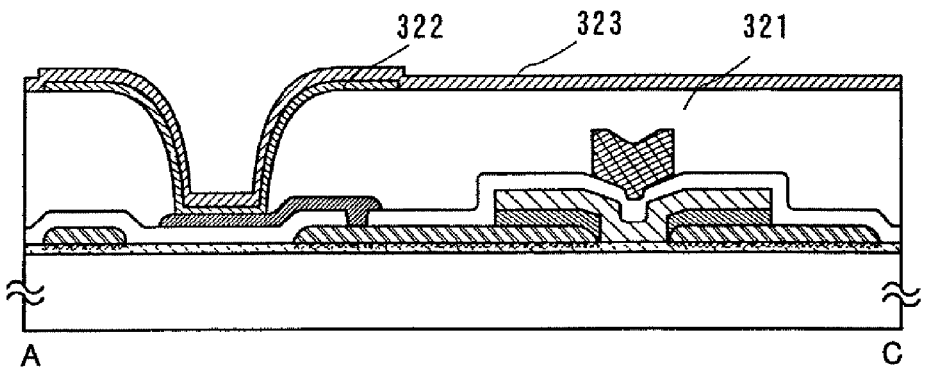

A photosensitive substance 350 is formed on the gate insulating layer 306 (see FIG. 15B). As shown in Embodiment Mode 2, a positive photosensitive substance is used as the photosensitive substance 350, and a photosensitive resin is, herein, used. By using a laser irradiation device, laser beam 370 is irradiated to a predetermined portion such that the photosensitive substance 350 is removed to form a contact hole. A region 351 irradiated with the laser beam 370 is photoactivated (see FIG. 15C). After removing the photoactivated region by etching, the gate insulating layer 306 is etched while utilizing the photosensitive substance 350 as a mask so as to form a through hole 347.

A photosensitive substance 352 is formed over the substrate 300 again. The photosensitive substance 352 is formed to fill the region 351 in which the photosensitive material 350 is removed to form the through hole 347, and therefore, only the region 351, where is an opening, may be filled with the photosensitive substance 352 by the droplet discharging method. By using the laser irradiation device, laser beam 371 is irradiated to a region 353 on which a gate electrode layer 304 will be formed. The region 353 is photoactivated and then etched to be removed as well as the region 351 (see FIG. 16A).

The photoactivated region is removed to form a depression. A composition containing a conductive material is discharged in the depression by the droplet discharging device 380 to form a gate electrode layer 304. According to the invention, the width of the gate electrode layer 304 can be narrowed in a channel direction, thereby reducing the resistivity as well as improving the mobility.

The photosensitive substance 352 is removed. A first electrode layer 317 is next formed by the droplet discharging method. The first electrode layer 317 and the source or drain electrode layer 314 are electrically connected to each other in the through hole 347, which has been previously formed.

An insulating layer 321 is formed, an opening is formed over the first electrode layer, and then an electroluminescent layer 322 and a second electrode layer 323 are formed in the same manner as Embodiment Mode 2. A scaling material is formed over the substrate 300, and sealed with a sealing substrate. Afterwards, a flexible wiring substrate may be connected to the gate electrode layer or the source or drain electrode layer. As set forth above, a display panel having a display function can be manufactured.

As set forth above, an exposing step being carried out by using a photomask is not required in the embodiment mode, thereby reducing the number of steps. In addition, a display panel can be easily manufactured by directly forming various patterns over a substrate by the droplet discharging method even when a glass substrate which is in and after the fifth generation having 1,000 mm or more on a side is used.

A predetermined pattern can be formed by performing a pretreatment for forming a depression in a subject region to be formed with a pattern. In addition, a microscopic linear pattern can be freely designed by processing with laser beam. According to the invention, a predetermined pattern can be formed with excellent controllability with minimum loss of materials, thereby reducing cost. As a consequence, a high-performance display device with excellent reliability can be manufactured with good yield.

Embodiment Mode 5

A thin film transistor can be formed according to the present invention, and a display device can be fabricated using the thin film transistor. When a light emitting element and an N-type transistor for driving the light emitting element are used, light generated from the light emitting element emits downward, upward, or both downward and upward (i.e., bottom emission, top emission, or dual emission). In the present embodiment mode, laminated structures of a light emitting element will be described according to each type of light emission with reference to FIGS. 19A to 19C.

In the embodiment mode, a channel protective type thin film transistor 481 to which the invention is applied is used. The channel protective film may be formed by dropping polyimide, polyvinyl alcohol, or the like with use of the droplet discharging method. Accordingly, a exposing step can be omitted. As the channel protective film, one kind of an inorganic material (e.g., silicon oxide, silicon nitride, silicon oxynitride, silicon nitride oxide, and the like), a photosensitive or nonphotosensitive organic material (an organic resin material) (e.g., polyimide, acrylic, polyamide, polyimide amide, resist, benzocyclobutene, and the like), a Low k material which has a low dielectric constant, and the like; a film including plural kinds thereof, a lamination layer thereof; and the like can be used. Additionally, a material which has skeleton formed by the bond of silicon (Si) and oxygen (O), and includes at least hydrogen as a substituent, or at least one of fluoride, alkyl group, and aromatic hydrocarbon as a substituent, may be used. As a method for manufacturing the channel protective film, a vapor phase growth method such as plasma CVD and thermal CVD, or sputtering can be used. The droplet discharging method or the printing method (a method for forming a pattern, such as a screen printing or offset printing) can be also used. A TOF film or an SOG film obtained by application can be used.

Firstly, the case where light is emitted toward a substrate 480, i.e., downward (bottom emission), is described with reference to FIG. 19A. In the case of the bottom emission, a first electrode 484, a source or drain wiring 482, an electroluminescent layer 485, and a second electrode 486 are sequentially laminated over a substrate 480 such that the source or drain wiring is electrically connected to the transistor 481. Secondly, the case where light is emitted to the side opposite of the substrate 480, i.e., upward (top emission), is described with reference to FIG. 19B. A source or drain wiring 462, which is electrically connected to the transistor 481, a first electrode 463, an electroluminescent layer 464, and a second electrode 465 are sequentially laminated over a substrate 480. According to the above-mentioned structure, even when the first electrode 463 transmits light, the light is reflected by the source or drain wiring 462 and emitted to the side opposite of the substrate 480. Note that in this structure, the first electrode 463 is not necessary to be made from a material having light transmitting properties. Lastly, the case where light is emitted to both the side of the substrate 480 and the opposite side thereof, i.e., both upward and downward (dual emission), is described with reference to FIG. 19C. A source or drain wiring 471, which is electrically connected to the transistor 481, a first electrode 472, an electroluminescent layer 473, and a second electrode 474 are sequentially laminated over a substrate 480. In the case of the dual emission, when both the first electrode 472 and the second electrode 474 are formed of materials having light transmitting properties, or formed to have film thicknesses which can transmit light, light can be emitted both upward and downward.

A light emitting element has a structure in which the electroluminescent layer is sandwiched between the first electrode and the second electrode. It is necessary to select materials for the first and second electrodes in consideration of a work function. The first and second electrodes can be either an anode or a cathode depending on a pixel structure. In this embodiment mode, it is preferable to make the first electrode a cathode, and the second electrode an anode, since the polarity of a driver TFT is an n-channel type. In addition, when polarity of the driver TFT is a p-channel type, it is preferable to make the first electrode an anode, and the second electrode a cathode.

When the first electrode is an anode, the electroluminescent layer is preferably formed by sequentially laminating an HIL (a hole injecting layer), an HTL (a hole transporting layer), an EML (a light emitting layer), an ETL (an electron transporting layer), and an EIL (an electron injecting layer) over the anode. When the first electrode is a cathode, it is preferable to laminate these layers adversely, namely, the electroluminescent layer is formed by sequentially laminating an EIL (an electron injecting layer), an ETL (an electron transporting layer), an EML (a light emitting layer), an HTL (a hole transporting layer), an HIL (a hole injecting layer), and an anode, which is the second electrode, over the cathode. Additionally, the electroluminescent layer can be also formed with a single layer structure or a hybrid structure, in addition to the above laminated structure.

As the electroluminescent layer, materials each of which exhibits luminescence of red (R), green (G), and blue (B) are selectively formed by vapor deposition using an evaporation mask and the like, respectively. The materials (low molecular weight materials, high molecular weight materials, and the like) each exhibits luminescence of red (R), green (G), and blue (B) can be formed by the droplet discharging method as well as a color filter. In this case, it is preferable since RGB can be separately colored without using a mask.

In the case of the top emission and a second electrode is made from ITO or ITSO with the light transmitting properties, BzOS-Li in which benzoxazole derivative (BzOs) is doped with Li, or the like can be used. Also, for instance, as the EML, $Alq_3$ doped with a dopant corresponding to respective luminescent colors of R, G, and B (DCM etc. in the case of R, and DMQD etc. in the case of G) may be used.

Note that the electroluminescent layer is not limited to the above materials. For example, a hole injecting property can be enhanced by co-depositing oxide such as molybdenum oxide ($MoO_X$: X=2 to 3) with α-NPD or rubrene instead of using CuPc or PEDOT. In addition, an organic material (including a low molecular weight material or a high molecular weight material) or a composite material of an organic material and an inorganic material can be used as the material of the electroluminescent layer. Materials for forming a light emitting element will be described in more detail below.

With respect to substances with excellent electron transporting properties among charge injecting/transporting substances, metal complexes having quinoline skeleton or benzoquinoline skeleton such as tris(8-quinolinolate)aluminum (abbreviation: $Alq_3$); tris(5-methyl-8-quinolinolate)aluminum (abbreviation: $Almq_3$); bis(10-hydroxybenzo[h]quinolinato)beryllium (abbreviation: $BeBq_2$); bis(2-methyl-8-quinolinolate)-4-phenylphenolato-aluminum (abbreviation: BAlq); and the like can be given. As substances having superior hole transporting properties, for example, the followings can be cited: aromatic amine (i.e., one having a benzene ring-nitrogen bond) based compounds such as: 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), and 4,4',4"-tris[N-(3-methylphenyl)-N-phenyl-amino]-triphenylamine (abbreviation: MTDATA).

With respect to substances having extremely superior electron injecting properties among charge injecting/transporting substances, there are compounds of alkali metal or alkali earth metal such as lithium fluoride (LiF), cesium fluoride (CsF), and calcium fluoride ($CaF_2$). In addition, a mixture of a substance having high electron transportation properties such as $Alq_3$ and alkali earth metal such as magnesium (Mg) can be cited.

With respect to substances having extremely superior hole injecting properties among the charge injecting/transporting substances, for example, the followings can be cited: metal oxides such as molybdenum oxides (MoOx), vanadium oxides (VOx), ruthenium oxides (RuOx), tungsten oxides (WOx), and manganese oxides (MnOx). Besides, phthalocyanine based compounds such as phthalocyanine (abbreviation: $H_2Pc$), and copper phthalocyanine (CuPc) can be mentioned.

Light emitting layers having different wavelength bands may be formed by pixels so as to perform color display.

Typically, light emitting layers corresponding to respective luminescent colors of R (red), G (green), and B (blue) are formed. In this case, when a filter (a colored layer) that transmits lights of the wavelength bands is provided at a side of light emission of pixels, color purity can be improved and specular reflexion of a pixel portion can be prevented. By providing the filter (colored layer), a circular polarizing plat etc., which has been conventionally thought to be required, can be eliminated, thereby reducing loss of light emitted from the light emitting layers. Also, change in color tone, that is caused in the case where a pixel portion (a display screen) is seen obliquely, can be reduced.

There are various kinds of light emitting materials. With respect to low molecular weight organic light emitting materials, the followings can be used: 4-dicyanomethylene-2-methyl-6-(1,1,7,7-tetramethyl-julolidyl-9-enyl)-4H-pyran (abbreviation: DCJT); 4-dicyanomethylene-2-t-butyl-6-(1,1,7,7-tetramethyl-julolidyl-9-enyl)-4H-pyran (abbreviation: DPA); peri-flan-thene; 2,5-dicyano-1,4-bis(10-methoxy-1,1,7,7-tetramethyl-julolidyl-9-enyl)benzene, N,N'-dimethylquinacridone (abbreviation: DMQd); coumarin 6; coumarin 545T; tris(8-quinolinolate)aluminum (abbreviation: $Alq_3$); 9,9'-biantryl; 9,10-diphenylanthracene (abbreviation: DPA); 9,10-bis(2-naphthyl)anthracene (abbreviation: DNA); and the like. Also, other substances can be used.

On the other hand, the high molecular weight light emitting materials have higher physical strength and more durable elements as compared with the low molecular weight organic light emitting materials. In addition, since the high molecular weight materials can be formed by application, an element can be formed relatively easily. A structure of a light emitting element made from the high molecular weight organic light emitting material is basically similar to the case of using the low molecular weight organic light emitting material, and includes a cathode, an organic light emitting layer, and an anode. However, when a light emitting layer is made from the high molecular weight organic light emitting material, it is difficult to have the lamination structure like the case of using the low molecular weight organic light emitting material. In may case, such a light emitting element made from the high molecular weight organic light emitting material has a two layer structure, concretely, a structure of a cathode, a light emitting layer, a hole transporting layer, and an anode.

The luminescent color is determined by a material for forming a light emitting layer, and therefore, a light emitting element that emits a predetermined color of light can be formed by selecting the material. As high molecular weight electroluminescent materials that can be used to form a light emitting layer, polyparaphenylene vinylenes, polyparaphenylenes, polythiophenes, polyfluorenes, and the like can be mentioned.

Specifically, the followings can be cited as polyparaphenylene vinylenes: derivatives of poly(paraphenylenevinylene) (PPV); poly (2,5-dialkoxy-1,4-phenylenevinylene) (RO-PPV); poly[2-(2'-ethylhexoxy)-5-methoxy-1,4-phenylenevinylene] (MEH-PPV); poly[2-dialkoxyphenyl]-1,4-phenylenevinylene] (ROPh-PPV); and the like. With respect to the polyparaphenylenes, the followings can be cited: derivatives of polyparaphenylene (PPP); poly(2,5-dialkoxy-1,4-phenylene) (RO-PPP); poly(2,5-dihexoxy-1,4-phenylene); and the like. With respect to the polythiophenes, the followings can be mentioned: derivatives of polythiophene (PT); poly(3-alkylthiophene) (PAT); poly(3-hexylthiophene) (PHT); poly (3-cyclohexylthiophene) (PCHT); poly(3-cyclohexyl-4-methylthiophene) (PCHMT); poly(3,4-dicyclohexylthiophene) (PDCHT); poly[3-(4-octylphenyl)-thiophene] (POP); poly[3-(4-octylphenyl)-2,2-bithiophene] (PTOPT); and the like. With respect to the polyfluorenes, the followings can be cited: derivatives of polyfluorenes (PF); poly(9,9-dialkylfluorene) (PDAF); poly(9,9-dioctylfluorene) (PDOF); and the like.

When a high molecular weight organic light emitting material with hole transporting properties is sandwiched between an anode and a high molecular weight organic light emitting material with light emitting properties, the hole injecting properties from the anode can be improved. Typically, a solution in which a high molecular weight organic light emitting material with hole transporting properties is dissolved in water along with an acceptor material is applied by spin coating etc. Since an organic solvent is insoluble, it can be laminated along with the above-mentioned organic light emitting material with the light emitting properties. As the high molecular weight organic light emitting material with the hole transporting properties, a mixture of PEDOT and camphor sulfonic acid (CSA) as a acceptor material; a mixture of polyaniline (PANI) and polystyrenesulfonic acid (PSS) as a acceptor material; and the like can be cited.

A light emitting layer can emit monochromatic light or white light. In the case of using a light emitting material for white color, a color display can be achieved by providing a color filter (or a colored layer) that transmits light of a certain wavelength toward light emission of a pixel.

In order to form a light emitting layer that emits white light, for example, white light emission can be achieved by sequentially laminating $Alq_3$, $Alq_3$ partially doped with Nile reds which is a red light emitting pigment, $Alq_3$, p-EtTAZ, and TPD (aromatic diamine) by using vapor deposition. Or, when an EL is formed by application using spic coating, the EL is preferably baked by vacuum heating after application. For example, an aqueous solution of poly(ethylene dioxythiophene)/poly(styrenesulfonic acid) (PEDOT/PSS), which functions as a hole injecting layer, may be applied over the entire surface of the substrate and baked. Subsequently, a solution of polyvinyl carbazole (PVK) doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red, and coumarin 6), which serves as a light-emitting layer, may then be applied over the entire surface and baked.

A light emitting layer may be formed to have a single layer. In this case, 1,3,4-oxadiazole derivative (PBD), which has electron transporting properties, may be dispersed in polyvinyl carbazole (PVK), which has hole transporting properties. In addition, white light emission can also be obtained by dispersing 30 wt % of PBD as an electron transporting agent and dispersing a suitable amount of four kinds of pigments (TPB, coumarin 6, DCM1, and Nile red). In addition to the above-mentioned light emitting element that emit white light, a light emitting element that emit red light, green light, or blue light can be manufactured by properly selecting materials for the light emitting layer.

Further, triplet excited luminescent materials including metal complexes and the like may be used for the light emitting layer instead of the above-mentioned singlet excited luminescent materials. For example, pixels emitting red light in which luminance half-life is relatively short are formed by a triplet excited luminescent material, and pixels emitting green and blue lights are formed of singlet excited luminescent materials. Since the triplet excited luminescent material has excellent light emitting efficiency, it has a feature of requiring low power consumption in order to obtain a same level of luminance as compared with the singlet excited luminescent material. That is, when the pixels for emitting red light are formed by a triplet excited luminescent material, a small amount of current flowing through the light emitting element is required, thereby improving the reliability. To reduce power consumption, pixels emitting red and green lights may be formed of the triplet excited luminescent materials, while pixels emitting blue light may be formed of a singlet excited luminescent material. In the case where light emitting elements that emit green lights, which has high visibility with respect to human eyes, are also formed of a triplet excited luminescent material, power consumption can be further reduced.

As an example of the triplet excited luminescent material, there is a triplet excited luminescent material that uses a metal complex as a dopant. In particular, a metal complex with platinum, which is a third transition element, as its central metal, a metal complex with iridium as its central metal, and the like are known. The triplet excited luminescent materials are not limited to these compounds, and it is possible to use a compound having a above mentioned structure and including an element that belongs to groups 8 to 10 of the periodic table as its central metal.

Above mentioned substances for forming the light emitting layer are examples, and the light emitting layer can be formed by properly laminating respective layers with various properties such as a hole injecting/transporting layer, hole transporting layer, an electron injecting/transporting layer, an electron transporting layer, a light emitting layer, an electron blocking layer, and a hole blocking layer. In addition, a mixed layer or mixed junction of these layers may be used. The structure of the light emitting layer can be varied, and the light emitting layer can be formed in various forms. The transformation of the light emitting layer may be allowable without deviating the purpose of the invention; for example, an electrode is provided or a light emitting material is dispersed so as to functions as an electron injecting layer or a light emitting layer, instead of providing the certain electron injecting layer or light emitting layer.

When a light emitting element formed of the above-mentioned materials is applied with a forward bias voltage, it can emit light. Each pixel of a display device formed using the light emitting element can be driven by either a simple matrix method or an active matrix method as shown in Embodiment Mode 2. In either case, each pixel emits light by being applied with a forward bias voltage at a certain timing, while each pixel does not emit light in a certain period. In the non-lighting period, a reverse bias voltage is applied to the light emitting element so that the reliability of the light emitting element can be improved. The light emitting element has deteriorations of reducing light intensity under a certain drive condition or reducing luminance apparently due to expansion of a non-lighting region within each pixel. When the light emitting element is driven by AC drive such that each pixel is applied with a forward bias voltage and a reverse bias voltage, the deteriorations of the light emitting element can be hindered, thereby increasing the reliability of the light emitting device.

Figure 19A:
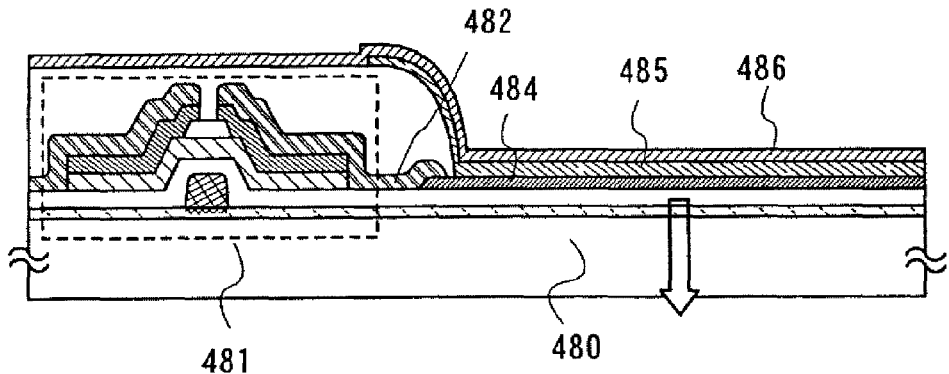
FIGS. 19A to 19C are cross sectional views of a display device according to the invention.
Figure 19B:
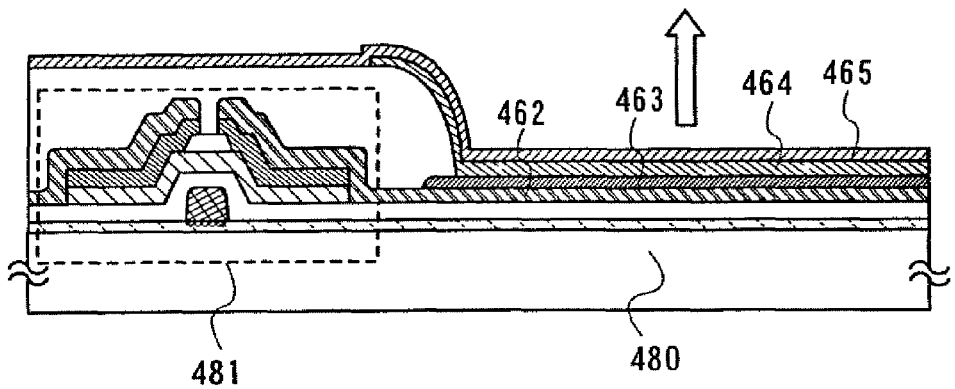
Figure 19C:
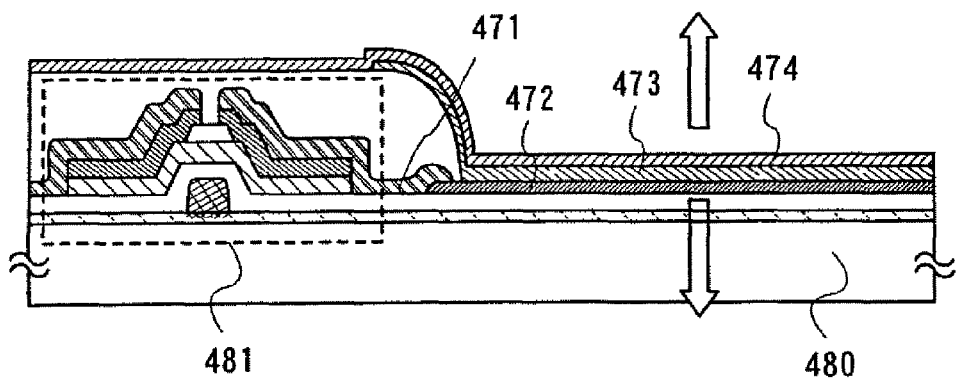

In addition, a filter (a colored layer) may be formed over a counter substrate of the substrate 480, although not shown in FIGS. 19A to 19C. The filter (colored layer) can be formed by the droplet discharging method; in that case, laser irradiation treatment and the like can be performed as the above-mentioned base pretreatment. The filter (colored layer) can be formed in a predetermined pattern with favorable adhesion due to the base film of the invention. High-definition display can be performed by using the filter (colored layer). This is because the filter (colored layer) can adjust a broad peak to sharp one in each emission spectrum of RGB.

The case of forming materials showing each light emission of RGB is described hereinabove; however, full color display can also be performed by forming a material showing light emission of monochromatic color and combining the material with a color filter or a color conversion layer. For example, the filter (colored layer) or the color conversion layer may be formed over a second substrate (a sealing substrate) as shown in Embodiment Mode 2, and then, be attached to the substrate. As described above, the material showing light emission of monochromatic color, the filter (colored layer), and the color conversion layer can all be formed by the droplet discharging method.

Of course, display of monochromatic light emission may be performed. For example, an area color type light emitting display device may be formed by using monochromatic light emission. A passive matrix display portion is suitable for the area color type and can display mainly characters and symbols.

A material having a low work function can be used for the cathode in the above-mentioned structure; for example, Ca, Al, CaF, MgAg, AlLi, and the like are preferable. The electroluminescent layer may be any of a single layer type, a lamination layer type, and a mixed type having no interface between layers. The electroluminescent layer may also be formed of a singlet material, a triplet material, a combined material thereof; and include one or more layers selected from a low molecular weight organic compound, an intermediate molecular weight organic compound (which has no sublimation ability and a number of molecules of 20 or less or a molecular chain length of 10 μm or less), a high molecular weight organic compound. In addition, the electroluminescent layer may be combined with an inorganic compound having the electron injecting/transporting properties or the hole injecting/transporting properties. The first electrodes 484, 463, and 472 are formed by using a transparent conductive film which transmits light; for example, a transparent conductive film in which indium oxide is mixed with 2 to 20% zinc oxide (ZnO) as well as ITO or ITSO is used. Note that plasma treatment in an oxygen atmosphere or heat treatment in a vacuum atmosphere is preferably performed before forming the first electrodes 484, 463, and 472. A partition wall (also referred to as a bank) is formed by using a material containing silicon, an organic material, or a compound material. In addition, a porous film may be used. Note that, it is preferable to form the partition wall by using a photosensitive or nonphotosensitive material such as acrylic or polyimide, since a side face thereof becomes a shape in which a radius of curvature continuously changes and an upper-layer thin film is formed without being disconnected. This embodiment mode can be freely combined with the above embodiment modes.

Embodiment Mode 6

Another embodiment mode of the invention will be described with reference to FIGS. 35A and 35B, FIGS. 36A and 3613, FIGS. 37A and 37B, FIGS. 38A and 38B, FIGS. 39A and 39B, FIGS. 40A and 40B, and FIG. 45. Concretely, a method of manufacturing a display device (a liquid crystal display device) according to the invention will be described.

Firstly, a method of manufacturing a display device (a liquid crystal display device) having a channel-etched type thin film transistor according to the invention will be described. FIGS. 35A, 36A, 37A, 38A, 39A, and 40A are top views showing pixel portions of display devices, respectively. FIGS. 35B, 36B, 37B, 38B, 39B, and 40B are cross sectional views taken along lines G-H of the respective top views.

A base film 5101 is formed on a substrate 5100 as a base pretreatment. As the substrate 5100, a glass substrate such as a barium borosilicate glass and an alumino borosilicate glass, a quartz substrate, a silicon substrate, a metal substrate, a stainless substrate, a heat-resistant plastic substrate that can withstand a processing temperature of manufacturing steps, and the like can be used. The surface of the substrate 5100 may be polished by the CMP method etc. so as to planarize the surface thereof. An insulating layer may be formed on the substrate 5100. The insulating layer is made from an oxide or nitride material containing silicon, etc. by a known method such as CVD, plasma CVD, sputtering, and spin coating so as to have a single layer or a lamination layer. The insulating layer may not necessarily be formed. When the insulating layer is formed, however, it can prevent contaminants from penetrating through the substrate 5100. In the case of forming the insulating layer for inhibiting ingress of the contaminations through the substrate, a base film 5101 is formed thereon as a base pretreatment for a gate electrode layer 5103, which will be formed by the droplet discharging method.

Figure 35A:
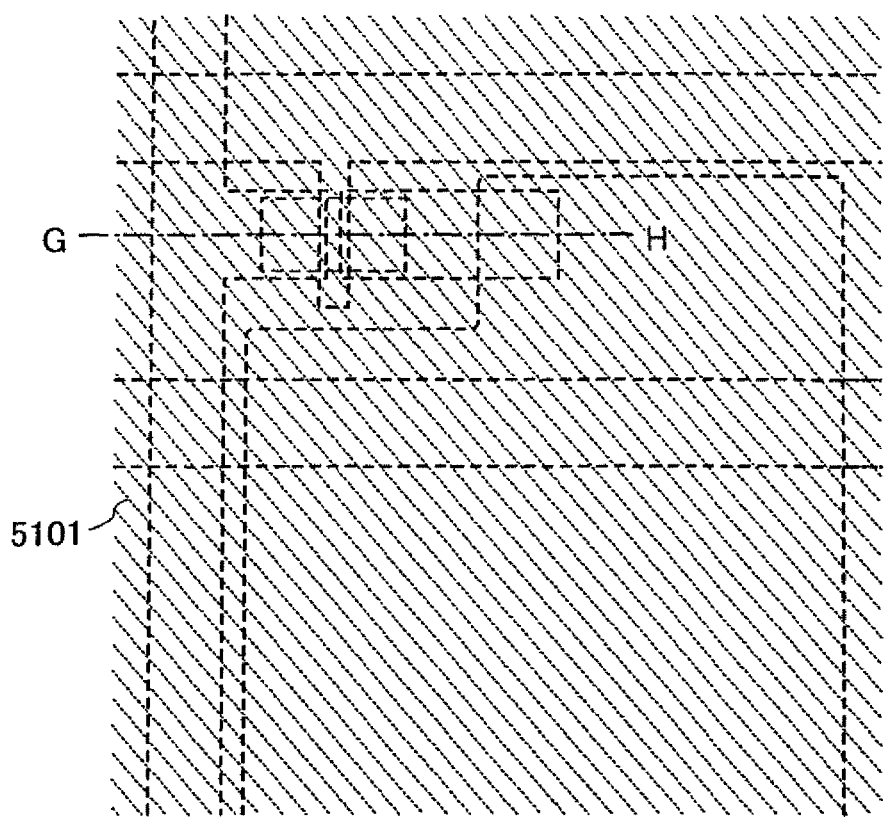
FIGS. 35A and 35B are diagrams explaining a method of manufacturing a display device according to the invention.
Figure 35B:
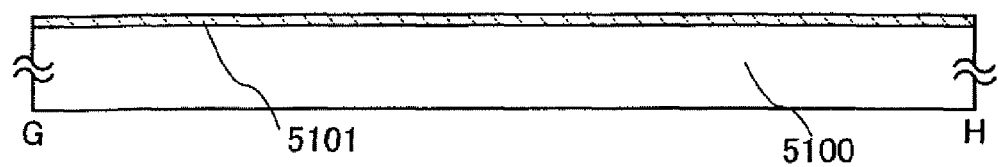

In the present embodiment mode, a lyophobic substance is formed as the base film 5101 (see FIGS. 35A and 35B). The base film 5101 is, herein, formed on the entire surface of the substrate 5100 by spin coating. Alternatively, the base film may selectively be formed in the vicinity of a subject region on which a pattern will be formed by the droplet discharging method.

Figure 36A:
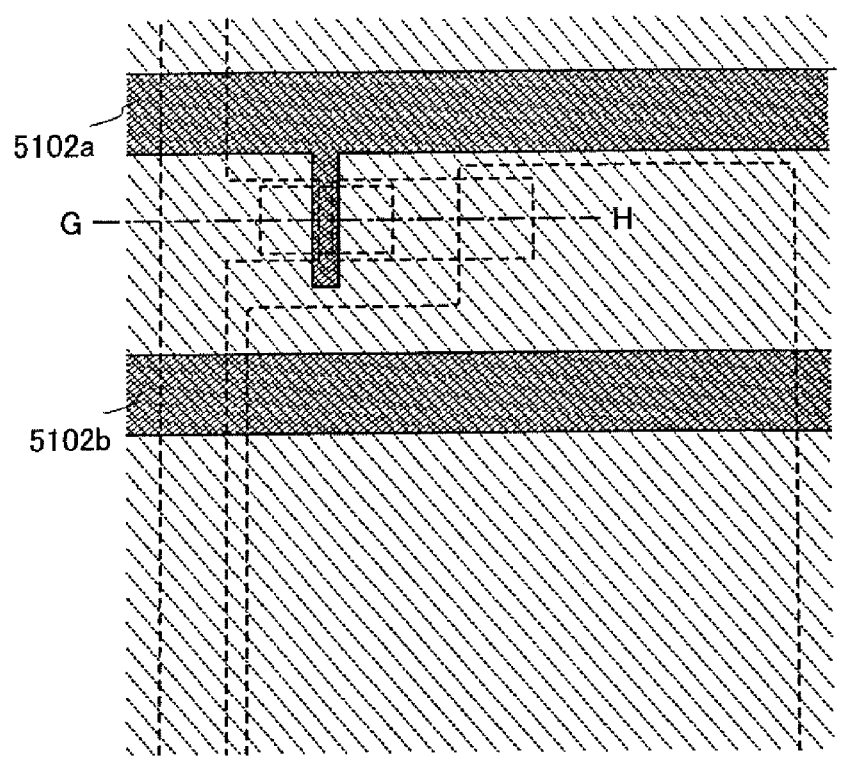
FIGS. 36A and 36B are diagrams explaining a method of manufacturing a display device according to the invention.
Figure 36B:
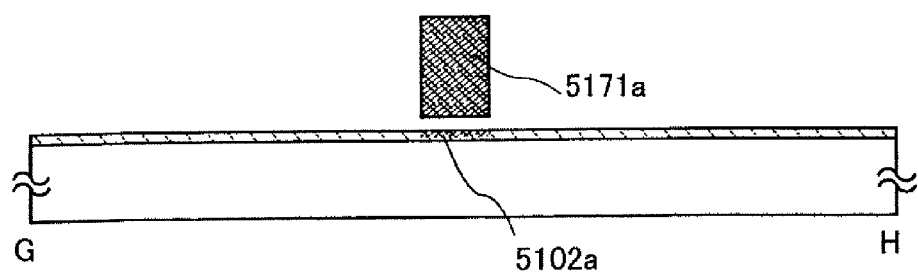

Laser beam 5171a is irradiated to a subject region on which a gate electrode layer is formed by a laser irradiation device to change properties of the base film selectively (see FIGS. 36A and 36B). By performing the treatment for changing the properties, base films 5102a and 5102b becomes to have more lyophilic properties with respect to a composition containing a conductive material, which is used for forming a gate electrode layer that will be formed on the base films later. Accordingly, the lyophobic (lyophilic) properties with respect to the composition containing the conductive material is varied between the base films 5102a and 5102b and the other base films around the base films 5102a and 5102b.

Figure 37A:
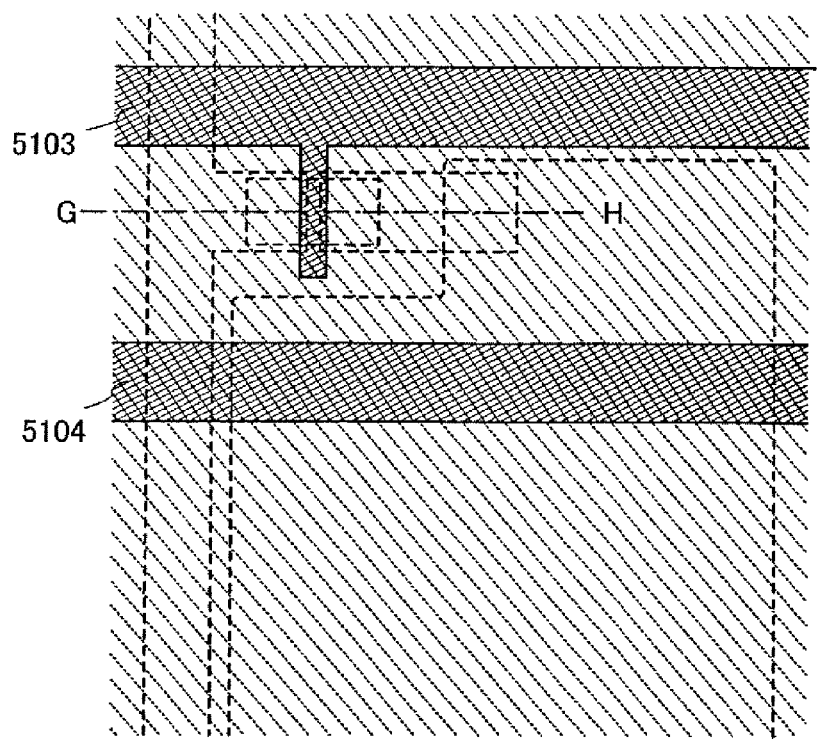
FIGS. 37A and 37B are diagrams explaining a method of manufacturing a display device according to the invention.
Figure 37B:
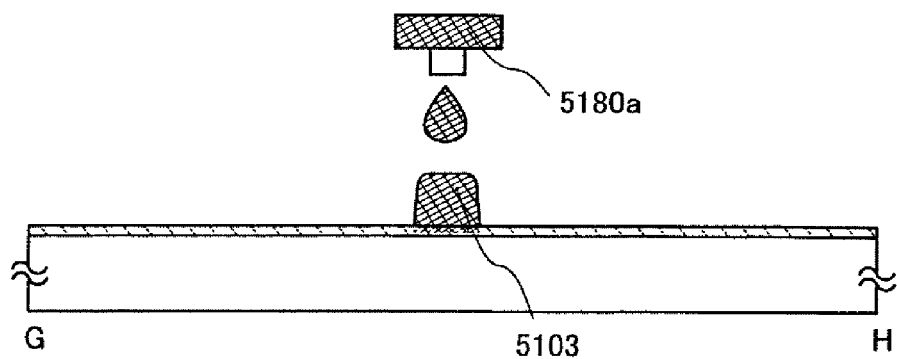

Droplets of the composition containing the conductive material is discharged on the base films 5102a and 5102b, in which the properties are changed due to irradiation of laser beam, by the droplet discharging device 5180a so as to form a gate electrode layer 5103 and a capacitor wiring layer 5104 (see FIGS. 37A and 37B). The discharged droplets are attached to the base films 5102a and 5102b having more higher lyophilic properties (i.e., more lower lyophobic properties) as compared with the base film around the base films 5102a and 5102b, where is not irradiated with laser beam. When the diameter of the discharge ports for the nozzles through which the droplets are discharged is larger than the size of the predetermined patterns to be formed, since the pretreatment for increasing the lyophilic properties (or reducing the lyophobic properties) is carried out in the subject regions on which the patterns will be formed, the droplets for forming the patterns are only adhered to the subject regions so that fine linear conductive layers can be formed. Namely, a difference in the degree of the lyophobic (lyophilic) properties is caused between the subject regions and the region around the subject regions so that the droplets are shed in the region around the subject regions and remain in the subject regions with the higher lyophilic properties.

According to the invention, when a microscopic pattern like the gate electrode layers 5103 is formed, a droplet is not spread around the subject region to be formed with the pattern, and a microscopic linear pattern can be formed, even if the discharge port of the droplet discharging device is comparatively large. By controlling the amount of droplets, the thickness of the conductive layers can be adjusted. When the properties of the base film are changed by being irradiated with laser beam, a microscopic wiring, electrode, and the like can be formed with good controllability since laser beam allows microscopic processing. As compared with the case where a conductive layer is formed over the entire surface of the substrate by spin coating, since the conductive layers can selectively be formed by the droplet discharging method according to the invention, loss of materials can be prevented, thereby reducing manufacturing cost.

In the embodiment mode, the base film 5101 that is formed as the base pretreatment is formed by dip coating of the sol-gel technique, spin coating, droplet discharging, ion plating, ion beam, CVD, sputtering, RF magnetron sputtering, plasma spray coating, plasma spraying, or anodizing. The base film may not be formed continuously as a film depending on the method of manufacturing the base film. When the base film 5101 is formed by application such as dip coating and spin coating, the material for the base film may be baked and dried, if a solvent is necessary to be removed.

The base film 5101 may be formed of a metal material such as Ti (titanium); W (tungsten); Cr (chromium); Ta (tantalum); Ni (nickel); and Mo (molybdenum), or an oxide thereof by sputtering, vapor deposition, etc.

The base film 5101 may be formed with a thickness of 0.01 to 10 nm. Since the base film is preferably formed as thin as possible, it may no have a lamination structure. When the base film is made from a metal material or a 3d transition element and has the conductivity, the base film around the subject regions is preferably treated according to the following two methods.

As the first method, the part of the base film 5101 where is not overlapping with the gate electrodes layer 5103 (i.e., a region exhibiting higher lyophobic properties as compared with the peripheral region) is insulated to form an insulating layer. That is, the base film 5101 where is not overlapping with the gate electrode layer 5103 is oxidized to be insulated. When the base film 5101 is partly oxidized to be insulated in this way, the base film is preferably formed with a thickness of 0.01 to 10 nm such that the base film can be partly oxidized easily. As the method for oxidizing the part of the base film, either a method of exposing the base film to an oxygen atmosphere or a method of performing heat treatment may be employed.

As the second method, the base film 5101 is selectively formed in the subject region to be formed with the gate electrode layer 5103 (i.e., regions discharged with the composition containing the conductive material). The base film 5101 may be selectively formed over the substrate by discharging the composition with the droplet discharging method. Or, the composition is discharged over the entire surface of the substrate, and then the base film 5101 is selectively etched to be removed by utilizing the gate electrode layer 5103 as a mask. In such a method, the thickness of the base film 5101 is not particularly limited.

Further, there is other method in which an organic material that can function as an adhesive agent may be formed so as to increase the adherence of the patterns that are formed by the droplet discharging method with respect to the subject regions to be formed with the pattern. It is possible to use an organic material (or, an organic resin material) (e.g., polyimide, and acrylic) or a material with skeleton formed by the bond of silicon (Si) and oxygen (O), which includes at least hydrogen as a substituent or at least one of fluoride, alkyl group, and aromatic hydrocarbon as the substituent.

The gate electrode layer 103 and the capacitor wiring layer 104 are formed by the droplet discharging method.

Although the base film 5101 is formed as the base pretreatment prior to forming the conductive layers that are formed by the droplet discharging method, the treatment step for forming the base film may also be carried out after forming the gate electrode layer 5103 and capacitor wiring layer 5104.

After forming the gate electrode layer 5103 and capacitor wiring layer 5104 by discharging the composition with the droplet discharging method, the surface of the substrate 5100 may be planarized by pressing it with pressure to enhance its planarity. As a pressing method, depressions and projections may be leveled by scanning a roller-shaped object on the surface, or the surface may be perpendicularly pressed with a flat plate-shaped object. Heat treatment may be performed at the time of pressing. Alternatively, projections of the surface may be removed with an air knife by softening or melting the surface with a solvent and the like. A CMP method may also be used to polish the surface. These planarizing steps may be performed for planarizing a surface of a substrate when projections are formed by the droplet discharge method.

According to the invention, a wiring with a width of 5 μm or less can be formed as a gate electrode layer 5103.

Figure 38A:
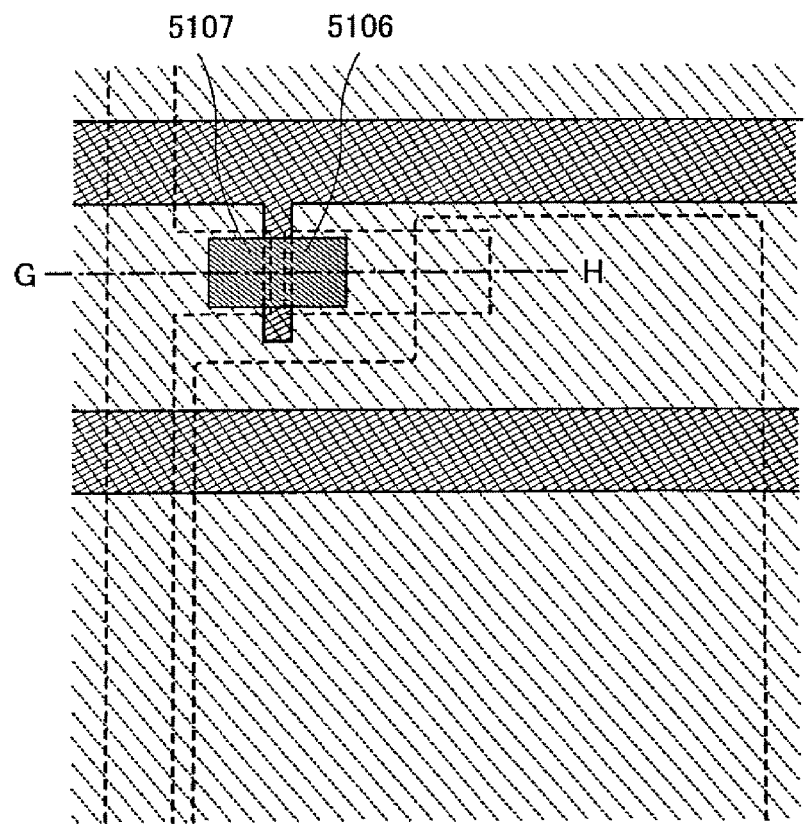
FIGS. 38A and 38B are diagrams explaining a method of manufacturing a display device according to the invention.
Figure 38B:
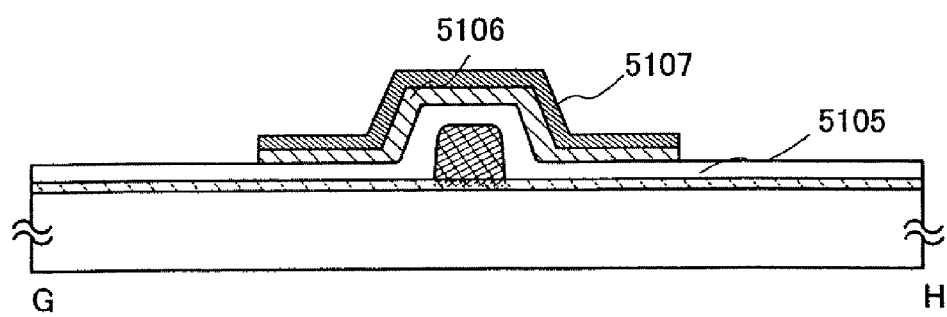
Figure 39A:
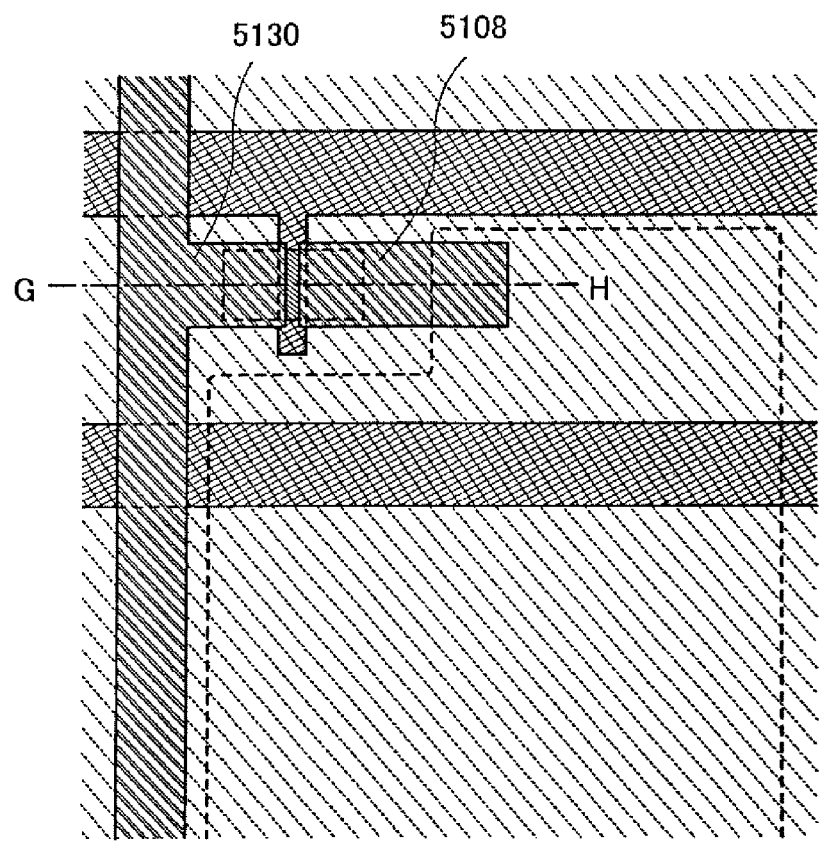
FIGS. 39A and 39B are diagrams explaining a method of manufacturing a display device according to the invention.
Figure 39B:
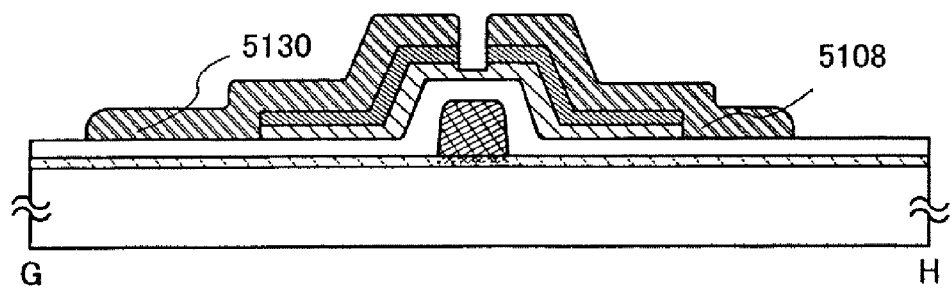

Next, a gate insulating layer 5105 is formed on the gate electrode layer 5103 and the capacitor wiring layer 5104 (see FIGS. 38A and 38B). The gate insulating layer 5105 may be formed by a known material such as a silicon oxide material and a silicon nitride material, and have a single layer or lamination layer. In the embodiment mode, the gate insulating layer 5105 is formed by laminating a silicon nitride film, a silicon oxide film, and another silicon nitride film. Also, a single layer of a silicon oxynitride film, a lamination layer including two layers may be employed, as well as the above-mentioned three layer structure. Preferably, a dense silicon nitride film is used for the gate insulating layer. When the gate electrode layer and the capacitor wiring layer are made from silver, copper, and the like by the droplet discharging method, a silicon nitride film, an NiB film, or the like is formed thereon as a barrier film for the conductive layers, thereby preventing dispersion of impurities and planarizing the surface of the substrate. In order to form a dense insulating film with few gate leakage current at a low temperature, a reactive gas containing a rare gas element such as argon is preferably mixed in the insulating film.

Semiconductor layers are next formed. A semiconductor layer having one conductivity type may be formed, if necessary. In this embodiment mode, an N-type semiconductor layer 5107 is formed as the semiconductor layer having one conductivity type together with a semiconductor layer 5106 (see FIGS. 38A and 38B). Additionally, an NMOS structure of an N-channel type TFT by forming an N-type semiconductor layer, a PMOS structure of a P-channel type TFT with a P-type semiconductor layer, and a CMOS structure with a combination of an N-channel type TFT n and a p-channel TFT can be manufactured. In order to impart one conductivity, an element which imparts one conductivity is doped to form an impurity region in a semiconductor layer so as to form an N-channel type TFT or a P-channel type TFT.

In the embodiment mode, an amorphous semiconductor is used as the semiconductor layers. The semiconductor layer is formed and then, the N-type semiconductor layer is formed by plasma CVD and the like as the semiconductor layer having one conductivity type.

Subsequently, the semiconductor layer and the N-type semiconductor layer are simultaneously patterned by using a mask made from an insulating material such as a resist and polyimide so as to from the semiconductor layer 5106 and the N-type semiconductor layer 5107 (see FIGS. 38A and 38B). The mask can be formed by selectively discharging a composition. As the mask, a resin material such as an epoxy resin, an acrylic resin, a phenol resin, a novolac resin, a melamine resin, and a urethane resin is used. The mask is also made from an organic material such as benzocyclobutene, parylene, flare, and polyimide having light transmitting properties; a compound material formed by polymerization of siloxane system polymer; a composition material containing a water-soluble homopolymer and a water-soluble copolymer; etc, by using the droplet discharging method. In addition, a commercially available resist material including a photosensitive agent may be also used. For example, it is possible to use a novolac resin that is a typical positive resist, a naphthoquinonediazide compound that is a photosensitive agent, a base resin that is a negative resist, diphenylsilanediol, an acid forming material, and the like. The surface tension and viscosity of any materials is appropriately adjusted by adjusting the solvent concentration or adding a surface-active agent.

In the embodiment mode, the properties of a base film are partly changed by being irradiated with laser beam as the pretreatment so that the gate electrode layer 5103 and the capacitor wiring layer 5104 can be selectively formed by the droplet discharging method. Specifically, subject regions to be formed with the patterns are irradiated with laser beam to change the properties of the subject regions prior to forming the patterns by the droplet discharging method. Since the properties of the base film are changed only in the subject regions, difference in lyophobic (lyophilic) properties between the subject regions and the other region in the periphery thereof is caused. Therefore, when the patterns are formed by the droplet discharging method, droplets remain only in the subject regions to be formed with the patterns (with the higher lyophilic properties), thereby forming the patterns with good controllability. In the case of using a liquid material, the step of partly changing properties of a base film is applicable to any types of pretreatments without using a mask, thereby reducing the number of processing steps.

Source or drain electrode layers 5130 and 5108 are formed by discharging a composition containing a conductive material. While utilizing the source or drain electrode layers 5130 and 5108 as masks, the semiconductor layer 5106 and the N-type semiconductor layer 5107 are patterned to expose the semiconductor layer 5106 (see FIGS. 39A and 39B). The source or drain electrode layers 5130 and 5108 can be formed in the same manner as the above-mentioned gate electrode layer 5103. The source or drain electrode layer 5130 also functions as a wiring layer.

As the conductive material to form the source or drain electrode layers 5130 and 5108, a composition which mainly contains a particle of metal such as Ag (silver), Au (gold), Cu (copper), W (tungsten), and Al (aluminum) can be used. In addition, light transmitting indium tin oxide (ITO), ITSO including indium tin oxide and silicon oxide, organic indium, organic tin, zinc oxide, titanium nitride, and the like may be combined to form the source or drain electrode layers.

The above-mentioned step of forming a base film is performed as a base pretreatment for the conductive layers, which are formed by using the droplet discharging method, and the treatment step may also be performed after forming the conductive layers. According to the step, the adhesion between the layers is increased, thereby enhancing the reliability of the display device.

Figure 40A:
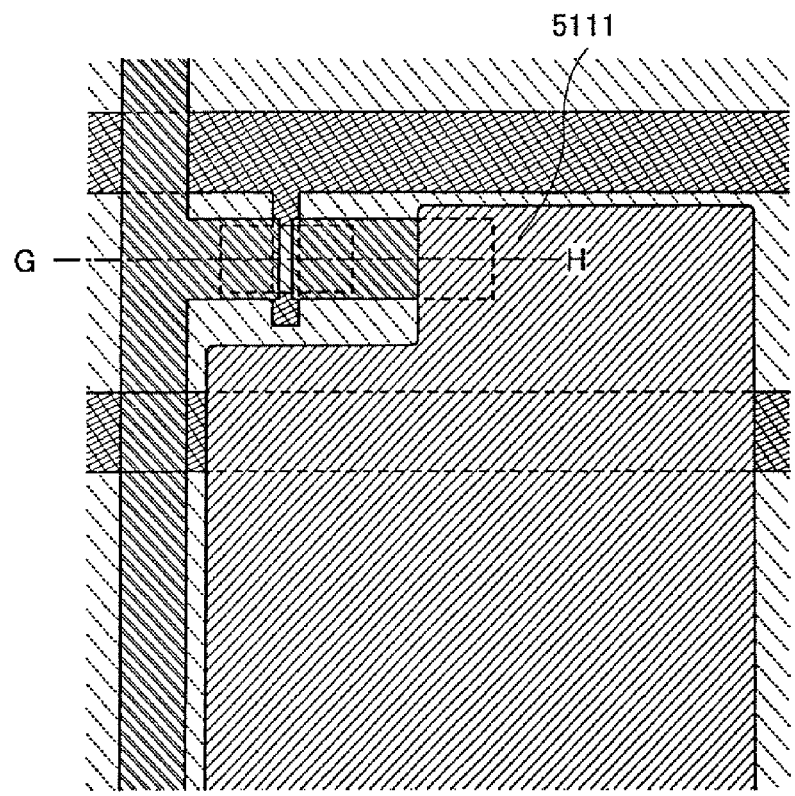
FIGS. 40A and 40B are diagrams explaining a method of manufacturing a display device according to the invention.
Figure 40B:
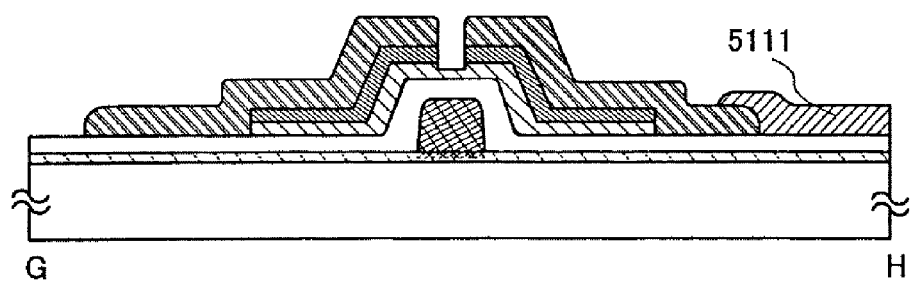

Subsequently, a composition including a conductive material is selectively discharged over the gate insulating layer 5105 to form a pixel electrode layer 5111 such that the pixel electrode layer is in contact with the source or drain electrode layer 5108 (see FIGS. 40A and 40B). When a transmissive liquid crystal display panel is manufactured, the pixel electrode layer 5111 may be formed as follows: a predetermined pattern is made from a composition which contains indium tin oxide (ITO), indium tin oxide containing silicon oxide (ITSO), zinc oxide (ZnO), tin oxide ($SnO_2$), and the like and then baked.

The pixel electrode layer 5111 can selectively be formed over the gate insulating layer 5105 prior to forming the source or drain electrode layer 5108. In this case, the connection structure in which the source or drain electrode layer 5108 is laminated on the pixel electrode layer 5111 is obtained. When the pixel electrode layer 5111 is formed prior to forming the source or drain electrode layer 5108, it can be formed on a flat surface, thereby exhibiting excellent coverage with a preferable film forming property. Since the pixel electrode layer 5111 can be subjected to polishing treatment such as CMP, it can be formed smoothly.

Figure 49A:
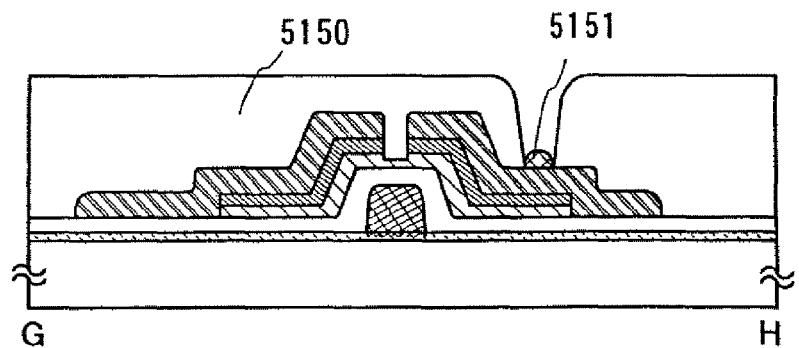
FIGS. 49A to 49C are diagrams explaining a method of manufacturing a display device according to the invention.

As shown in FIG. 49A, an insulating layer 5150 that will be an interlayer insulating film may be formed over the source or drain electrode layer 5108 such that the source or drain electrode layer 5108 is electrically connected to the pixel electrode layer 5111 via a wiring layer 5152. In this case, a substance 5151 which is lyophobic with respect to the insulating layer 5150 (i.e., with a high lyophobic property) is formed on the source or drain electrode layer 5108, instead of forming an opening (a contact hole) by partly removing the insulating layer 5150. A composition for the insulating layer 5150 is then applied over the substrate by application to form the insulating layer 5150 on a region except for a region on which the substance 5151 with the lyophobic property is formed (FIG. 49A).

After the insulating layer 5150 is cured by heating, drying, etc., the substance 5151 with the lyophobic property is removed to form an opening. A wiring layer 5152 is next formed so as to fill the opening. The pixel electrode layer 5111 is then formed contacting to the wiring layer 5152 (see FIG. 49B). In this method, since the opening is not necessary to be formed by etching, there is an advantage that the step is simplified.

Figure 49B:
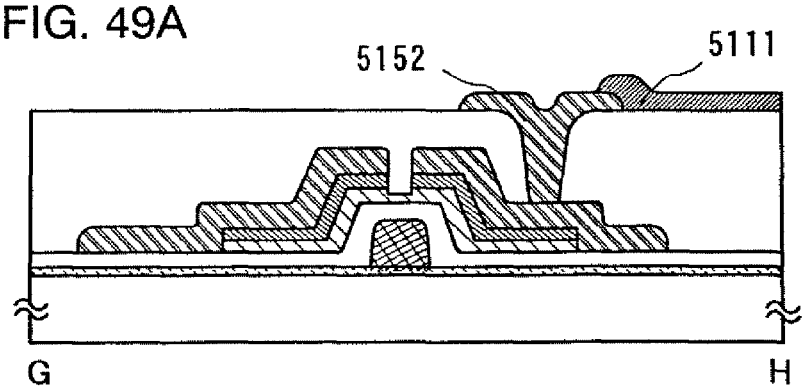
Figure 49C:
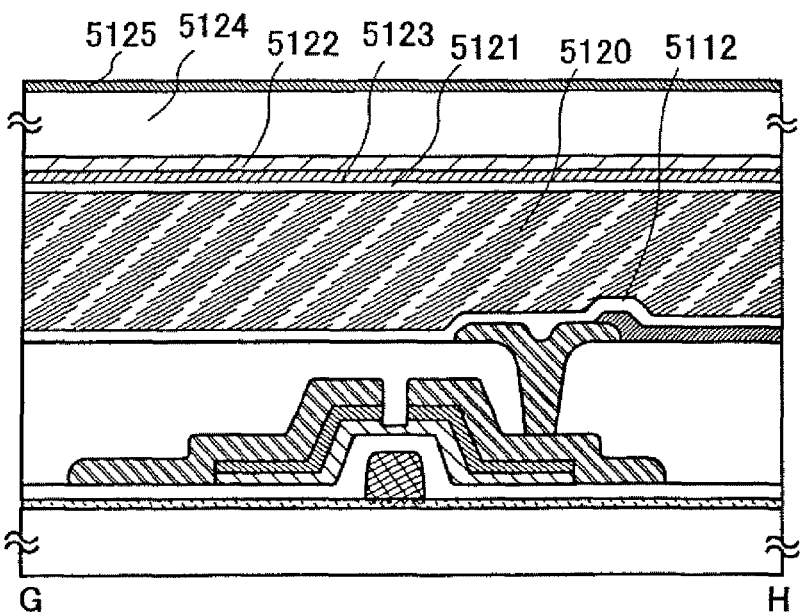

In the case where the interlayer insulating film is formed over the source or drain electrode layer as shown in FIG. 49A to 49C, other method for forming the opening can be utilized as follows. In this case, the insulating layer 5150 is formed of a photosensitive insulating material. After forming the photosensitive insulating material as the interlayer insulating film, laser beam is irradiated to a portion on which the opening will be formed so that the insulating material in the portion is partly photoactivated. The photoactivated insulating material is removed by etching etc. to form an opening (a contact hole) that reaches the source or drain electrode layer. A conductive layer is formed in the opening so as to be in contact with the source or drain electrode layer. A first electrode layer is thus formed so as to be in contact with the conductive layer. Since properties of a film are partly changed by being irradiated with laser beam, microscopic processing can be realized.

Preferably, the pixel electrode layer 5111 is formed of indium tin oxide (ITO), indium tin oxide containing silicon oxide (ITSO), zinc oxide (ZnO), and the like by sputtering. More preferably, indium tin oxide containing silicon oxide is used by sputtering by using a target in which 2 to 10 weight percent of silicon oxide is contained in ITO. In addition to this, an oxide conductive material containing silicon oxide in which 2 to 20% of zinc oxide (ZnO) is further mixed in indium oxide may be used. After forming the pixel electrode layer 5111 by sputtering, a mask layer is formed thereover by the droplet discharging method. Thus, the pixel electrode layer 5111 may be etched to have a desired pattern while utilizing the mask layer. In this embodiment mode, the pixel electrode layer 5111 is formed of a conductive material having light-transmitting properties by the droplet discharging method, and specifically, it is formed by using indium tin oxide and ITSO including ITO and silicon oxide.

When fabricating a reflective type liquid crystal display panel, a composition which mainly contains particles of metal such as Ag (silver), Au (gold), Cu (copper), W (tungsten), and Al (aluminum) can be used for the pixel electrode layer 5111. Also, the pixel electrode layer 5111 may be formed as follows: a transparent conductive film or a conductive film having light reflectivity is formed by sputtering, a mask pattern is formed by the droplet discharge method, and the conductive film is etched while utilizing the mask pattern.

The pixel electrode layer 5111 may be cleaned and polished by the CMP method or by using polyvinyl alcohol-based porous body so that the surface of the pixel electrode layer 5111 is leveled. In addition, after polishing with the CMP method, ultraviolet irradiation or oxygen plasma treatment may be performed on the surface of pixel electrode layer 5111.

According to the above-mentioned steps, the substrate 5100 having a TFT of a bottom gate type (also referred to as "a reverse stagger type") and a TFT for a display panel to which a pixel electrode is connected, is completed. The TFT in this embodiment mode is a channel etched type.

Figure 45:
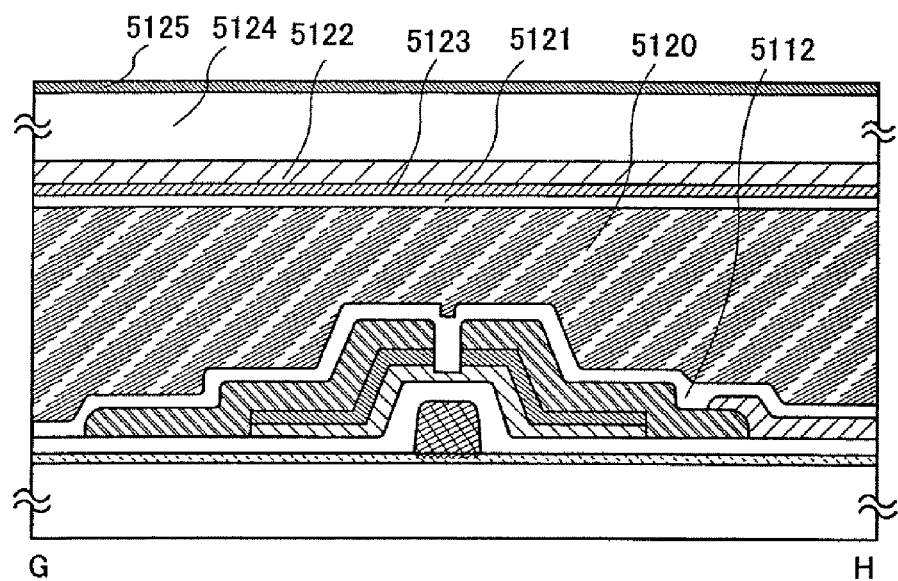
FIG. 45 is a cross sectional view of a display device according to the invention.
Figure 46:
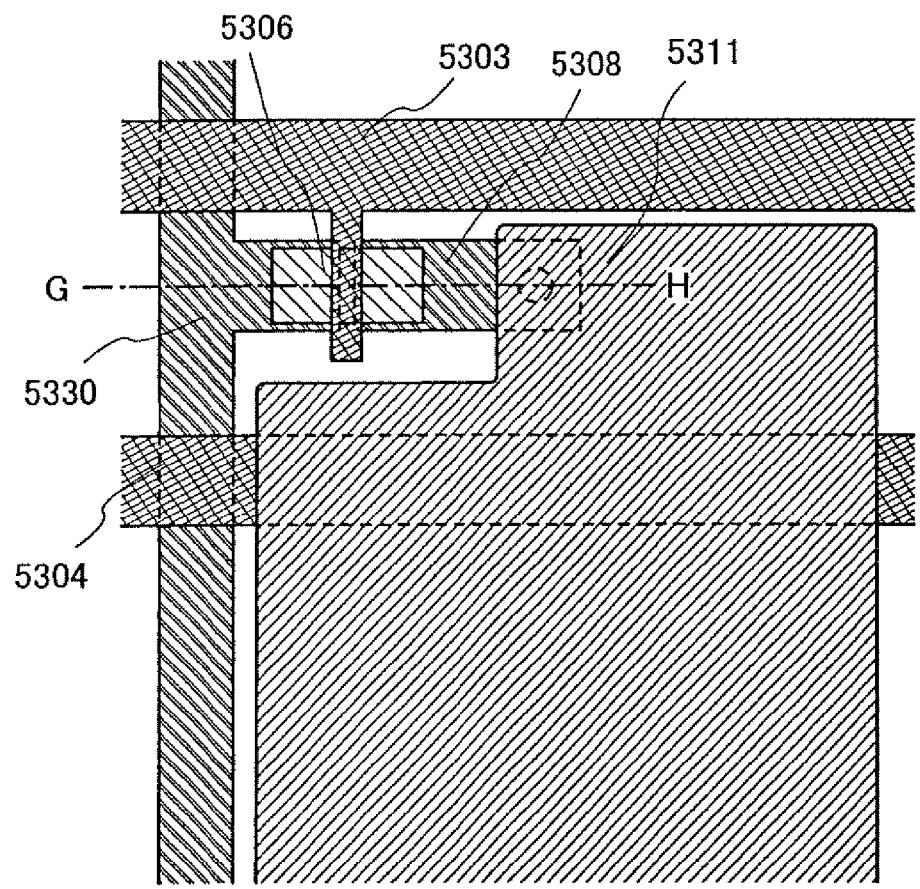
FIG. 46 is a diagram explaining a method of manufacturing a display device according to the invention.

As shown in FIG. 45, an insulating layer 5112, which is also referred to as an orientation film, is next formed by printing, spin coating, etc. so as to cover the pixel electrode layer 5111. FIG. 45 is a cross sectional view taken along each line G-H of the respective top views as shown in FIGS. 35A, 36A, 37A, 38A, 39A, and 40A, and shows a completion diagram of the display panel. When using screen printing or offset printing, the insulating layer 5112 can be formed selectively. The insulating layer 5112 is subjected to rubbing process. A sealing material is formed over a region around pixels that are formed by the droplet discharging method (not shown in the drawing).

Subsequently, the substrate 5100 with the TFT is attached to a counter substrate 5124 over which an insulating layer 5121 that serves as an orientation film, a colored layer 5122 that serves as a color filter, a conductive layer 5123 that serves as a counter electrode, and a polarizing plate 5125 are formed while sandwiching a spacer therebetween. A liquid crystal layer 5120 is provided in the space between the substrate 5100 and the counter substrate 5124 so that a display panel (a liquid crystal display panel) can be completed (see FIG. 45). The sealing material may contain a filler. In addition, a light shielding film (a black matrix) may be formed over the counter substrate 5124. The liquid crystal layer can be formed by using a dispenser (a dropping method), a dipping method in which a liquid crystal is injected between the attached substrates by utilizing capillary phenomenon, and the like.

Figure 50:
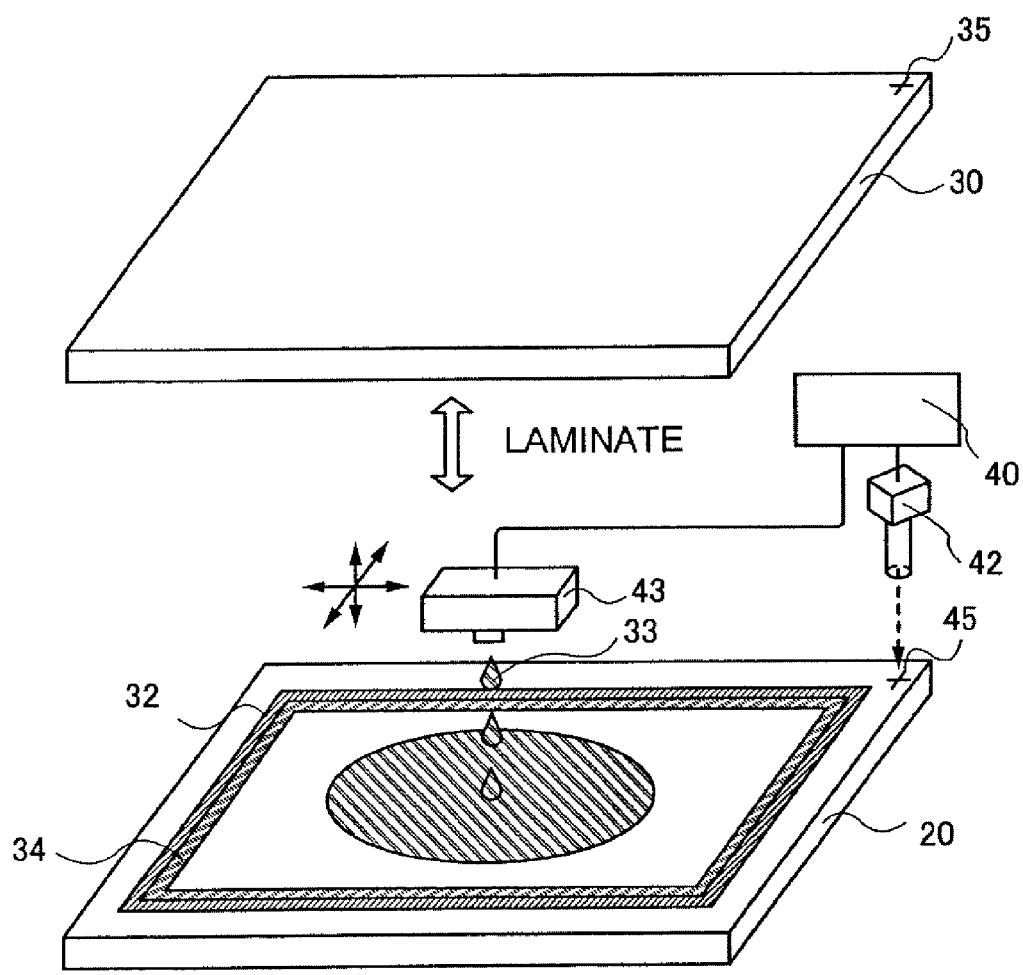
FIG. 50 is a diagram explaining a method of manufacturing a display device according to the invention.

An example of forming the liquid crystal layer by the liquid crystal dropping method with a dispenser is explained referring to FIG. 50. In FIG. 50, reference numeral 40 represents/represent a controlling device; 42, an image pickup means; 43, a head; 33, a liquid crystal; 35 and 41, markers; 34, a barrier layer; 32, a sealing material; 30, a TFT substrate; and 20, a counter substrate. A closed loop is formed by a sealing material 32, and the liquid crystal 33 is dropped therein at one or more times by the head 43. At this moment, the barrier layer 34 is formed to prevent the sealing material 32 from reacting with the liquid crystal 33. Subsequently, the substrates are attached to each other in vacuum. The sealing material is cured by being irradiated with ultraviolet light so that the liquid crystal is filled between the substrates.

In order to connect the pixel portion manufactured above to an exterior wiring substrate, a connection portion is formed. An insulating layer in the connection portion is removed by ashing using oxygen gas under an atmospheric pressure or almost atmospheric pressure. The ashing treatment uses the oxygen gas together with one or more of hydrogen, $CF_4$, $NF_3$, $H_2O$, and $CHF_3$. In the step, the ashing treatment is performed after sealing the liquid crystal with the counter substrate so as to prevent damage or breakage due to electrostatic. In the case of having less possibility of adverse affect due to electrostatic, however, the ashing treatment can be carried out at any time.

A wiring substrate for connection is next provided such that it is electrically connected to the gate electrode layer 5103 through an anisotropic conductive layer. The wiring substrate serves to transmit a signal and potential from an exterior portion. Through the above-described steps, a display panel (a liquid crystal display panel) including a channel etched type switching TFT and a capacitor element is thus completed. The capacitor element includes a capacitor wiring layer 5104, the gate insulating layer 5105, and the pixel electrode layer 5111.

In this embodiment mode, although a single gate structure is shown for a switching TFT, a multi-gate structure such as a double gate structure may be also used.

As set forth above, an exposing step using a photomask is not performed in the embodiment mode, thereby reducing the number of steps. In addition, a display panel (a liquid crystal display panel) can be easily manufactured by directly forming various patterns over a substrate by the droplet discharging method even when a glass substrate which is in and after the fifth generation having 1,000 mm or more on a side is used.

A predetermined pattern can be formed by performing a pretreatment for increasing the adherence of a subject region to be formed with a pattern with respect to the pattern, as compared with a region around the subject region. In addition, a microscopic linear pattern can be freely designed by processing with laser beam. According to the invention, a predetermined pattern can be formed with excellent controllability with minimum loss of materials, thereby reducing cost. As a consequence, a high-performance display device with excellent reliability can be manufactured with good yield.

Embodiment Mode 7

Another embodiment mode of the invention will be described with reference to FIGS. 41A and 41B, FIGS. 42A and 42B, FIGS. 43A and 43B, and FIGS. 44A and 44B. The present embodiment mode shows an example in which a pretreatment for forming a pattern by the droplet discharging method is different of that in Embodiment Mode 6. FIGS. 41A, 42A, 43A, and 44A are top views of pixel portions of display devices. FIGS. 41B, 42B, 43B, and 44B are cross sectional views taken along each line G-H in FIGS. 41A, 42A, 43A, and 44A.

A base film 5201 is formed over a substrate 5200 as a base pretreatment. The base film 5201 is made from a photosensitive material that is photoactivated with laser beam irradiation such that the base film formed in a subject region on which a pattern will be formed is removed.

Figure 41A:
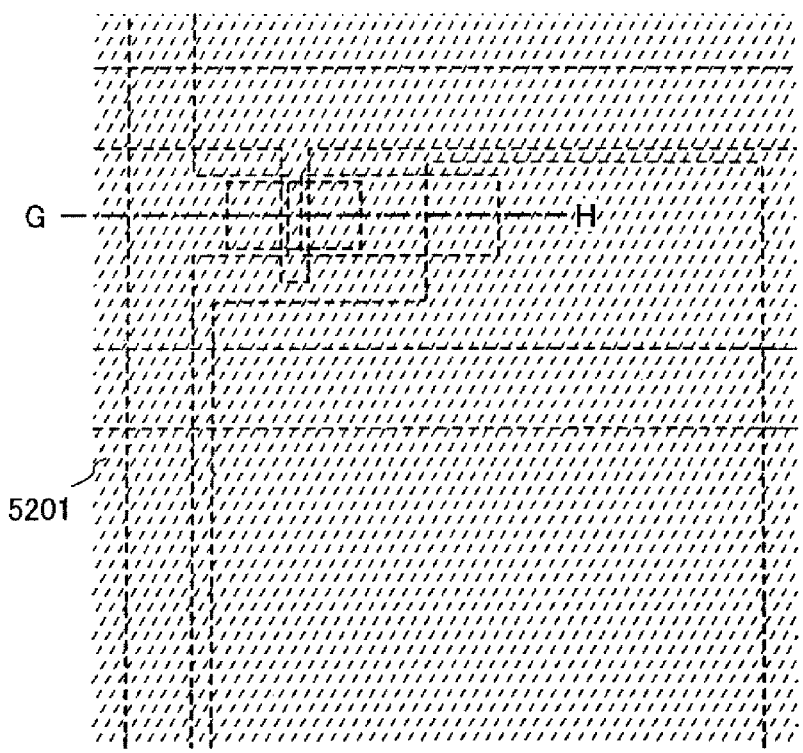
FIGS. 41A and 41B are diagrams explaining a method of manufacturing a display device according to the invention.
Figure 41B:
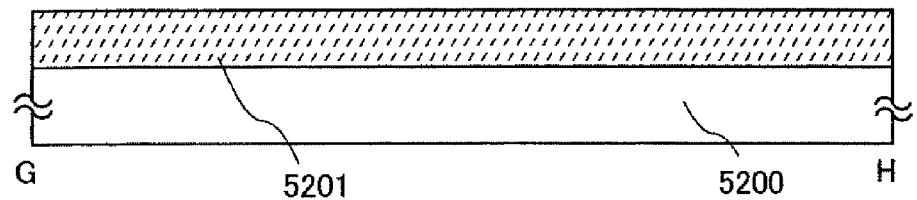

As shown in FIGS. 41A and 41B, the thickness of the base film 5201 is set to be equal to or thicker than the thickness of a pattern. When the base film with such a thickness is partly removed, a depression portion is formed so that a pattern material can be discharged in the depression portion. As shown in FIG. 41A, the base film 5201 is formed in the vicinity of a subject region on which patterns will be formed. The base film 5201 is preferably made from a photosensitive material, in particular, a positive photosensitive resist material such that it is subjected to laser processing.

Figure 42A:
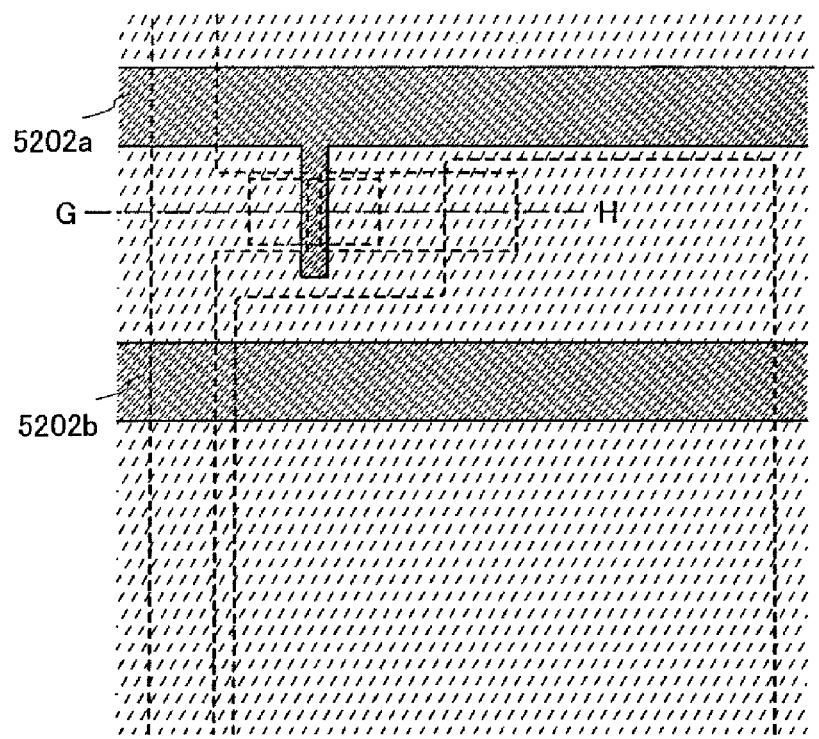
FIGS. 42A and 42B are diagrams explaining a method of manufacturing a display device according to the invention.
Figure 42B:
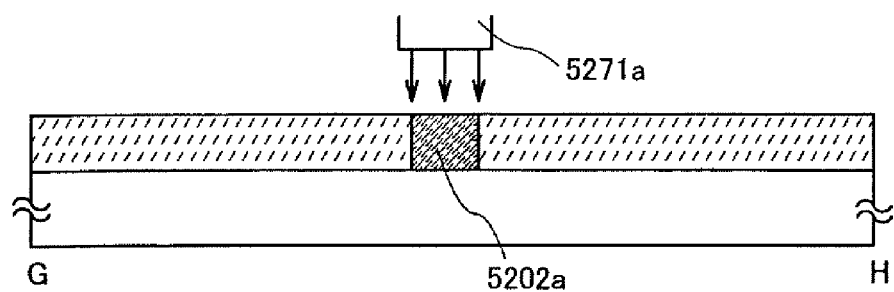
Figure 43A:
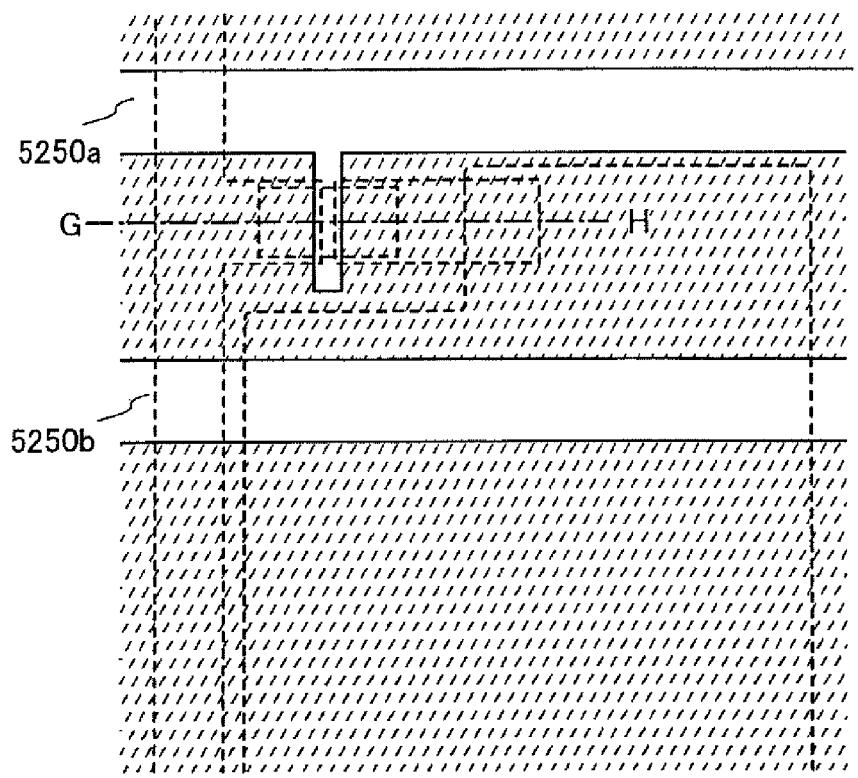
FIGS. 43A and 43B are diagrams explaining a method of manufacturing a display device according to the invention.
Figure 43B:
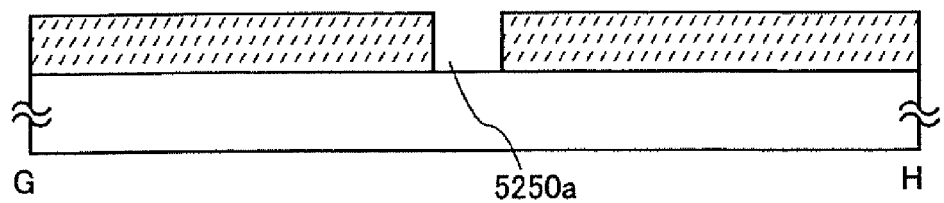

Laser beam 5271a and 5271b is irradiated to regions on which a gate electrode layer will formed by using a laser irradiation device so that the base film 5201 is photoactivated to form photoactivated regions 5202a and 5202b (see FIGS. 42A and 42B). Since the base film 5201 is formed of the positive photosensitive material, the regions 5202a and 5202b where are photoactivated with laser beam are removed by etchant, and therefore, depressions 5250a and 5250b that are surrounded by remaining peripheral base film are formed in the subject regions to be formed with the patterns (see FIGS. 43A and 43B).

Figure 44A:
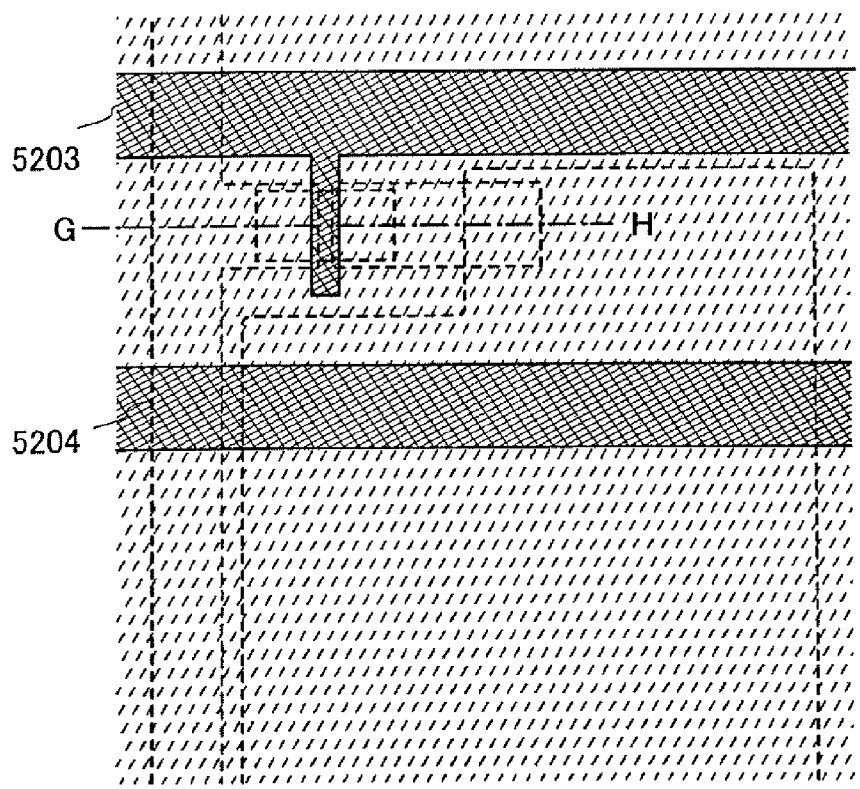
FIGS. 44A and 44B are diagrams explaining a method of manufacturing a display device according to the invention.
Figure 44B:
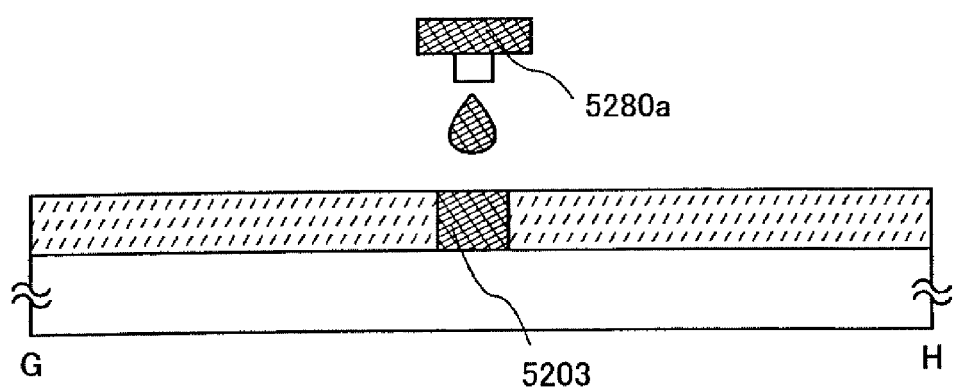

Liquids made from a composition containing a conductive material are discharged in the depressions 5250a and 5250b by a droplet discharging device 5280a so as to form a gate electrode layer 5203 and a capacitor wiring layer 5204 only in the subject regions (see FIGS. 44A and 44B). In the case where a discharge port through which the droplets are discharged is larger in diameter or the droplets are discharged around regions other than the subject regions with bad controllability, the excess conductive material is discharged over the base film 5201 around the subject regions. After forming the gate electrode layer 5203 and capacitor wiring layer 5204, when the base film 5201 made from the photosensitive resin etc. is removed by etching or the like, the gate electrode layer 5203 and capacitor wiring layer 5204 can be formed only in the predetermined portions with good controllability. Also, by controlling the thickness of the base film made from the photosensitive resin etc., the thicknesses of the patterns to be formed can be adjusted freely. The subject regions to be formed with the patterns are processed with laser beam to form the depressions, and therefore, microscopic processing can be carried out. When using laser beam that is optically designed to have a spot shape, a spot like a contact hole can be formed easily and precisely.

The base film 5201 around the depressions can be formed of a photosensitive acrylic that is a photosensitive substance, a photosensitive polyimide that is a photosensitive resin, or the like. In addition, a commercially available resist material containing photosensitive agent may be employed. For example, a novolac resin, which is a typical positive resist, a naphthoquinone diazide compound, which is photosensitive agent, and the like may be used.

According to the steps, the gate electrode layer 5203 and the capacitor wiring layer 5204 are completed. The subsequent steps are described in Embodiment Mode 1, and will not be further explained.

A predetermined pattern can be formed by performing a pretreatment for forming a depression in a subject region to be formed with a pattern. In addition, a microscopic linear pattern can be freely designed by processing with laser beam. According to the invention, a predetermined pattern can be formed with excellent controllability with minimum loss of materials, thereby reducing cost. As a consequence, a high-performance display device with excellent reliability can be manufactured with good yield.

Embodiment Mode 8

Figure 54:
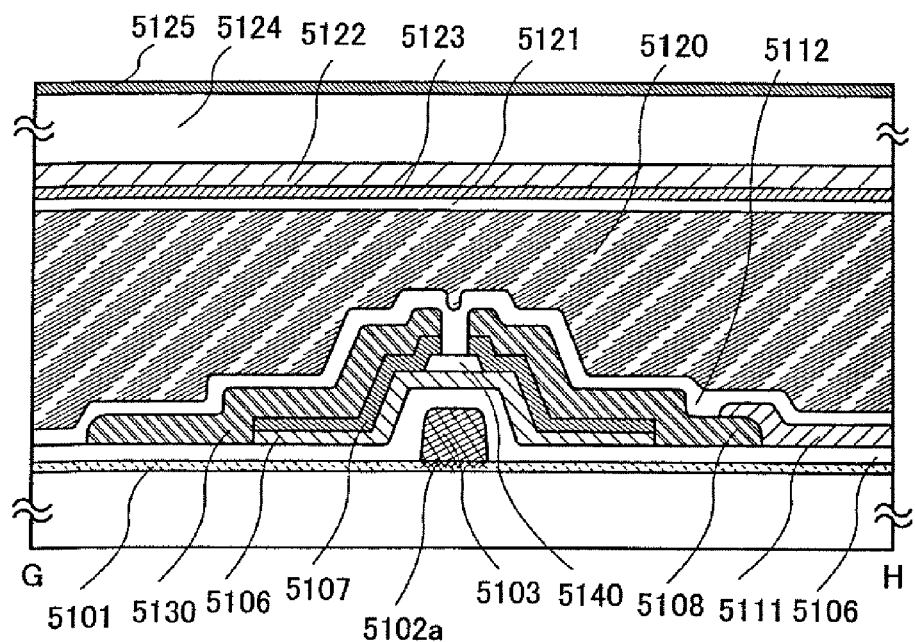
FIG. 54 is a cross sectional view explaining a method of manufacturing a display device according to the invention.

Another embodiment mode of the invention will be described with reference to FIG. 54. In the present embodiment mode, a channel protective type thin film transistor is used in Embodiment Mode 6, as substitute for the channel etched type thin film transistor. Therefore, an identical portion or a portion having a similar function to those in Embodiment Mode 6 will not be further described. Note that FIG. 41 is a cross sectional view of the channel etched type thin film transistor in Embodiment Mode 6.

A base film 5101 is formed over a substrate 5100 as a base pretreatment. Laser beam is irradiated to only subject regions of the base film on which a gate electrode layer 5103 and a capacitor wiring layer 5104 will be formed. Properties of the subject regions irradiated with the laser beam (i.e., a base film 5102a) are changed so that the base film 5102a exhibits higher lyophilic properties (lower lyophobic properties) with respect to a droplet made from a composition containing a conductive material, which will be discharged thereon later. By discharging the composition containing the conductive material on the regions in which the properties have been changed (the base film 5102a), the gate electrode layer 5103 and the capacitor wiring layer 5104 are formed only on the base film 5102a.

Next, a gate insulating layer 5105 is formed on the gate electrode layer 5103 and capacitor wiring layer 5104 by plasma CVD, sputtering, etc. It is more preferable that the gate insulating layer 5105 be formed by laminating an insulating layer 5105a made from silicon nitride, an insulating layer 5105b made from silicon oxide, and an insulating layer 5105c made from silicon nitride. Further, a semiconductor layer 5106 that serves as an active layer is formed. The above-described steps can be carried out in the same manner as Embodiment Mode 2.

To form a channel protective film 5140, for example, an insulating film is formed on the semiconductor layer 5106 by plasma CVD, and patterned to have a predetermined shape in a predetermined portion. In this case, exposure is performed from the back surface of the substrate while utilizing the gate electrode layer 5103 as a mask so that the channel protective film 5140 can be formed. Alternatively, the channel protective film 5140 may be formed by dropping polyimide or polyvinyl alcohol with the droplet discharging method. In the way, the exposing step can be omitted.

As the channel protective film, one kind of an inorganic material (silicon oxide, silicon nitride, silicon oxynitride, silicon nitride oxide, and the like), a photosensitive or nonphotosensitive organic material (an organic resin material) (polyimide, acrylic, polyamide, polyimide amide, a resist, benzocyclobutene, and the like), a Low k material which has a low dielectric constant, and the like; a film including plural kinds thereof a lamination layer thereof; and the like can be used. Additionally, a material which has skeleton formed by the bond of silicon (Si) and oxygen (O), and which includes at least hydrogen as a substituent, or at least one of fluoride, alkyl group, and aromatic hydrocarbon as a substituent, may be used. As a method for manufacturing the channel protective film, the vapor phase growth method such as plasma CVD, thermal CVD, and sputtering can be used. The droplet discharge method or printing method (a method for forming a pattern, such as a screen printing or offset printing) can also be used. In addition, a TOF film or an SOG film obtained by application can be used.

An N-type semiconductor layer 5107 is formed on the semiconductor layer 5106 and the channel protective film 5140. A mask is selectively formed over the semiconductor layer 5106 and the N-type semiconductor layer 5107 by discharging a composition. While utilizing the mask, the semiconductor layer 5106 and the N-type semiconductor layer 5107 are simultaneously etched to complete the semiconductor layer, and the N-type semiconductor layer. A composition containing a conductive material is discharged on the semiconductor layer 5106 to form source or drain electrode layers 5130 and 5108.

A pixel electrode layer 5111 is formed by discharging a composition containing a conductive material such that it is electrically connected to the source or drain electrode layer 5108. Afterward, a pressing step may be performed to planarize the surface over the substrate.

Subsequently, an insulating layer 5112, which also functions as an orientation film, is formed, and a sealing material is then formed. The substrate 5100 and a counter substrate 5124 over which a color filter (a colored layer) 5122, a conductive layer 5123, and an insulating layer 5121 are formed are attached to each other with the sealing material. A liquid crystal layer 5120 is provided between the substrate 5100 and the counter substrate 5124. A region attached with a connection terminal is etched to be exposed under an atmospheric pressure or almost atmospheric pressure. The connection terminal is thus attached to the exposed portion. Consequently, a display panel (a liquid crystal display panel) having a display function can be manufactured (see FIG. 54).

Embodiment Mode 9

Another embodiment mode of the invention will be described referring to FIG. 46, FIGS. 47A to 47D, and FIGS. 48A to 48C. The embodiment mode shows an example wherein a top-gate (staggered type) thin film transistor is used as substitute for the bottom gate (reverse stagger type) thin film transistor in Embodiment Mode 6, and therefore, an identical portion or a portion having a similar function to that in Embodiment Mode 6 will not be further described. FIGS. 47A to 47D and FIGS. 48A to 48C are cross sectional views taken along a line G-H in FIG. 46.

A base film 5301 is formed on a substrate 5300 as a base pretreatment. Laser beam is irradiated only to subject regions on which source or drain electrode layers 5330 and 5308 will be formed. The properties of the regions irradiated with the laser beam (i.e., base films 5302a and 5302b) are changed so that the base films 5302a, 5302b exhibit higher lyophilic (or, lower lyophobic) properties with respect to droplets made from a composition containing a conductive material, which will be discharged thereon later, as compared with the peripheral region where is not irradiated with the laser beam. Therefore, when the composition containing the conductive material is discharged in the regions with the higher lyophilic properties (i.e., the base films 5302a and 5302b), source or drain electrode layers 5330 and 5308 are formed only on the base films 5302a and 5302b with the excellent controllability.

An N-type semiconductor layer is formed over the source or drain electrode layers 5330 and 5308, and then etched by using a mask made from a resist. The mask may be formed by discharging the resist by the droplet discharging method. A semiconductor layer is also formed on the N-type semiconductor layer, and etched by utilizing a mask etc. Accordingly, an N-type semiconductor layer 5307 and a semiconductor layer 5306 are formed over the substrate.

A gate insulating layer 5305 is next formed over the substrate 5300 to have a single layer or a lamination layer. In particular, the gate insulating layer is preferably formed by laminating an insulating layer 5305a made from silicon nitride, an insulating layer 5305b made from silicon oxide, and an insulating layer 5305c made from silicon nitride.

Figure 47A:
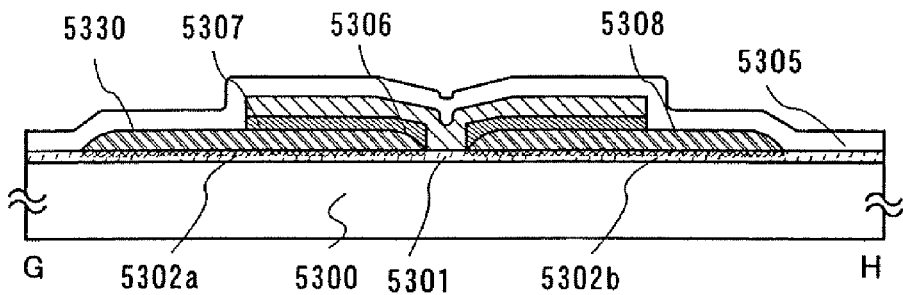
FIGS. 47A to 47D are diagrams explaining a method of manufacturing a display device according to the invention.
Figure 47B:
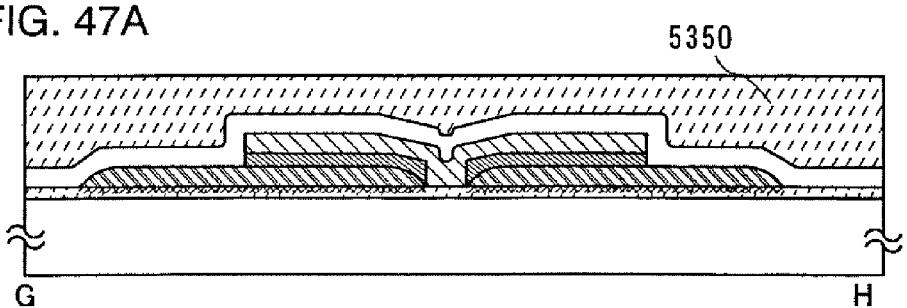
Figure 47C:
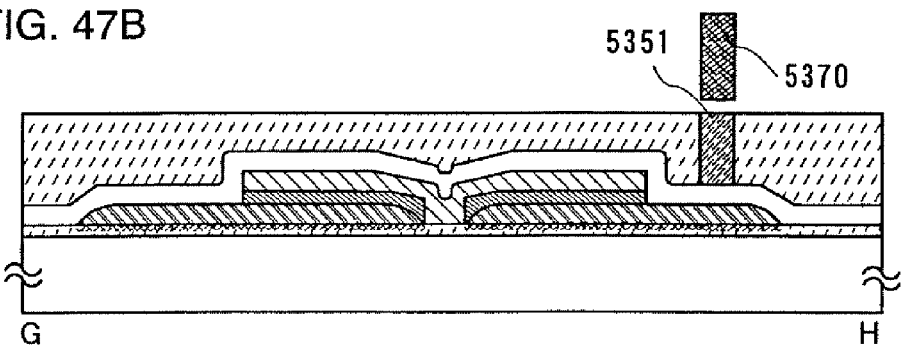
Figure 47D:
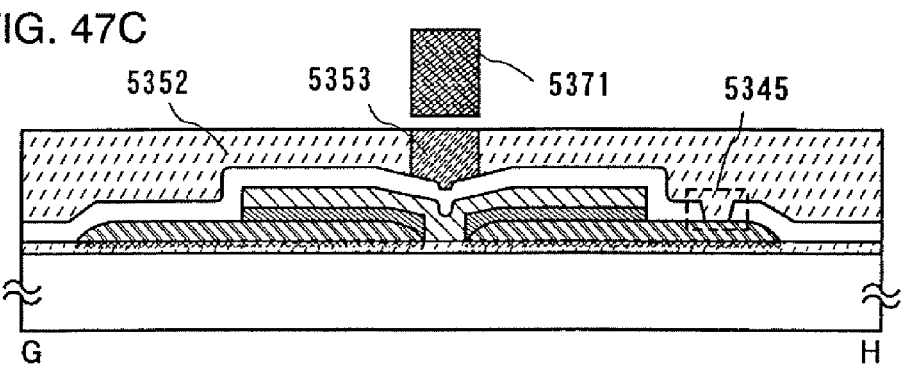

A photosensitive substance 5350 is next formed on the gate insulating layer 5305 (see FIG. 47B). As shown in Embodiment Mode 2, a positive photosensitive substance is preferably used as the photosensitive substance 5350, and a photosensitive resin is, herein, employed. By using a laser irradiation device, laser beam 5370 is irradiated to a region such that the photosensitive substance 5350 is removed to form a contact hole. A region 5351 irradiated with the laser beam is photoactivated (see FIG. 47C). After removing the photoactivated region by etching, the gate insulating layer 5305 is etched while utilizing the photosensitive substance 5350 as a mask so as to form a through hole 5345.

Figure 48A:
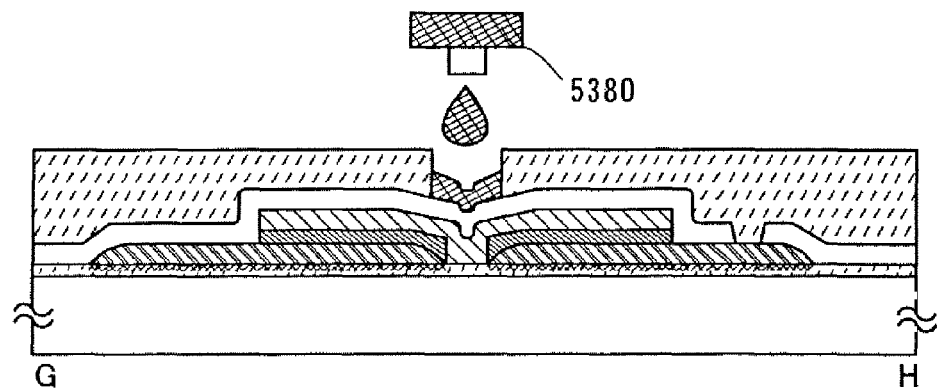
FIGS. 48A to 48C are diagrams explaining a method of manufacturing a display device according to the invention.
Figure 48B:
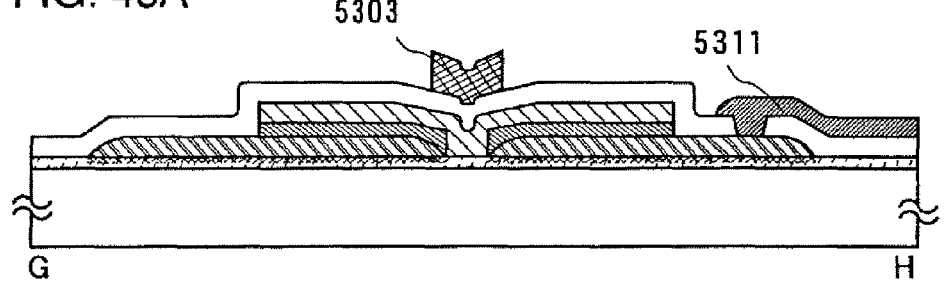
Figure 48C:
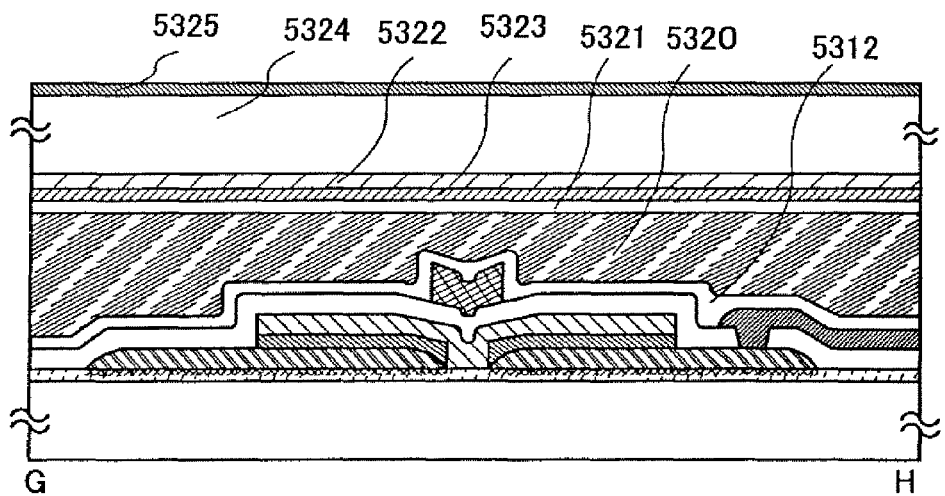

A photosensitive substance 5352 is next formed over the substrate 5300. The photosensitive substance 5352 is formed to fill the region 5351 on which the photosensitive material 5350 is removed to form the through hole 5345; and therefore, the region 5351, where is the contact hole, may be filled with the photosensitive substance 352 by the droplet discharging method. By using the laser irradiation device, laser beam 5371 is irradiated to a region 5353 on which a gate electrode layer 304 will be formed. The region 5353 is photoactivated with the laser beam and then removed by etching as well as the region 5351 (FIG. 48A).

The photoactivated region is next removed to form a depression. A composition containing a conductive material is discharged in the depression by the droplet discharging device 5380 to form a gate electrode layer 5303. The capacitor wiring layer 5304 is also formed in the same manner as the gate electrode layer 5303. According to the invention, the width of the gate electrode layer 5303 can be narrowed in a channel direction, therefore reducing the resistivity and improving the mobility.

The photosensitive substance 5352 is removed. A pixel electrode layer 5311 is next formed by the droplet discharging method so that the pixel electrode layer 5311 and the source or drain electrode layer 5308 are electrically connected to each other in the through hole 5345, which has been previously formed.

An insulating layer 5321, which serve as an orientation film, is formed and a sealing material is then formed. The substrate 5300 and a counter substrate 5324 over which a color filter (a colored layer) 5322, a counter electrode 5323, an insulating layer 5321, and a polarizing plate 5325 are formed are attached to each other with the sealing material. A liquid crystal layer 5320 is provided between the substrate 5300 and the counter substrate 5324. A region attached with a connection terminal is etched to be exposed under an atmospheric pressure or almost atmospheric pressure. The connection terminal is thus attached to the exposed portion. As a result, a display panel (a liquid crystal display panel) having a display function can be manufactured (see FIG. 48C).

As set forth above, an exposing step using a photomask is not performed in the embodiment mode, thereby reducing the number of steps. In addition, a display panel can be easily manufactured by directly forming various patterns over a substrate by the droplet discharging method even when a glass substrate which is in and after the fifth generation having 1,000 mm or more on a side is used.

A predetermined pattern can be formed by performing a pretreatment for forming a depression in a subject region to be formed with a pattern. In addition, a microscopic linear pattern can be freely designed by processing with laser beam. According to the invention, a predetermined pattern can be formed with excellent controllability with minimum loss of materials, thereby reducing cost. As a consequence, a high-performance display device with excellent reliability can be manufactured with good yield.

Embodiment Mode 10

In each display panel manufactured according to Embodiment Modes 2 to 9, a scanning line driver circuit can be formed over a substrate 3700 by forming a semiconductor layer of an SAS as described in FIG. 17B.

Figure 25:
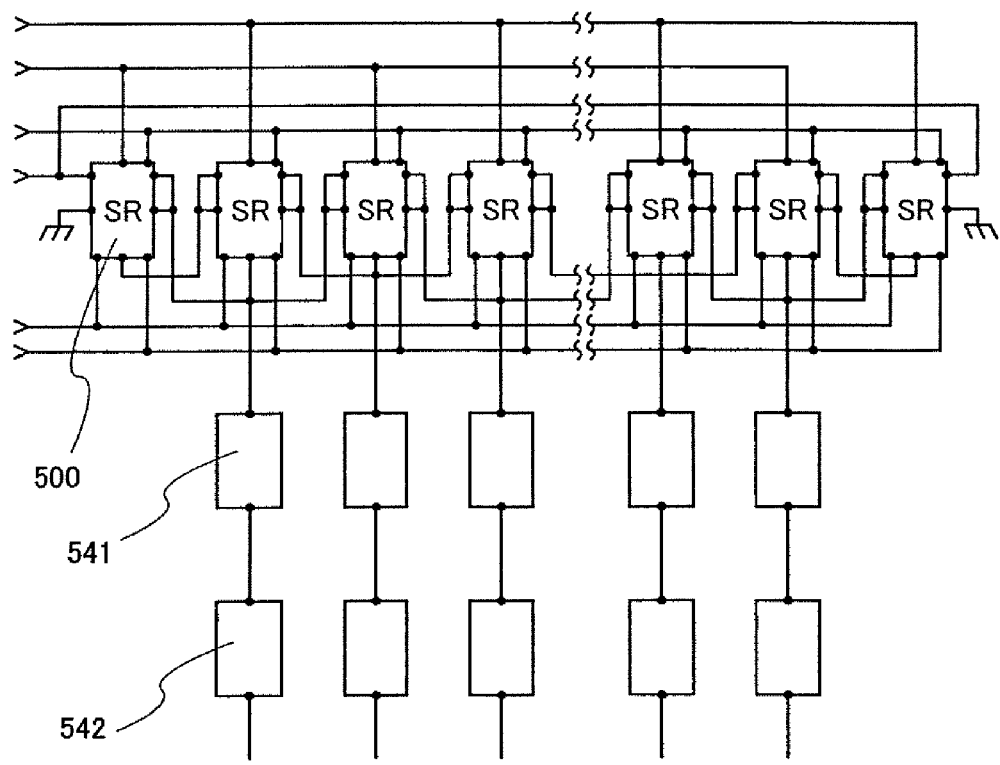
FIG. 25 is a diagram explaining a circuit structure in the case of forming a scanning line driver circuit by using a TFT in the display device according to the invention.

FIG. 25 shows a block diagram of a scanning line driver circuit including n-channel type TFTs using an SAS in which electric field-effect mobility of 1 to 15 $cm^2/V$ sec can be obtained.

In FIG. 25, block denoted by reference numeral 500 corresponds to a pulse output circuit outputting a sampling pulse for one stage, and a shift register includes n pieces of pulse output circuit. Reference numeral 541 denotes a buffer circuit, and a pixel 542 is connected at the end thereof.

Figure 26:
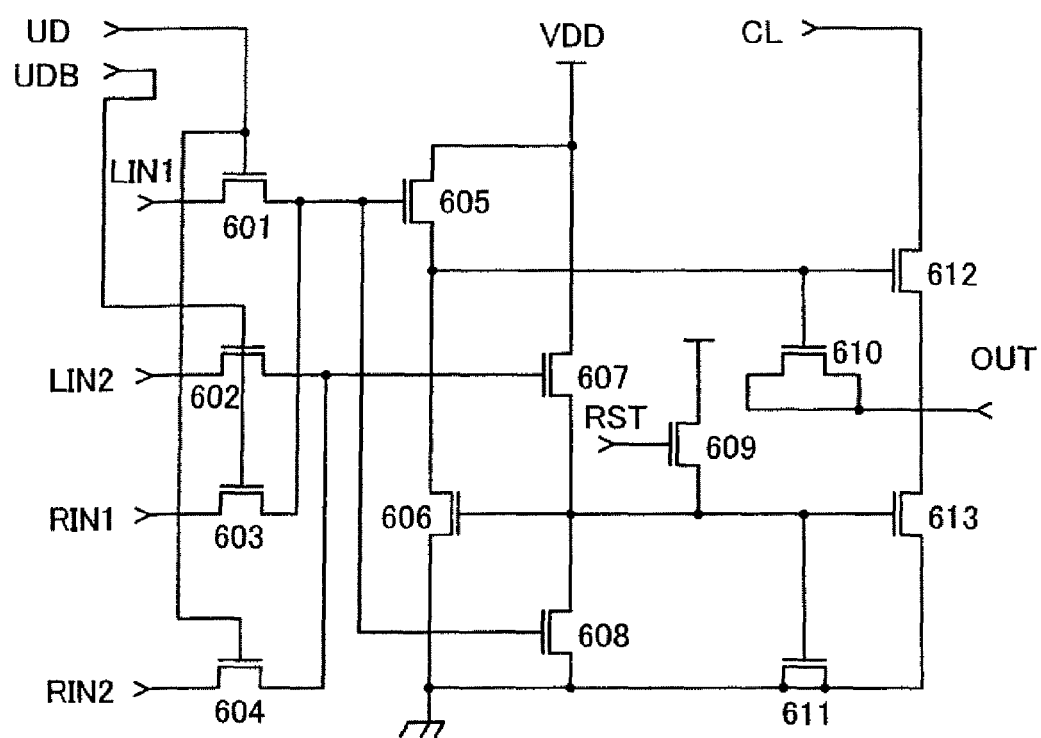
FIG. 26 is a diagram explaining a circuit structure in the case of forming a scanning line driver circuit by using a TFT in the display panel according to the invention (a shift register circuit)

FIG. 26 shows a specific structure of the pulse output circuit 500, and the circuit includes n-channel type TFTs 601 to 612. At this time, the size of the TFTs may be decided in consideration of operation characteristics of the n-channel type TFTs using an SAS. For example, when a channel length is set to be 8 μm, the channel width can be set to be ranging from 10 to 80 μm.

Figure 27:
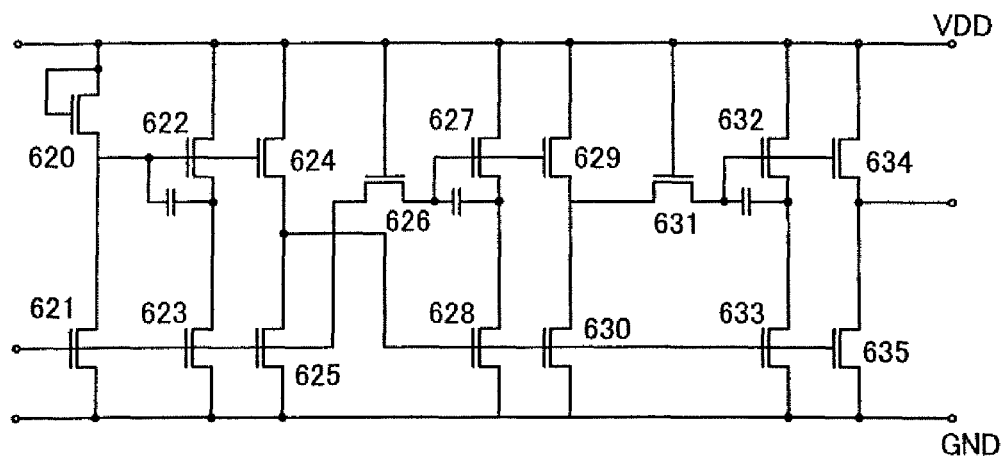
FIG. 27 is a diagram explaining a circuit structure in the case of forming a scanning line driver circuit in the display panel according to the invention (a buffer circuit)

In addition, FIG. 27 shows a specific structure of the buffer circuit 541. The buffer circuit includes n-channel type TFTs 620 to 635 in the same manner. In this case, the size of the TFTs may be decided in consideration of operation characteristics of the n-channel type TFTs using an SAS. For example, when a channel length is set to be 10 μm, the channel width can be set to be ranging from 10 to 1,800 μm.

Figure 31:
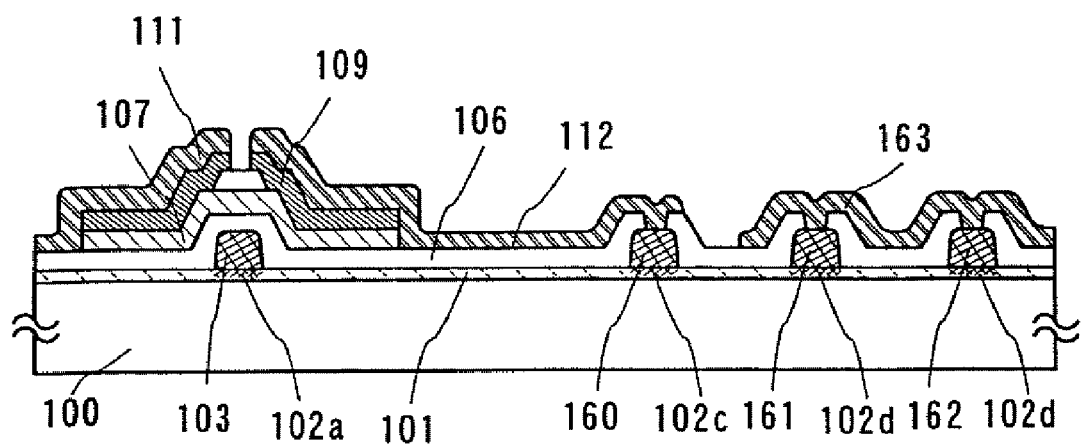
FIG. 31 is a diagram explaining a method of manufacturing a display device according to the invention.

It is necessary to connect the TFTs with one another by wirings to realize such a circuit, and FIG. 31 shows a structure example of wirings in the case thereof. As well as Embodiment Mode 2, FIG. 31 shows a state in which a gate electrode layer 104, a gate insulating layer 106 (a three-layer laminated body of an insulating layer 106a formed of silicon nitride, an insulating layer 106b formed of silicon oxide, and an insulating layer 106c formed of silicon nitride), a semiconductor layer 107 formed of an SAS, an N-type semiconductor layer 109 which forms a source and a drain, and source or drain electrode layers 111 and 116 are formed. In this case, connection wiring layers 160, 161, and 162 are formed over a substrate 100 in the same step with the gate electrode layer 104. Then, the gate insulating layer is partly etched so that the connection wiring layers 160, 161, and 162 are exposed, and the TFTs are appropriately connected to the source or drain electrode layers 111 and 112, and a connection wiring layer 163 formed in the same step thereof. Consequently, various kinds of circuits can be realized.

In the configuration example of wirings as shown in FIG. 31, the gate electrode layer 103, the gate insulating layer 106, the semiconductor layer 107, the N-type semiconductor layer 109, and the source or drain electrode layers 111, 112 correspond to the gate electrode layer 5104, the gate insulating layer 5105, the semiconductor layer 5106, the N-type semiconductor layer 5107, and the source or drain electrode layer 130, 108 in Embodiment Mode 6, respectively.

Embodiment Mode 11

A mode in which a driver circuit for driving is mounted on a display panel such as an EL display panel and a liquid crystal display panel manufactured according to Embodiment Modes 2 to 9 will be described.

Firstly, a display device to which the COG technology is applied is explained with reference to FIG. 18A. A pixel portion 2701 displaying information such as a character or an image is provided over a substrate 2700. The substrate over which multiple driver circuits are provided is divided into rectangles. Driver circuits after separation (hereinafter referred to as "driver ICs") 2751 are mounted over the substrate 2700. FIG. 18A shows a mode in which a plurality of driver ICs 2751 and a plurality of FPCs 2750 mounted on the ends of the driver ICs 2751 are implemented. Or, the separation size is made approximately same as a side of a signal line side in the pixel portion, and a tape may be mounted on an end of a single driver IC.

Alternatively, the TAB technology may be applied, and in this case, a plurality of tapes may be attached such that the driver ICs are mounted on the tapes. As well as the COG technology, a single driver IC may be mounted on a single tape, and in this case, a metal piece, and the like to fix the driver IC may be attached along with the driver IC in view of a strength matter.

As for these driver ICs mounted on the display panels, a plurality of the driver ICs is preferably provided over a rectangular substrate having 300 to 1,000 mm or more on a side in view of improving productivity.

In other words, multiple circuit patterns each of which has a driver circuit portion integrated with an input/output terminal are formed over a substrate, and divided into each pattern last. The length of a long side for a driver IC may be set to be 15 to 80 mm; and a short side, 1 to 6 mm, which forms a rectangular shape, in consideration of the length of a side length of a pixel portion or a pixel pitch. Or, the driver IC may be formed to have a length equal to that of a side for the pixel region or the sum of a side of the pixel portion and a side of each driver circuit.

The external dimension of a driver IC is more advantageous with respect to the length of a long side, as compared with an IC chip. When a driver IC in which a long side with 15 to 80 mm is used, less IC chips are required to mount correspondingly to a pixel portion, and therefore, a manufacturing yield can be enhanced. When a driver IC is formed over a glass substrate, productivity is not impaired since it is not limited by a shape of a substrate to be used as a body. This is a significant advantage compared with the case where IC chips are obtained from a circular silicon wafer.

As shown in FIG. 17B, when the scanning line driver circuits 3704 are integrated over the substrate, driver ICs in which signal line driver circuits are formed are mounted in a region outside of the pixel portion 3701. These driver ICs are signal line driver circuits. To form a pixel portion corresponding to RCB full colors, 3072 signal lines are required for an XGA class, and 4800 signal lines are required for a UXGA class. The signal lines of such a number forms a leading out line by being sectioned into several blocks at an edge of the pixel region 3701 and is gathered in accordance with a pitch of an output terminal of the driver ICs.

The driver ICs are preferably formed of a crystalline semiconductor formed over a substrate. The crystalline semiconductor is preferable to be formed by being irradiated with a continuous wave laser. A continuous wave solid-state laser or gas laser is used as an oscillator to generate laser beam. There are few crystal defects when a continuous wave laser is used. Therefore, a transistor can be manufactured by using a polycrystalline semiconductor layer with a large grain size. In addition, high-speed driving can be performed since mobility or a response speed is favorable, and an operating frequency of an element can be further improved as compared with that of the conventional element, thereby obtaining high reliability with few variations in characteristics. Preferably, a channel length direction of a transistor and a scanning direction of laser beam may be accorded with each other to still further improve an operating frequency. This is because the highest mobility can be obtained when a channel length direction of a transistor and a scanning direction of laser light with respect to a substrate are almost parallel preferably, from −30° to 30°) in a step of laser crystallization by a continuous wave laser. A channel length direction coincides with a direction of current flowing in a channel form region, or, a direction of an electric charge moving therein. The transistor thus manufactured has an active layer including a polycrystalline semiconductor layer in which a crystal grain is extended in a channel direction, and this represents that a crystal grain boundary is formed almost along a channel direction.

In carrying out laser crystallization, it is preferable that the laser beam be narrowed down largely so that a beam spot thereof have a width of approximately 1 to 3 mm, which is equal to a short side of the driver ICs. In addition, in order to ensure an enough and effective energy density with respect to an object to be irradiated, an irradiated region with the laser beam is preferably a linear shape. Note that, a linear shape here does not indicate a line in a proper sense, but indicates a rectangle or an oblong with a large aspect ratio. For example, the linear shape refers to a rectangle or an oblong with an aspect ratio of 2 or more preferably from 10 to 10,000). Accordingly, a width of a beam spot of the laser beam is set to be equal to that of a minor axis of the driver ICs, thereby providing a method for manufacturing a display device with improved productivity.

As shown in FIGS. 18A and 18B, driver ICs may be mounted over a substrate as both a scanning line driver circuit and a signal line driver circuit. In this case, it is preferable to differentiate a specification of the driver ICs to be used on the scanning line and signal line side.

In the pixel portion, the signal line and the scanning line are intersected to form a matrix and transistors are arranged in accordance with each intersection. A TFT having a structure in which a channel portion is formed from an amorphous semiconductor or a semiamorphous semiconductor can be used as the transistor arranged in the pixel portion in the invention. An amorphous semiconductor is formed by plasma CVD, sputtering, etc. It is possible to form a semiamorphous semiconductor at temperatures of 300° C. or less with plasma CVD. A film thickness necessary to form a transistor is formed in a short time even in the case of a non-alkaline glass substrate with an outer size of, for example, 550 mm×650 mm. The feature of such a manufacturing technique is effective in manufacturing a display device with a large-size screen. In addition, a semiamorphous TFT can obtain electric field-effect mobility of 2 to 10 $cm^2/V$ sec by forming a channel formation region with an SAS. Therefore, this TFT can be used as a switching element of pixels and as an element which constitutes the scanning line driver circuit. Accordingly, a display panel in which a system-on-panel is achieved can be manufacture.

The scanning line driver circuit is integrally formed over the substrate by using a TFT with a semiconductor layer formed of an SAS. When the TFT with the semiconductor layer formed of the SAS is used, the drive ICs may be mounted on both the scanning line driver circuit and the signal line driver circuit.

In that case, it is preferable to differentiate a specification of the driver ICs to be used in the scanning line and signal line side. For example, although the withstand pressure of approximately 30 V is required for a transistor constituting a scanning line driver IC, a driving frequency is 100 kHz or less, and thus high-speed operation is not relatively required. Therefore, it is preferable that the channel-length (L) of a transistor constituting the scanning line driver be set to be sufficiently long. On the other hand, in a transistor of the signal line driver IC, although the withstand pressure of approximately of 12 V is sufficient, a drive frequency is about 65 MHz at 3V, and thus high-speed operation is required.

Accordingly, it is preferable that the channel length of a transistor constituting a driver be set to be in micrometer.

The method for mounting a driver IC is not particularly limited, and the known COG technology, wire bonding technology, or TAB technology can be used.

The thickness of the drive IC is made same as that of a counter substrate such that the heights thereof are approximately equal to each other, thereby contributing to thinning a display device as a whole. By manufacturing each substrate of the same material, heat stress is not generated even when a temperature of the display device is changed and the characteristics of a circuit manufactured of the TFT are not impaired. Additionally, by mounting longer driver ICs than IC chips over the driver circuit as shown in this embodiment mode, the number of the driver ICs mounted on one pixel portion can be reduced.

As mentioned above, the driver circuit can be incorporated into a display panel.

Embodiment Mode 12

Structures of pixels for a display panel shown in the embodiment mode will be described with reference to equivalent circuit diagrams illustrated in FIGS. 32A to 32F.

Figure 32A:
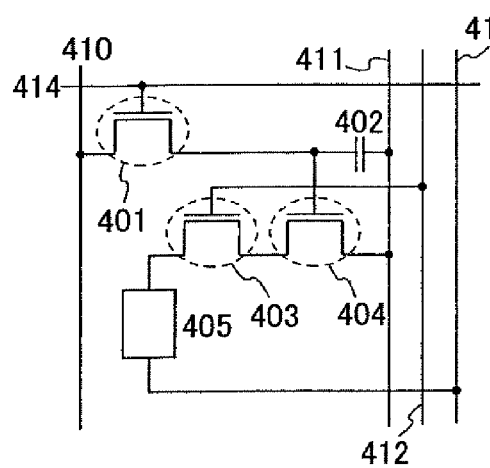
FIGS. 32A to 32F are equivalent circuit diagrams explaining structures of pixels that are applicable to a display panel according to the invention.

In a pixel shown in FIG. 32A, a signal line 410 and power supply lines 411 to 413 are arranged in columns, whereas a scanning line 414 is arranged in a row. The pixel also includes a switching TFT 401, a driver TFT 403, a current controlling TFT 404, a capacitor element 402, and a light emitting element 405.

Figure 32B:
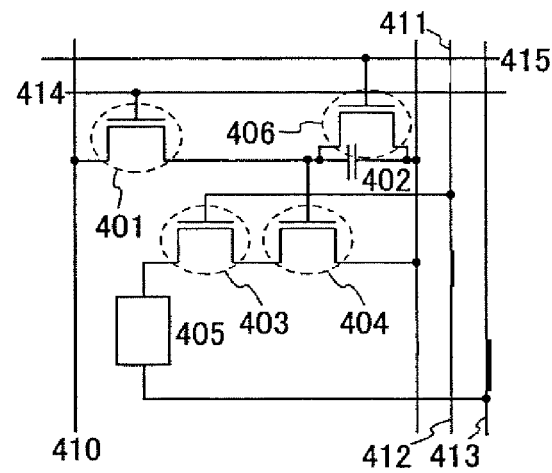
Figure 32C:
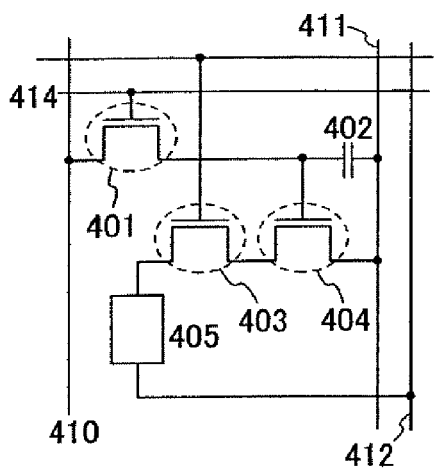
Figure 32D:
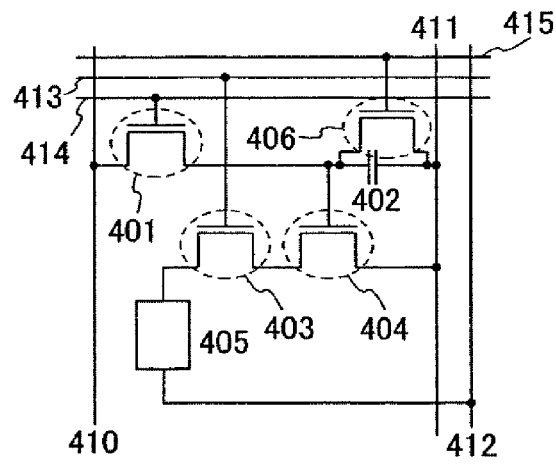

A pixel shown in FIG. 32C has the same structure as the one shown in FIG. 32A, except that a gate electrode of the driver TFT 403 is connected to a power supply line 412 that is arranged in a row. That is, both pixels in FIGS. 32A and 32C show same equivalent circuit diagrams. However, respective power supply lines are formed of conductive layers in different layers between the cases where the power supply line 412 is arranged in a column (FIG. 32A) and where the power supply line 412 is arranged in a row (FIG. 32C). In order to emphasis on the feature of the different arrangements of the power supply lines to which the gate electrodes are connected in FIGS. 32A and 32C, the equivalent circuit diagrams are individually illustrated.

In each FIGS. 32A and 32C, the TFT 403 and the TFT 404 are connected in series in each pixel, and the channel length $L_3$ and the channel width $W_3$ of the driver TFT 403 and the channel length $L_4$ and the channel width $W_4$ of the current controlling TFT 404 are set to satisfy the relation as follows: $L_3/W_3:L_4/W_4=5$ to $6000:1$. For example, when $L_3$, $W_3$, $L_4$, and $W_4$ are set to be 500 μm, 3 μm, 3 μm, and 100 μm, respectively, they satisfies $6000:1$.

The driver TFT 403 is operated in a saturation region and controls the amount of current flowing in the light emitting element 405, whereas the current controlling TFT 404 is operated in a linear region and controls a current supplied to the light emitting element 405. The TFTs 403 and 404 preferably have a same conductivity in view of the manufacturing process. For the driver TFT 403, a depletion type TFT may be used instead of an enhancement type TFT. According to the invention having the above structure, slight variations in $V_{GS}$ of the current controlling TFT 404 does not adversely affect the amount of current flowing in the light emitting element 405, since the current controlling TFT 404 is operated in a linear region. That is, the amount of current flowing in the light emitting element 405 is determined by the driver TFT 403 operated in the saturation region. Accordingly, it is possible to provide a display device in which image quality is improved by improving variations in luminance of the light emitting element due to variation of the TFT characteristics.

The switching TFT 401 of pixels shown in FIGS. 32A to 32D controls a video signal input to the pixel. When the switching TFT 401 is turned ON and a video signal is inputted to the pixel, the video signal is held in the capacitor element 402. Although the pixel includes the capacitor element 402 in FIGS. 32A to 32D, the invention is not limited the structure. When a gate capacitance or the like can serve as a capacitor for holding a video signal, the capacitor element 402 is not necessarily provided.

The light emitting element 405 has a structure in which an electroluminescent layer is sandwiched between a pair of electrodes. A potential difference is maintained between a pixel electrode and a counter electrode (i.e., between an anode and a cathode) such that a forward bias voltage is applied. The electroluminescent layer is formed of various kinds of materials such as an organic material and an inorganic material. Luminescence in the electroluminescent layer includes luminescence that is generated when an excited singlet state returns to a ground state (fluorescence) and luminescence that is generated when an exited triplet state returns to a ground state (phosphorescence).

A pixel shown in FIG. 32B has the same structure as the one shown in FIG. 32A, except that a TFT 406 and a scanning line 415 are added thereto. Similarly, a pixel shown in FIG. 32D has the same structure as the one shown in FIG. 32C, except that a TFT 406 and a scanning line 415 are added thereto.

The TFT 406 is controlled to be ON/OFF by the newly provided scanning line 415. When the TFT 406 is turned ON, charges held in the capacitor element 402 are discharged, thereby turning the TFT 404 OFF. That is, supply of a current to the light emitting element 405 can be forcibly stopped by providing the TFT 406. Therefore, a lighting period can start simultaneously with or immediately after a writing period starts before signals are written into all the pixels according to the structures shown in FIGS. 32B and 32D, thus, the duty ratio can be improved.

Figure 32E:
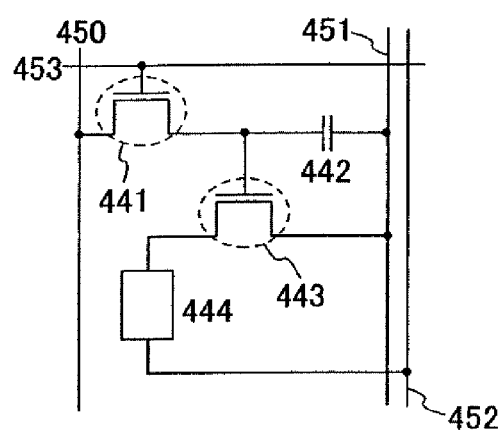
Figure 32F:
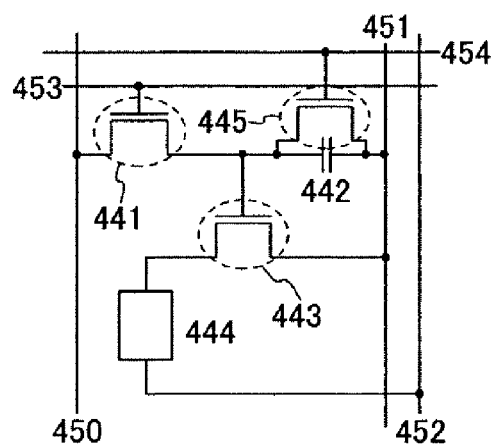

In a pixel shown in FIG. 32E, a signal line 450 and power supply lines 451 and 452 are arranged in columns, and a scanning line 453 is arranged in a row. The pixel further includes a switching TFT 441, a driver TFT 443, a capacitor element 442, and a light emitting element 444. A pixel shown in FIG. 32F has the same structure as the one shown in FIG. 32E, except that a TFT 445 and a scanning line 454 are added. It is to be noted that the structure shown in FIG. 32F also allows a duty ratio to be improved by providing the TFT 445.

Embodiment Mode 13

Figure 24:
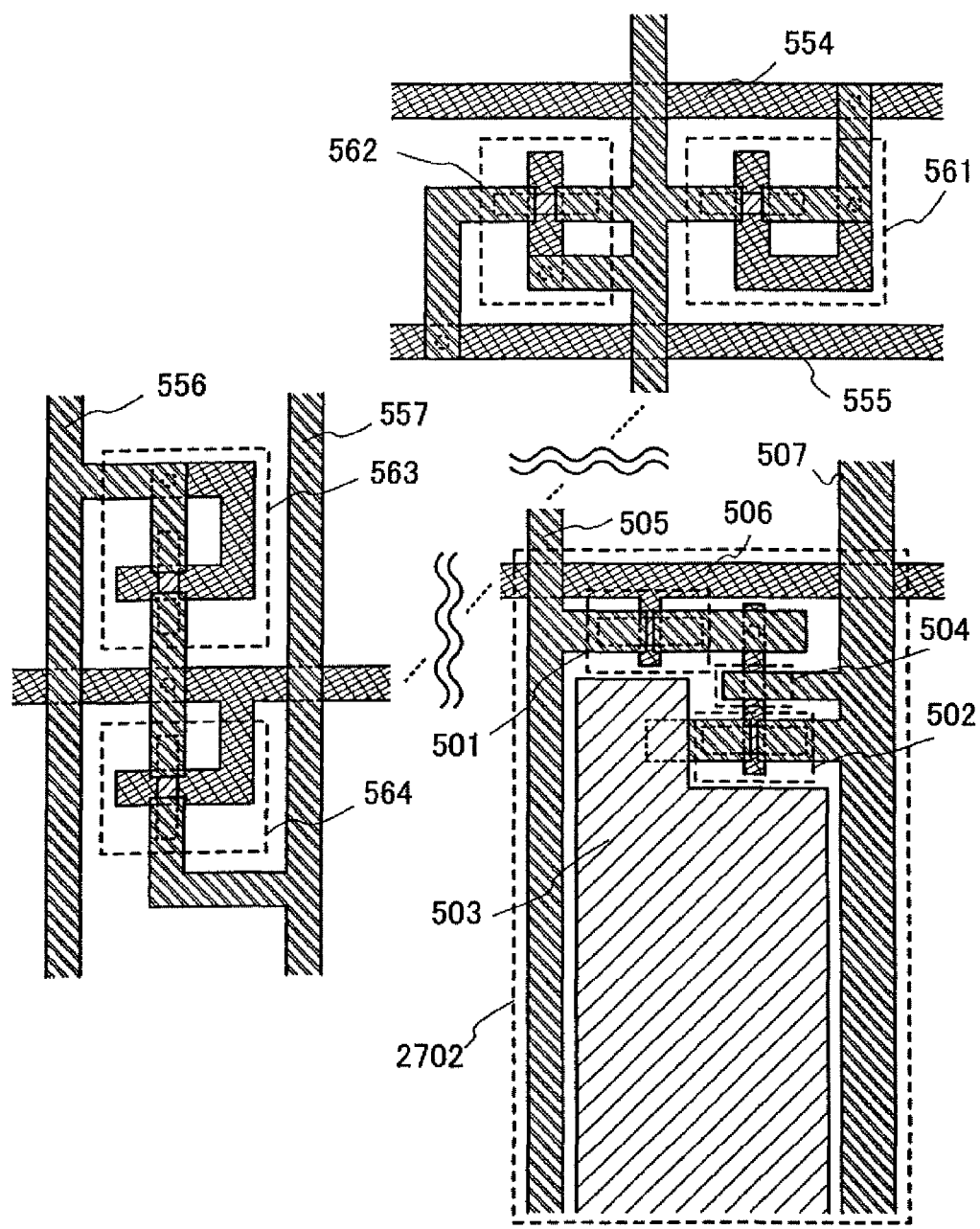
FIG. 24 is a top view explaining a display panel according to the invention.

One mode in which a protective diode is provided in both a scanning line input terminal portion and a signal line input terminal portion will be explained with reference to FIG. 24. TFTs 501, 502, a capacitor 504, and a light emitting element 503 are provided in a pixel 2702 in FIG. 24. The TFTs have the identical structure as the one shown in Embodiment Mode 2.

Figure 23:
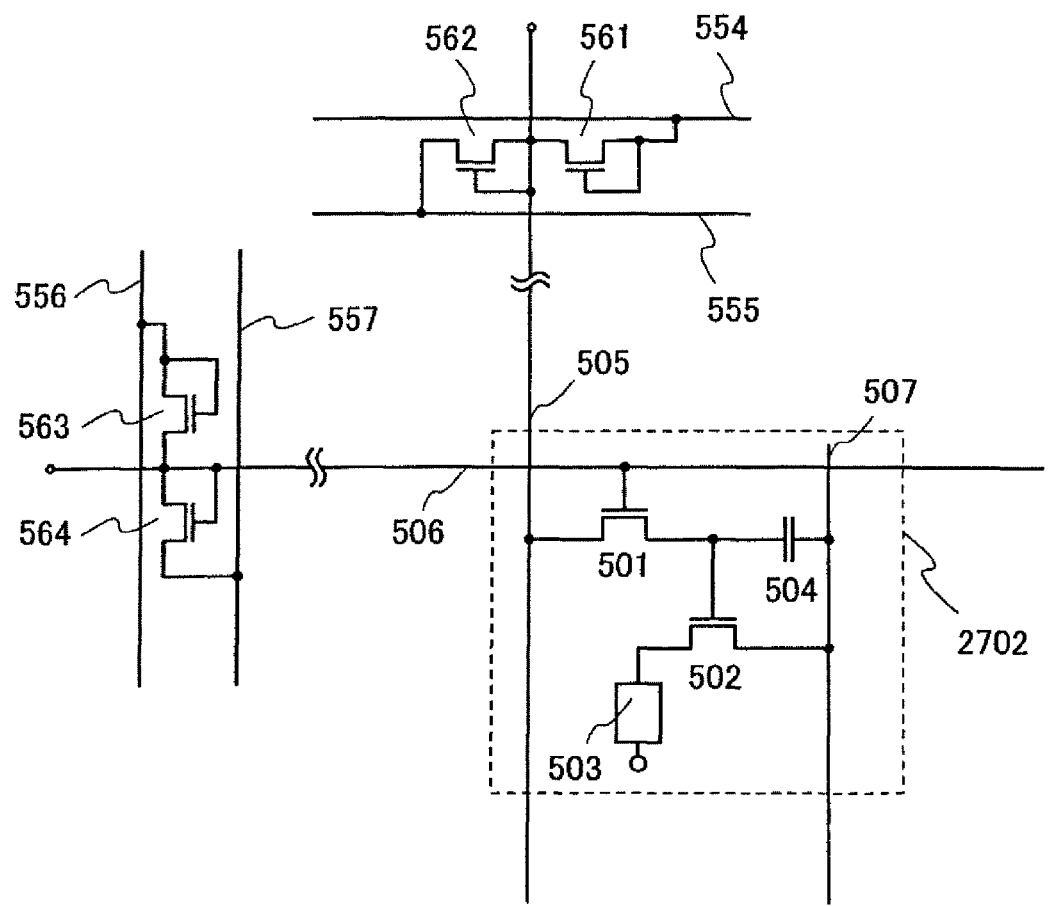
FIG. 23 is an equivalent circuit diagram of a display panel that is shown in FIG. 24.

Protective diodes 561 and 562 are provided for the signal line input terminal portion. These protective diodes are manufactured in the same step as that of the TFT 501 or 502. The protective diodes 561 and 562 are operated as diodes by connecting a gate to one of a drain and a source. FIG. 23 shows an equivalent circuit diagram of a top view shown in FIG. 24.

The protective diode 561 includes a gate electrode layer, a semiconductor layer, and a wiring layer. The protective diode 562 has the same structure. Common potential lines 554 and 555 connecting to the protective diodes are formed in the same layer as the gate electrode. Therefore, it is necessary to form a contact hole in a gate insulating layer such that the common potential lines are electrically connect to the wiring layer.

To form the contact hole, a mask layer may be formed on the gate insulating layer and then etched. Or, when the gate insulating layer is etched under atmospheric pressure discharge conditions, a local discharge processing is possible without forming a mask over the entire surface of a substrate.

A signal wiring layer is formed in the same layer as that of a source or drain wiring layer 505 in the TFT 501 and is connected to a source or drain side of the source or drain wiring layer.

A scanning signal line input terminal portion has a similar structure. A protective diode 563 includes a gate electrode layer, a semiconductor layer, and a wiring layer. A protective diode 564 comprises a same structure as the protective diode 563. Common potential lines 556 and 557, which are connected to the protective diodes, are formed in the same layer as the source or drain wiring layer. According to the present invention, the protective diodes provided in an input stage can be formed at the same time. Note that the position of inserting a protective diode is not limited to this embodiment mode and can be also provided between a driver circuit and a pixel.

Embodiment Mode 14

Figure 52:
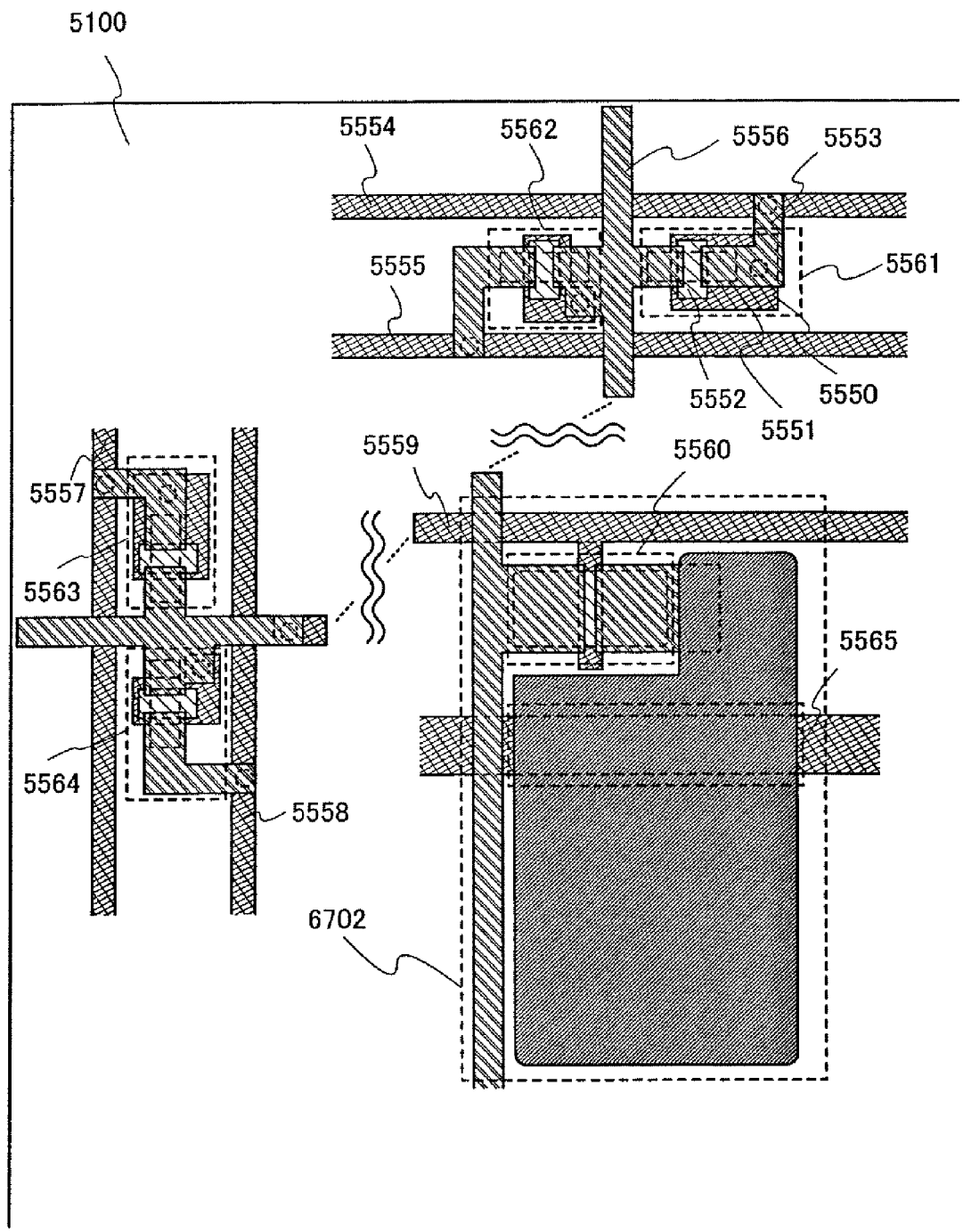
FIG. 52 is a top view explaining a display panel according to the invention.
Figure 53:
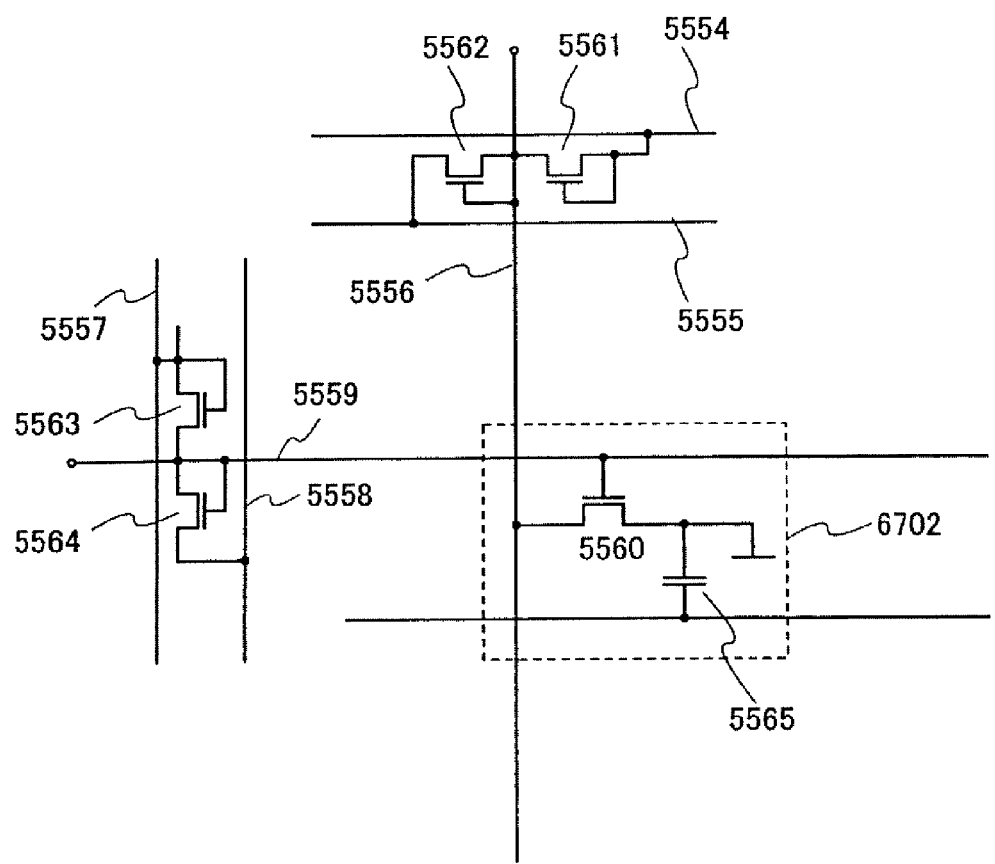
FIG. 53 is an equivalent circuit diagram of a display panel as shown in FIG. 52.

One mode in which a protective diode is provided in both a scanning line input terminal portion and a signal line input terminal portion will be explained with reference to FIG. 52 and FIG. 53. A TFT 5560 is provided in a pixel 6702 in FIG. 53. The TFT has the similar structure as the one shown in Embodiment Mode 6.

Protective diodes 5561 and 5562 are provided in the signal line input terminal portion. These protective diodes are manufactured in the same step as that of the TFT 5506. The protective diodes 5561 and 5562 are operated as diodes by connecting a gate to one of a drain and a source. FIG. 53 shows an equivalent circuit diagram of a top view as illustrated in FIG. 52.

The protective diode 5561 includes a gate electrode layer 5550, a semiconductor layer 5551, an insulating layer 5552 for channel protection, and a wiring layer 5553. The protective diode 5562 has the same structure. Common potential lines 5554 and 5555 connecting to the protective diodes are formed in the same layer as that of the gate electrode layer. It is necessary to form a contact hole in a gate insulating layer to electrically connect to the wiring layer 5553.

To form the contact hole, a mask layer may be formed on the gate insulating layer by the droplet discharging method, and then etched. Or, when the gate insulating layer is etched under atmospheric pressure discharge conditions, a local discharge processing is possible without forming a mask over the entire surface of a substrate.

The protective diode 5561 or 5561 is formed in the same layer as that of a source or drain wiring layer 5130 in the TFT 5560 and has a structure in which the signal wiring layer 5556 connected thereto is connected to a source or drain side of the source or drain wiring layer.

A scanning signal line input terminal portion has a similar structure. A protective diode 5563 includes a gate electrode layer, a semiconductor layer, and a wiring layer. A protective diode 5564 comprises a same structure as the protective diode 5563. Common potential lines 5556 and 5557, which are connected to the protective diodes, are formed in the same layer as the source or drain wiring layer. According to the present invention, the protective diodes provided in an input stage can be formed at the same time. Note that the position of inserting a protective diode is not limited to this embodiment mode and can be also provided between a driver circuit and a pixel.

Embodiment Mode 15

Figure 22:
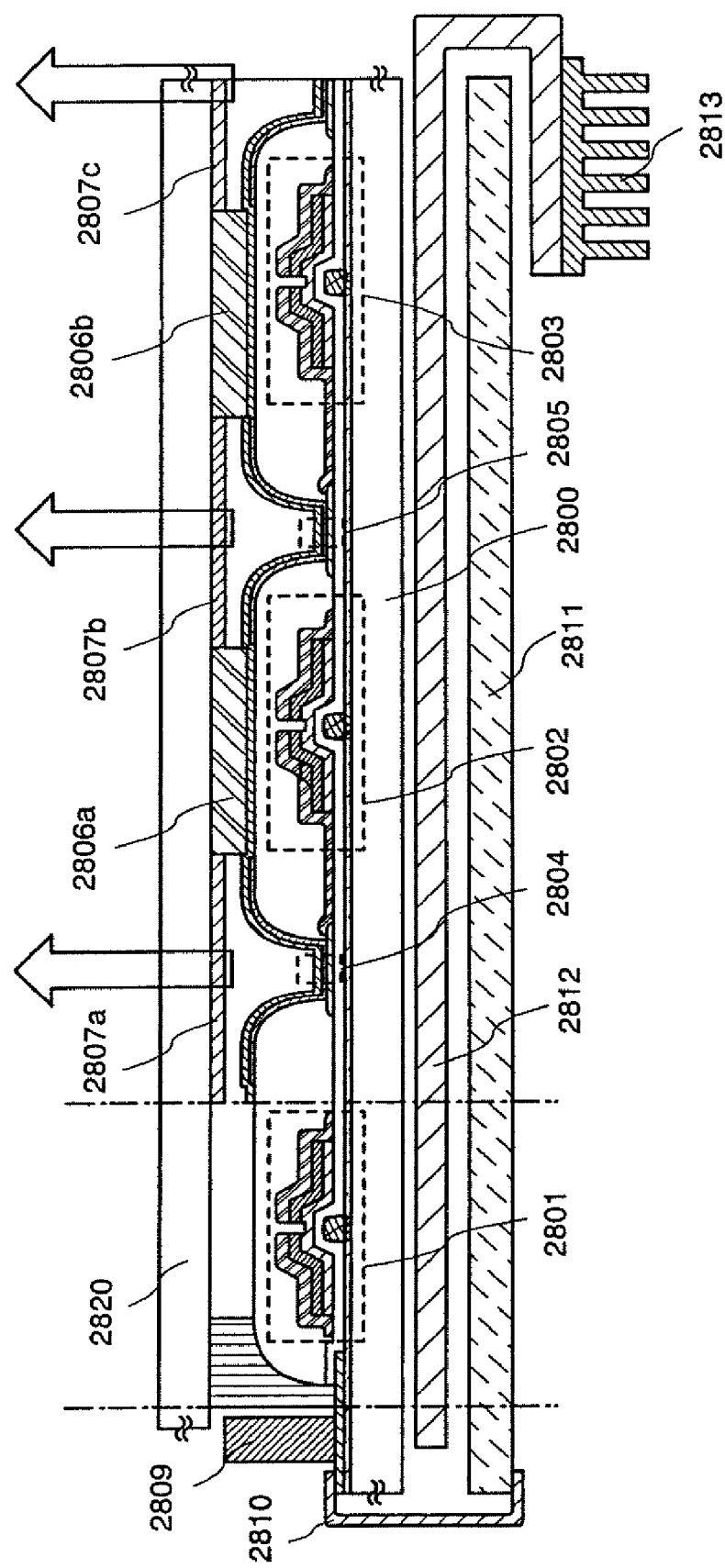
FIG. 22 is a cross sectional view explaining an example of a structure for an EL display module.

FIG. 22 shows an example of constituting an EL display module by using a TFT substrate 2800 manufactured by the droplet discharge method. In FIG. 22, a pixel portion including pixels is formed over the TFT substrate 2800.

In FIG. 22, a TFT which is same as the one formed in the pixel, or a protective circuit portion 2801 which is operated by connecting a gate of the TFT to either a source or a drain as well as a diode is provided between a driver circuit and the pixel portion, where is outside of the pixel portion. A driver IC formed of a monocrystal semiconductor, a stick driver IC formed of a polycrystalline semiconductor film over a glass substrate, a driver circuit formed of an SAS, or the like are applied to a driver circuit 2809.

The TFT substrate 2800 is fixed to a sealing substrate 2820 while sandwiching spacers 2806a and 2806b, which are formed by the droplet discharge method, therebetween. The spacers are preferably provided to keep the distance between two substrates constant, even when the substrates are thin and the pixel portion becomes larger in size.

A resin material having light-transmitting properties may be filled in the gap between the TFT substrate 2800 and the sealing substrate 2820, over light emitting elements 2804 and 2805 and then cured, or may be filled with anhydrous nitrogen or an inert gas.

FIG. 22 shows a case where the light emitting elements 2804 and 2805 have a top emission type structure, wherein light is emitted in a direction indicated by arrows shown in the drawing. Pixels can perform multi-color display by making each pixel have different luminescent colors of red, green and blue. Additionally, color purity of light emitted to the exterior can be enhanced by forming colored layers 2807a, 2807b and 2807c corresponding to each color over the sealing substrate 2820 side. Or, the pixels may be made white color light emitting elements, and the white color light emitting elements can be combined with the colored layers 2807a, 2807b and 2807c.

An external circuit 2809 is connected to a scanning line or a signal line connection terminal provided in an edge of the TFT substrate 2800 with a wiring substrate 2810. Alternatively, a heat pipe 2813 and a radiator plate 2812 may be provided to be in contact with or adjacent to the ITT substrate 2800 so as to enhance a heat release effect.

Although a top emission EL module is shown in FIG. 22, a bottom emission structure may be also employed by changing the structure of a light emitting element or the arrangement of an external circuit substrate. In the case of a top emission type structure, an insulating layer to be a partition wall may be colored to use as a black matrix. The partition wall can be formed by the droplet discharge method, and it can be formed by mixing carbon black or the like into a resin material such as polyimide, or by laminating thereof.

Alternatively, a resin film may be attached to the TFT substrate 2800 with a sealing material or an adhesive resin so as to seal the pixel portion formed over the TFT substrate 2800. A gas barrier film is preferably formed on the surface of the resin film to prevent vapor from transmitting therethrough. By using the resin film, a display device can be made further thinner and lighter.

Embodiment Mode 16

A television device (e.g., an EL television device and a liquid crystal television device) can be completed by using a display device formed according to the present invention. In a display panel, there are a case where only a pixel portion is formed over a substrate as shown in FIG. 17A and a scanning line driver circuit and a signal line driver circuit are mounted by the TAB technology as shown in FIG. 18B, a case where a scanning line driver circuit and a signal line driver circuit are mounted over a substrate with a pixel portion formed thereover by the COG technology as shown in FIG. 18A, a case where a TFT is formed of an SAS, a pixel portion and a scanning line driver circuit are integrally formed over a substrate, and a signal line derive circuit is separately mounted as a driver IC as shown in FIG. 17B, a case where a pixel portion, a signal line driver circuit, and a scanning line driver circuit are integrally formed over a substrate as shown in FIG. 17C, and the like. Any of the modes can be applied.

Another structure of an external circuit may include a video signal amplifier circuit which amplifies a video signal among signals received by a tuner, a video signal processing circuit which converts a signal to be outputted therefrom into a chrominance signal corresponding to each color of red, green, and blue, a control circuit which converts the video signal into an input specification of a driver IC, and the like on an input side of a video signal. The control circuit outputs a signal to both a scanning line side and a signal line side. In the case of digital driving, a signal dividing circuit may be provided on the signal line side, and an input digital signal may be divided into m parts and be supplied.

An audio signal among signals received by the tuner is transmitted to an audio signal amplifier circuit and is supplied to a speaker through an audio signal processing circuit to be outputted. A control circuit receives control information on a receiving station (receive frequency) or volume from an input portion and transmits the signal to the tuner and the audio signal processing circuit.

Figure 51:
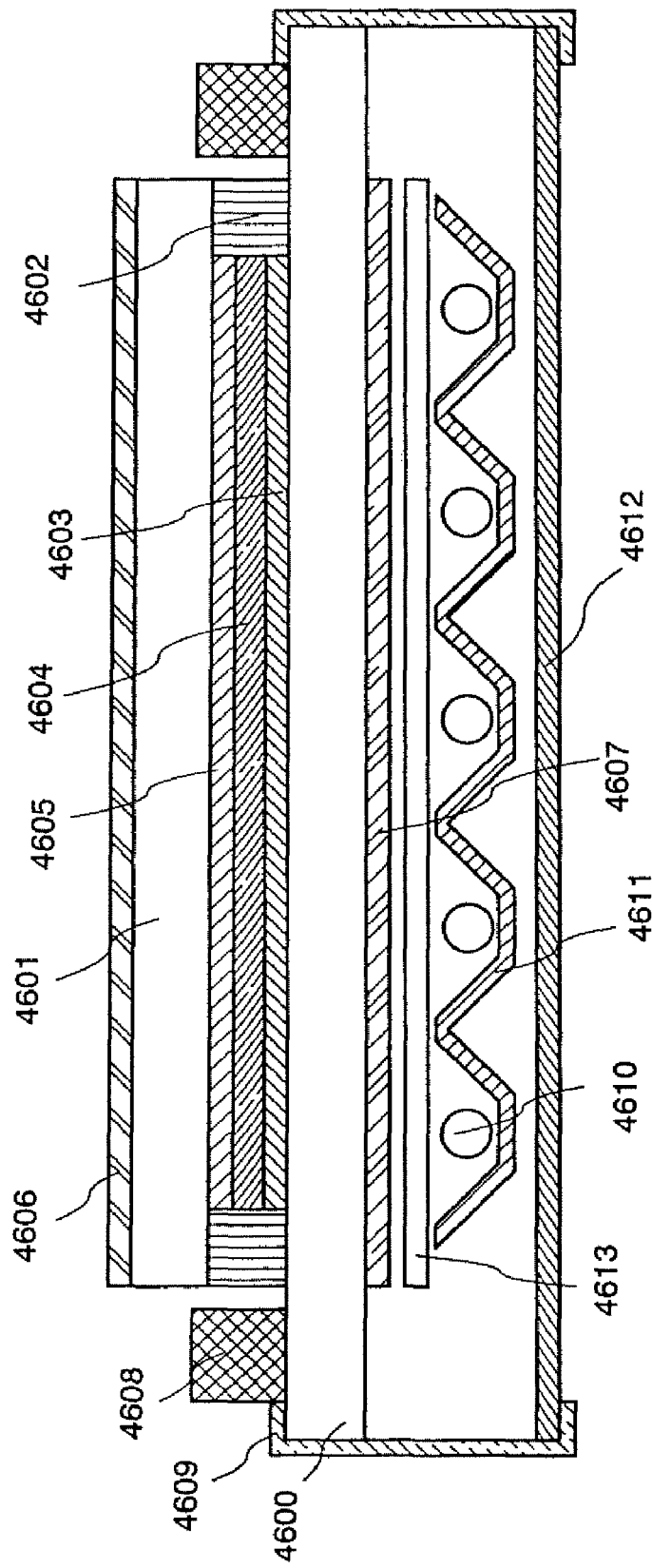
FIG. 51 is a cross sectional view explaining a structure of a display module according to the invention.

FIG. 51 shows an example of a liquid crystal display module, wherein a TFT substrate 4600 and a counter substrate 4601 are attached to each other with a sealing material 4602, and a pixel portion 4603 and a liquid crystal layer 4604 are provided therebetween to form a display region. A colored layer 4605 is required to display a color image. In the case of the RGB method, colored layers corresponding to red, green, and blue are provided in each pixel. Polarizing plates 4606, 4607, and a lens film 4613 are disposed outside of the TFT substrate 4600 and the counter substrate 4601. A light source is formed using a cold-cathode tube 4610 and a reflecting board 4611. A circuit substrate 4612 is connected to a peripheral circuit 4608 and the TFT substrate 4600 with a flexible wiring substrate 4609, wherein an exterior circuit such as a control circuit and a power source circuit is built therein.

Figure 20:
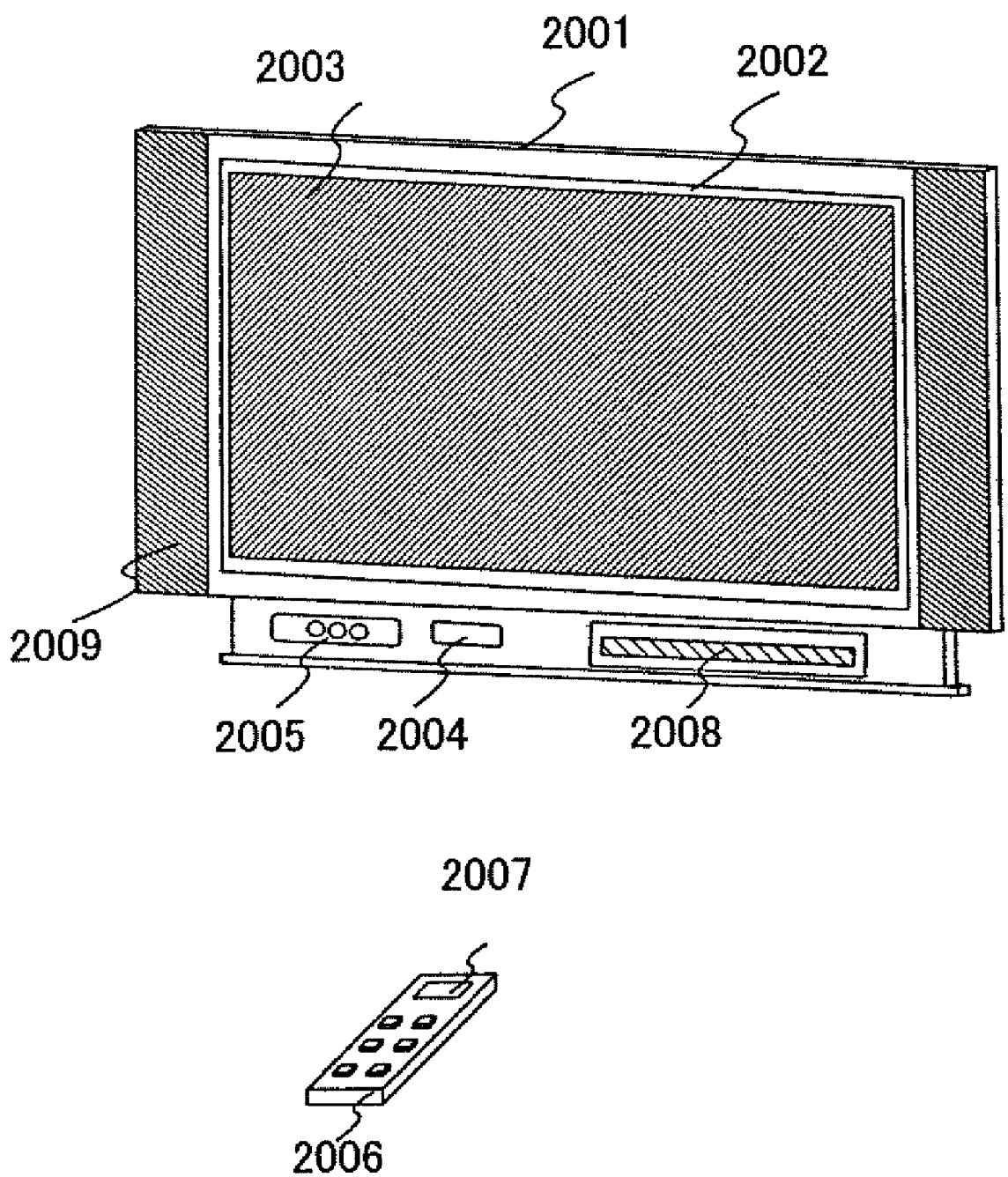
FIG. 20 are diagrams showing electronic appliances according to the invention.

A television device can be completed by incorporating a display module such as a light emitting display module and a liquid crystal display module into a casing 2001 as shown in FIG. 20. When an EL display module as shown in FIG. 22 is used, an EL television device can be achieved. When a liquid crystal display module as shown in FIG. 51 is used, a liquid crystal television can be obtained. A main display screen 2003 is formed by using the display module, and speaker portions 2009, an operation switch, and the like may be provided as attachments. Thus, a television device can be completed according to the present invention.

Figure 34:
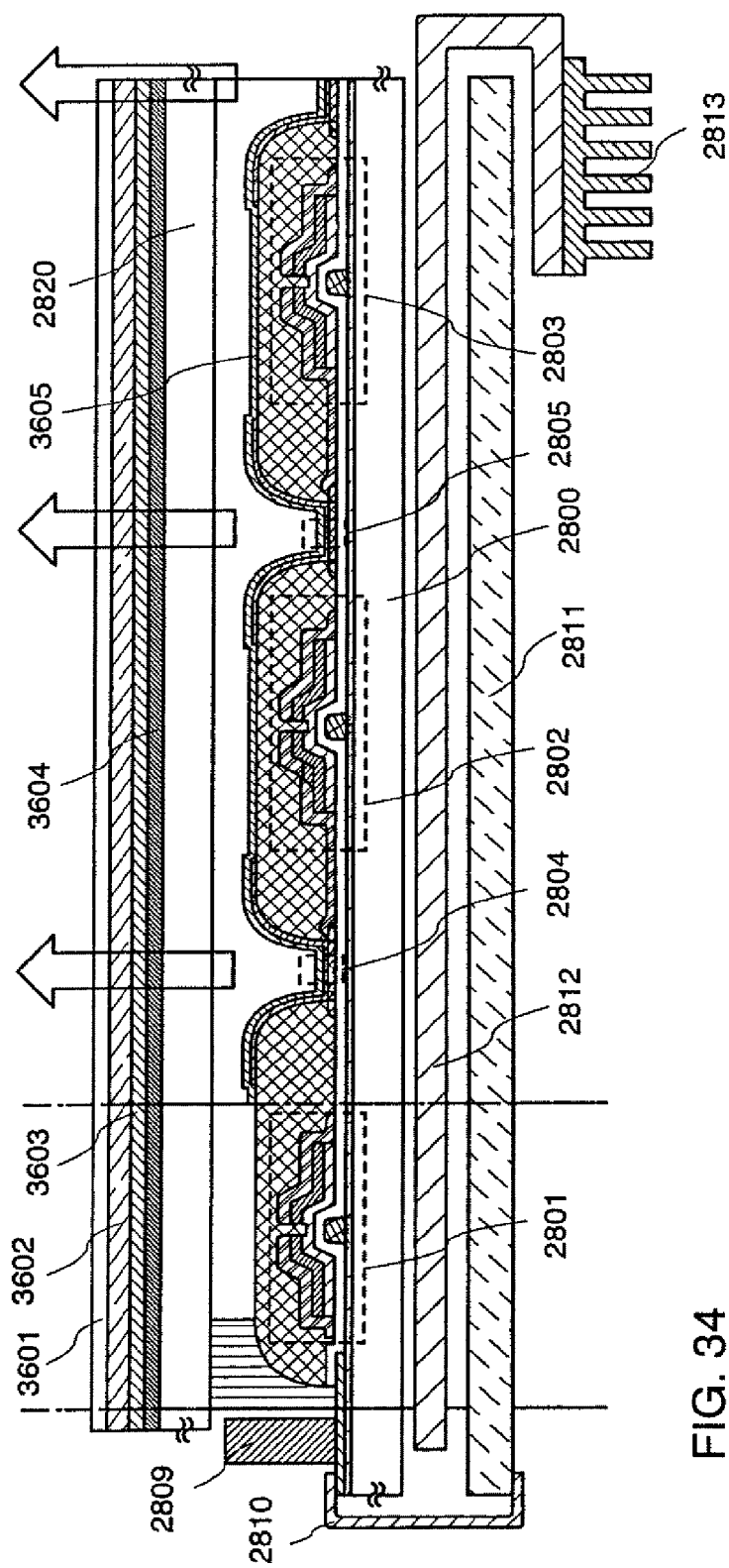
FIG. 34 is a cross sectional view explaining an example of a structure for a display device according to the invention.

In addition, in a television device, reflected light of light entering from outside may be blocked by using a retardation plate and a polarizing plate. FIG. 34 shows a top emission structure in which an insulating layer 3605, which will be a partition wall, is colored such that it is used as a black matrix. The partition wall is formed by the droplet discharging method. The partition wall may be formed by a composition in which a resin material such as polyimide is mixed with carbon black etc., or a lamination layer thereof. Different kinds of materials may be discharged in a same region at several times formed by the droplet discharging method to form the partition wall. In the embodiment mode, a black resin pigment is employed. Retardation plates 3603 and 3604 use $\lambda/4$ and $\lambda/2$ plates and are designed such that light can be controlled. As a structure, a TFT element substrate 2800, a light emitting element 2804, a sealing substrate (sealing member) 2820, the retardation plates 3603, 3604 ($\lambda/4$ and $\lambda/2$ plates), and a polarizing plate 3602 are sequentially laminated. Light generated in a light emitting element in the structure is emitted to an exterior portion through the polarizing plate. The retardation plates and polarizing plate may be disposed in a side through which light is emitted. In the case of a dual-emission type display device, which emits light both upward and downward, retardation plates and polarizing plates can be provided over both surfaces of the display device. An antireflection film 3601 may be provided on an outer side of the polarizing plate. According to the structure, more high-definition images can be displayed.

A display panel 2002 utilizing a liquid crystal element or an EL element is incorporated in the casing 2001. Not only an ordinary TV broadcasting reception that is received by a receiver 2005, but also one-way information and telecommunication (from a transmitter to a receiver) or two-way information and telecommunication (between a transmitter and a receiver or between receivers) can be achieved by connecting to a communication network with or without a wire through a modem 2004. The television device can be operated by a switch incorporated in the casing or a separately-provided remote control unit 2006. The remote control unit may include a display portion 2007 showing information to be output.

Further, the television device may include a sub screen 2008 made from a second display panel to display channels, volume, and the like, in addition to the main screen 2003. In this structure, the main screen 2003 may be formed by using an EL display panel having wide view angle and the sub screen may be formed by using another EL display panel, which allows the screen to switch on/off. Or, the main screen 2003 and the sub screen 2008 may be formed by liquid crystal display panels which are capable of displaying at lower power consumption. Or, the main screen 2003 may be formed by using a liquid crystal display panel capable of displaying at lower power consumption and the sub screen may be formed by using an EL display panel having wide view angle, which allows the screen to switch on/off. According to the present invention, a highly reliable display device can be formed even when a large size substrate is used and a large number of TFTs or electronic parts are used.

Of course, the invention is not limited to the television device and can be applied to various use applications particularly as a large-area display medium such as an information display board in a train station, an airport, and the like, or an advertisement display board on the street, as well as a monitor of a personal computer.

Embodiment Mode 17

According to the invention, various kinds of display devices can be manufactured. Namely, various kinds of electronic appliances can be manufactured by incorporating such display devices of the invention to display portions of the electronic appliances.

Examples of the electronic appliances include: a camera such as a video camera and a digital camera; a projector; a head-mounted display (a goggle type display); a car navigation system; a car audio; a personal computer; a game machine; a portable information terminal (such as a mobile computer, a cellular telephone, a portable game machine, and an electronic book); an image reproduction device provided with a recording medium (concretely, a device which can reproduce the recording medium such as a digital versatile disc (DVD) and display images thereof); and the like. Specific examples thereof are shown in FIGS. 21A and 21D.

Figure 21A:
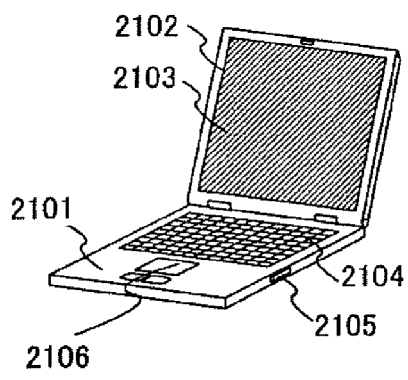
FIGS. 21A to 21D are diagrams showing electronic appliances according to the invention.

FIG. 21A shows a personal laptop computer, which includes a main body 2101, a casing 2102, a display portion 2103, a keyboard 2104, an external connection port 2105, a pointing mouse 2106, and the like. The display portion 2103 can be manufactured according to the invention. According to the invention, a highly reliable, high-quality image can be displayed on the display portion even if the personal computer is miniaturized and a wiring or the like becomes precise.

Figure 21B:
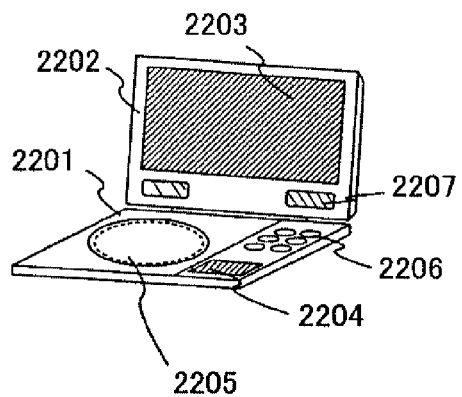

FIG. 21B shows an image reproducing device including a recording medium (specifically, a DVD reproducing device), which includes a main body 2201, a casing 2202, a display portion A 2203, a display portion B 2204, a recording medium (a DVD and the like) reading portion 2205, operation keys 2206, speaker portions 2207, and the like. The display portion A 2203 mainly displays image information, while the display portion B 2204 mainly displays character information. The display portion A 2203 and the display portion B 2204 can be manufactured according to the invention. According to the invention, a highly reliable, high-quality image can be displayed on the display portions even if the image reproducing device is miniaturized and a wiring or the like becomes precise.

Figure 21C:
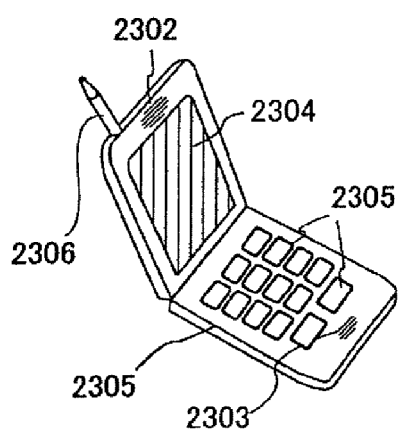
Figure 21D:
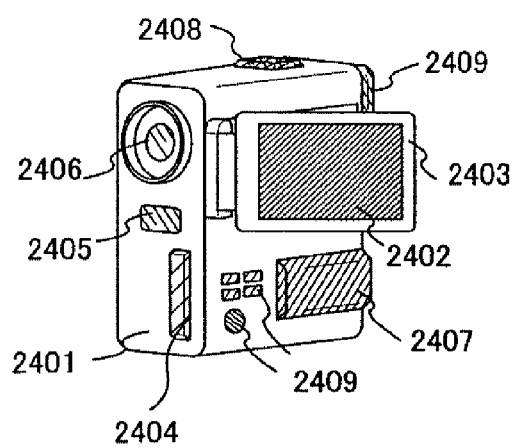

FIG. 21C shows a cellular phone, which includes a main body 2301, an audio output portion 2302, an audio input portion 2303, a display portion 2304, operation switches 2305, an antenna 2306, and the like. According to the invention, a highly reliable, high-quality image can be displayed on the display portion even if a cellular phone is miniaturized and a wiring or the like becomes precise.

FIG. 21D shows a video camera, which includes a main body 2401, a display portion 2402, a casing 2403, an external connection port 2404, a remote control receiver 2405, an image pickup unit 2406, a battery 2407, an audio input portion 2408, operation keys 2409, and the like. The invention can be applied to the display portion 2402. According to the invention, a highly reliable, high-quality image can be displayed on the display portion 2402 even if a video camera is miniaturized and a wiring or the like becomes precise.

What is claimed is:

1. A display device comprising:
    a substrate;
    a base film formed over and being in contact with the substrate, the base film having a lyophobic region and a lyophilic region; and
    a thin film transistor including a semiconductor layer and a gate electrode layer which comprises a conductive material,
    wherein the gate electrode layer is provided over and in contact with the lyophilic region,
    wherein the semiconductor layer is over the gate electrode layer,
    wherein the lyophobic region is more lyophobic with respect to a droplet containing a solvent and the conductive material than the lyophilic region, and
    wherein the lyophilic region is more lyophilic with respect to the droplet than the lyophobic region.

2. The display device according to claim 1, wherein the solvent is an ester, an alcohol, or a ketone.

3. The display device according to claim 1, wherein the conductive material is selected from a metal, a metal sulfide, a metal oxide, silver halide, an organic tin, an organic zinc, and a titanium nitride.

4. The display device according to claim 1, wherein the lyophilic region comprises an oxide or nitride of a metal.

5. The display device according to claim 1, wherein the lyophilic region comprises titanium oxide.

6. The display device according to claim 1, wherein the lyophobic region comprises a material having a fluorocarbon chain.

7. A display device comprising:
    a substrate;
    a base film formed over and being in contact with the substrate, the base film having a lyophobic region and a lyophilic region; and
    a thin film transistor including a gate electrode layer, a semiconductor layer, a source electrode layer and a drain electrode layer,
    wherein at least one of the gate electrode layer, the source electrode layer, and the drain electrode layer is formed over and in contact with the lyophilic region and comprises a conductive material,
    wherein the semiconductor layer is over the source electrode layer and the drain electrode layer,
    wherein the lyophobic region is more lyophobic with respect to a droplet containing a solvent and the conductive material than the lyophilic region, and
    wherein the lyophilic region is more lyophilic with respect to the droplet than the lyophobic region.

8. The display device according to claim 7, wherein the solvent is an ester, an alcohol, or a ketone.

9. The display device according to claim 7, wherein the conductive material is selected from a metal, a metal sulfide, a metal oxide, silver halide, an organic tin, an organic zinc, and a titanium nitride.

10. The display device according to claim 7, wherein the lyophilic region comprises an oxide or nitride of a metal.

11. The display device according to claim 7, wherein the lyophilic region comprises titanium oxide.

12. The display device according to claim 7, wherein the lyophobic region comprises a material having a fluorocarbon chain.

13. A television device comprising a display screen which comprises a display device, the display device comprising:
    a substrate;
    a base film formed over and being in contact with the substrate, the base film having a lyophobic region and a lyophilic region; and
    a thin film transistor including a semiconductor layer and a gate electrode layer which comprises a conductive material,
    wherein the gate electrode layer is provided over and in contact with the lyophilic region,
    wherein the semiconductor layer is over the gate electrode layer, wherein the lyophobic region is more lyophobic with respect to a droplet containing a solvent and the conductive material than the lyophilic region, and wherein the lyophilic region is more lyophilic with respect to the droplet than the lyophobic region.

14. The television device according to claim 13, wherein the solvent is an ester, an alcohol, or a ketone.

15. The television device according to claim 13, wherein the conductive material is selected from a metal, a metal sulfide, a metal oxide, silver halide, an organic tin, an organic zinc, and a titanium nitride.

16. The television device according to claim 13, wherein the lyophilic region comprises an oxide or nitride of a metal.

17. The television device according to claim 13, wherein the lyophilic region comprises titanium oxide.

18. The television device according to claim 13, wherein the lyophobic region comprises a material having a fluorocarbon chain.

19. A television device comprising a display screen which comprises a display device, the display device comprising:
a substrate;
a base film formed over and in contact with the substrate having a lyophobic region and a lyophilic region; and
a thin film transistor including a gate electrode layer, a semiconductor layer, a source electrode layer and a drain electrode layer,
wherein at least one of the gate electrode layer, the source electrode layer, and the drain electrode layer is formed over and in contact with the lyophilic region and comprises a conductive material,
wherein the semiconductor layer is over the source electrode layer and the drain electrode layer,
wherein the lyophobic region is more lyophobic with respect to a droplet containing a solvent and the conductive material than the lyophilic region, and
wherein the lyophilic region is more lyophilic with respect to the droplet than the lyophobic region.

20. The television device according to claim 19, wherein the solvent is an ester, an alcohol, or a ketone.

21. The television device according to claim 19, wherein the conductive material is selected from a metal, a metal sulfide, a metal oxide, silver halide, an organic tin, an organic zinc, and a titanium nitride.

22. The television device according to claim 19, wherein the lyophilic region comprises an oxide or nitride of a metal.

23. The television device according to claim 19, wherein the lyophilic region comprises titanium oxide.

24. The television device according to claim 19, wherein the lyophobic region comprises a material having a fluorocarbon chain.

* * * * *

UNITED STATES PATENT AND TRADEMARK OFFICE
CERTIFICATE OF CORRECTION

PATENT NO. : 7,939,888 B2
APPLICATION NO. : 11/857729
DATED : May 10, 2011
INVENTOR(S) : Shunpei Yamazaki et al.

It is certified that error appears in the above-identified patent and that said Letters Patent is hereby corrected as shown below:

column 9, line 53, "balking" should read "baking"

column 12, line 64, "barn" should read "beam"

column 13, line 10, "$R_a$" should read "$R_n$"

column 16, line 17, "bead" should read "head"

column 19, line 44, "films" should read "film"

column 26, line 6, "5A" should read "8A"

column 30, line 23, "scaling" should read "sealing"

column 33, line 67, "POP" should read "POPT"

column 34, line 28, "reds" should read "red,"

column 36, line 57, "3613" should read "36B"

column 43, line 64, "418" should read "41B"

column 54, line 52, "ITT" should read "TFT"

Signed and Sealed this
Eighteenth Day of October, 2011

David J. Kappos
*Director of the United States Patent and Trademark Office*